(12) United States Patent
Dong et al.

(10) Patent No.: US 11,011,282 B1
(45) Date of Patent: May 18, 2021

(54) WEARABLE MICROWAVE META-SKIN WITH TUNABLE FREQUENCY SELECTIVE AND CLOAKING EFFECTS

(71) Applicant: Iowa State University Research Foundation, Inc., Ames, IA (US)

(72) Inventors: Liang Dong, Ames, IA (US); Peng Liu, Ames, IA (US); Siming Yang, Ames, IA (US); Jiming Song, Ames, IA (US)

(73) Assignee: Iowa State University Research Foundation, Inc., Ames, IA (US)

( * ) Notice: Subject to any disclaimer, the term of this patent is extended or adjusted under 35 U.S.C. 154(b) by 358 days.

(21) Appl. No.: 15/639,078

(22) Filed: Jun. 30, 2017

Related U.S. Application Data

(60) Provisional application No. 62/356,969, filed on Jun. 30, 2016.

(51) Int. Cl.
| | |
|---|---|
| *H01P 7/00* | (2006.01) |
| *H01B 1/16* | (2006.01) |
| *H01P 7/08* | (2006.01) |
| *H05K 9/00* | (2006.01) |

(52) U.S. Cl.
CPC .............. *H01B 1/16* (2013.01); *H01P 7/08* (2013.01); *H05K 9/0081* (2013.01)

(58) Field of Classification Search
CPC ............ H01P 7/08; H05K 9/0081; H01B 1/16
See application file for complete search history.

(56) References Cited

U.S. PATENT DOCUMENTS

| | | | | |
|---|---|---|---|---|
| 3,529,035 A | * | 9/1970 | Lamoreaux | C08G 77/06 |
| | | | | 525/477 |
| 2012/0154793 A1 | * | 6/2012 | Pryce | G01N 21/3581 |
| | | | | 356/51 |
| 2013/0160936 A1 | * | 6/2013 | Cheah | B32B 27/36 |
| | | | | 156/230 |

OTHER PUBLICATIONS

"Development of PDMS-Based Micromachining Process for Microfluidic Reconfigurable Antennas", Jan. 2015, http://etd.lib.metu.edu.tr/upload/12618373/index.pdf (Esmaeilzad). (Year: 2015).*
"Microfluidics for reconfigurable electromagnetic metamaterials", Applied Physics Letters, vol. 85, 214102, Kasirga et al., Nov. 25, 2009, https://aip.scitation.org/doi/full/10.1063/1.3268448 (Kasirga) (Year: 2009).*
"Broadband planar left-handed metamaterials using split-ring resonator pairs", Photonics and Nanostructures Fundamentals and Applications, vol. 7, Wang et al., Jan. 9, 2009, pp. 108-113, https://www.sciencedirect.com/science/article/pii/S1569441009000029 (Wang) (Year: 2009).*
"Broadband multi-layer terahertz metamaterials fabrication and characterization on flexible substrates", Optics Express, vol. 19, No. 8, Apr. 11, 2011, 6990-98, Han et al. (Han) (Year: 2011).*

(Continued)

*Primary Examiner* — Daniel J. Schleis
*Assistant Examiner* — Kevin C T Li
(74) *Attorney, Agent, or Firm* — McKee, Voorhees & Sease, PLC

(57) ABSTRACT

Systems, methods, and apparatus for meta-materials which are stretchable and tunable using an array of liquid conductor meta-atoms encased in one or more layers of elastomer. Fabrication techniques allow effective manufacture of the metamaterial in a number of form factors for a number of applications, including but not limited to fabrics or wraps around three-dimensional shapes.

34 Claims, 32 Drawing Sheets
(30 of 32 Drawing Sheet(s) Filed in Color)

(56) References Cited

OTHER PUBLICATIONS

"Mechanically tolerant fluidic split ring resonators", Robiatun A Awang et al., Smart Mater. Struct., vol. 25, Jun. 10, 2016, pp. 1-8, https://iopscience.iop.org/article/10.1088/0964-1726/25/7/075023/pdf (Awang) (Year: 2016).*

"Stretch-Tuning Metamaterials for Using Liquid Metal and Highly Stretchable Polymer", Liu et al., 18th International Conference on Miniaturized Systems for Chemistry and Life Sciences, Oct. 26-30, 2014 (Liu) (Year: 2014).*

Liu, et al., "Tunable meta-atom using liquid metal embedded in stretchable polymer", Journal of Applied Physics, 118, 13 pages (2015).

Yang, et al., "From Flexible and Stretchable Meta-Atom to Metamaterial: A Wearable Microwave Meta-Skin with Tunable Frequency Selective and Cloaking Effects", Scientific Reports, 8 pages, Feb. 23, 2016.

Liu, Peng, "Micro-electro-opto-fluidic systems for biomedical drug screening and electromagnetic filtering and cloaking applications", Appendix D, 34 pages (2016).

Kasirga, et al., "Microfluidics for reconfigurable electromagnetic metamaterials", Applied Physics Letters 95, 4 pages (2009).

Schurig, et al, "Metamaterial Electromagnetic Cloak at Microwave Frequencies", Science, vol. 314, pp. 977-980 (2006).

Liu, Peng, "Micro-electro-opto-fluidic systems for biomedical drug screening and electromagnetic filtering and cloaking applications", Dissertation, 47 pages (2016).

Grunewald, Scott J., "Israel's XJet is Developing Game Changing Inkjet Liquid Metal 3D Printing Technology", https://3dprint.com/105465/xjet-inkjet-liquid-metal-3dp/, 12 pages (2015).

Ladd, et al., "3D Printing of Free Standing Liquid Metal Microstructures", Advanced Materials, 25, pp. 5081-5085 (2013).

Smith, et al., "Composite Medium with Simultaneously Negative Permeability and Permittivity", The American Physical Society, vol. 84, No. 18, pp. 4184-4187 (2000).

Shelby, et al., "Microwave transmission through a two-dimensional, isotropic, left-handed metamaterial", Applied Physics Letters 78, 489 (2001).

Bilotti, et al., "Design of Spiral and Multiple Split-Ring Resonators for the Realization of Miniaturized Metamaterial Samples", IEEE Transactions on Antennas, vol. 55, Issue 8 (2007).

* cited by examiner

METAFABRIC
FULL BODY SUIT

WEARABLE MICROWAVE META-SKIN WITH TUNABLE FREQUENCY SELECTIVE AND CLOAKING EFFECTS

CROSS-REFERENCE TO RELATED APPLICATIONS

This application claims the benefit of Provisional Application U.S. Ser. No. 62/356,969 filed on Jun. 30, 2016, which is herein incorporated by reference in its entirety.

GOVERNMENT GRANT CLAUSE

This invention was made with Government support under Grant Number ECCS-0954765 awarded by the National Science Foundation. The Government has certain rights to this invention.

I. BACKGROUND OF THE INVENTION

A. Field of the Invention

The present invention relates to apparatus and methods for meta-materials and, in particular, to apparatus and methods related to making and using meta-materials that can be applied to different three-dimensional form factors and/or tuned relative to different resonant frequencies.

B. Problems in the Art

Examples of issues with the current state of the art are as follows. The present invention seeks to solve issues with or improve upon the state of the art. The effect of meta-materials on electro-magnetic wave can be dependent on both physical and electromagnetic characteristics of the meta-atoms and the materials around them. Some effects are limited to narrow bandwidths. Attempts have been made to make meta-atoms tunable to different frequencies. However, the inventors have identified room for improvement in this technical area.

Many meta-materials include rigid substrates. It can be beneficial to allow form-fitting of meta-materials to a wide variety of form factors. One example is wearable meta-skins. Attempts have been made in the art. The inventors have identified room from improvement here.

It is difficult to produce tunability and reversibility. With reversibility it is difficult to have repeatability and long useful life of the material.

Many meta-materials include metal resonators. It is difficult to change the shape of metal to tune resonant frequency of metal resonators.

Specific examples of attempts at tunable meta-material using elastic materials can be found at published U.S. Patent Application 2012/0154793 to Pryce et al. (incorporated by reference herein) and published U.S. Patent Application 2013/0160936 to Cheah et al (incorporated by reference herein). Both, however, print or apply a metamaterial pattern on the surface of an elastomeric layer, either single layer or multiple layers. Thus, stretching and bending of the elastomer layer(s) risks damage to the metamaterial pattern.

Kasirga et al., entitled "Microfluidics for Reconfigurable Electromagnetic Metamaterials", Applied Physics Letters 95, 214102 (2009) (incorporated by reference herein) fabricates voids by microfluidic manufacturing methods in the shape of split ring resonators (SRRs) in PDMS elastomeric material. They discuss injected and pumping mercury through the channels to allow switching between states based on presence or absence of the liquid metal or reconfiguration or tenability by injecting liquids of different permittivity and permeability. This does not address the practical issues the inventors have identified.

II. SUMMARY OF THE INVENTION

This invention discloses methods of forming flexible and stretchable microwave meta-skins which can have, for example, frequency selective and cloaking effects.

In one aspect of the invention, a metamaterial comprises an elastomer in which is encased a pre-determined pattern of meta atoms, wherein the meta atoms include voids of pre-determined shapes in the elastomer filled with a liquid conductor. The shape of the voids and the liquid conductor have properties which affect incident electromagnetic energy. The shapes can be designed for certain effects. One example is scattering of electromagnetic wave. These effects can be tuned or varied by one or more of mechanically stretching the elastomer, varying the shape of the voids, and varying thickness of elastomer layers in multilayer configurations.

Another aspect of the invention comprises methods for manufacturing or fabricating the metamaterial described above. In one example, the positive shape of the voids is created at micro or smaller scale by MEMs fabrication techniques in essentially a Si substrate mold. An elastomer layer including the negatives of the Si voids is created by molding the elastomer layer from the Si mold. The top of the elastomer layer is covered by another elastomer layer to create encapsulated voids. Liquid conductor is injected into the voids. The combination is sealed. Additional such combinations can be added in laminated fashion to the original combination if desired.

In another aspect of the invention, a metamaterial comprises one or more layers of elastomer with sealed, encased liquid conductor meta atoms. The designer engineers the combination by selecting at least one or more of the following: (a) Type and shape of meta atom; (b) type of encasing elastomer material; (c) thickness of each elastomer layer, (d) type and characteristics of liquid conductor(s) and in which layers or meta atoms; and (e) amount of stretching of the elastomer. Variations of one or more of the foregoing can materially affect physical and electromagnetic characteristics and responses of the metamaterial according to need or desire.

In one aspect, the meta-skin includes an array of liquid metal SRR meta-atoms encased inside an elastomer. By stretching multiple layers of the meta-skins along their surfaces in a planar direction and/or by changing the spacing between the meta-skin layers in a vertical direction, the meta-skins can perform as a high performance tunable frequency selective surface with a broad tuning range. Furthermore, the meta-skin is able to wrap an interaction object with almost any arbitrary shape. We demonstrate that by wrapping it on a dielectric cylindrical rod, a significant scattering suppression or "cloaking" effect is observed. The scattered field from the dielectric rod at different angles is suppressed in a designed frequency region. Other shapes are possible. Potential applications include, but are not limited to, microwave stealth technology in general and military stealth applications specifically. There are potential domestic applications, such as protecting personal electronic devices and body implants from microwaves exposure.

III. BRIEF DESCRIPTION OF THE DRAWINGS

The patent or application file contains at least one drawing executed in color. Copies of this patent or patent application publication with color drawing(s) will be provided by the Office upon request and payment of the necessary fee.

In addition to this written description, illustrations in the form of figures and drawings are included which will be referred to from time to time in this description, and are summarized below:

FIGS. 1(a)-(c) are diagrammatic illustrations of simulations of resonance frequency change caused by stretching a meta-atom made according to one embodiment of the invention, here a split ring resonator (SRR).

FIGS. 2(a)-(g) are diagrammatic views of a sequence of steps to manufacture and assemble meta-atoms according to another aspect and embodiment of the invention.

FIGS. 3(a)-(f) are diagrammatic views of different SRR configurations in a test relating to ability to change resonant frequency via stretching according to aspects of the invention.

FIGS. 4(a) and (b) are a graph and magnified images of an SRR meta-atom respectively in a stretching experiment illustrating aspects of the invention.

FIGS. 5(a) and (b) are similar to FIGS. 4(a) and (b) with different experiment parameters.

FIGS. 6(a) and (b) are similar to FIGS. 4(a) and (b) and 5(a) and (b) with different experiment parameters.

FIG. 7 is a graph related to the experiments of FIGS. 4-6.

FIGS. 8(a)-(d) are diagrammatic, schematic, and graphical illustrations related to testing of a tunable SRR meta-atom according to FIGS. 1-6.

FIGS. 9A and B are diagrammatic illustrations of two applications for metamaterial according to exemplary embodiments of the invention.

FIG. 10 is a diagrammatic depiction of examples of variables available to the designer of metamaterial according to aspects of the invention.

FIGS. 11(a)-(d) are diagrammatic and photographic views illustrating a meta-material in the form of a stretchable meta-skin according to an exemplary embodiment of the invention.

Figure 12:
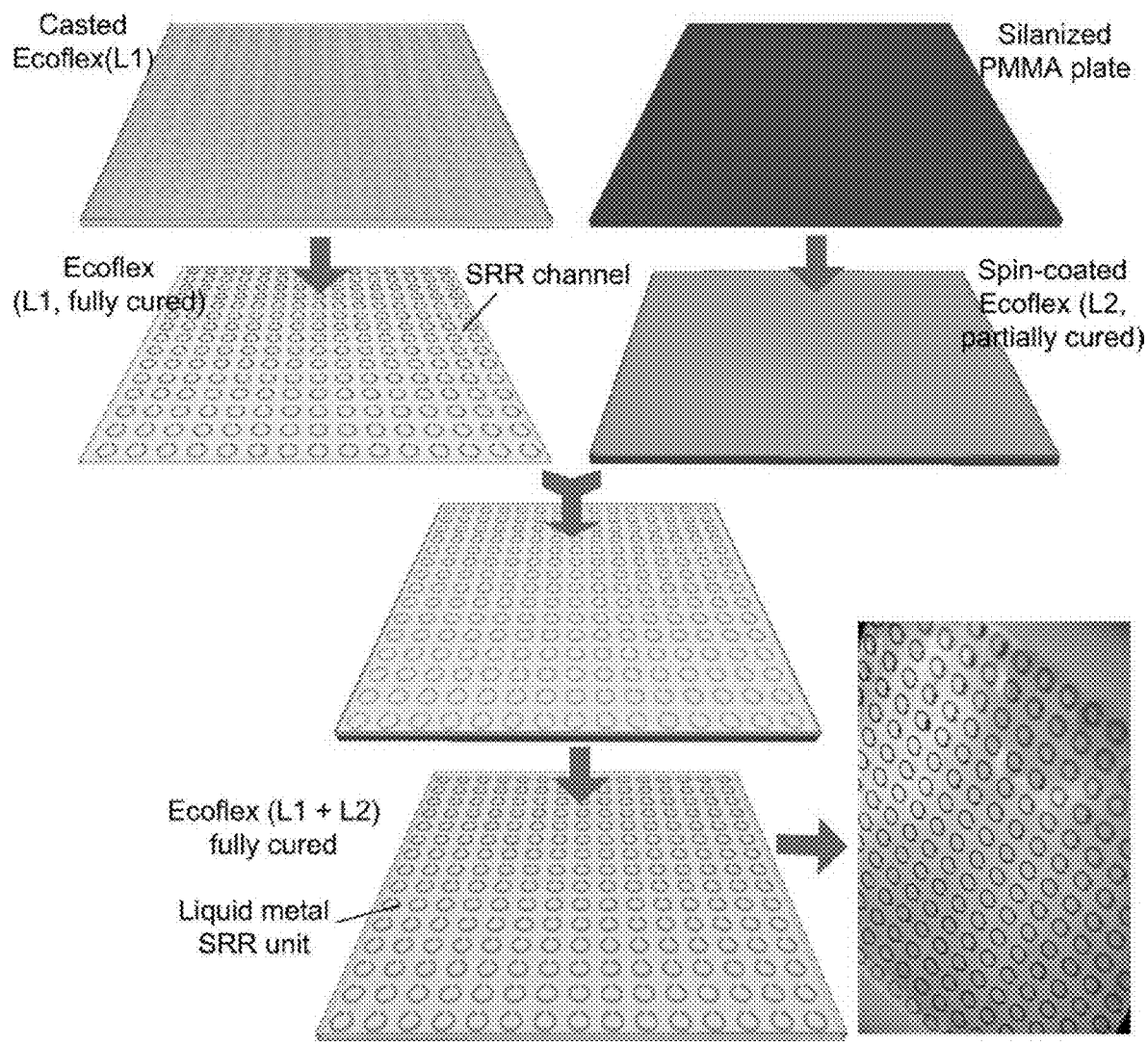
FIG. 12 is a diagrammatic illustration of a process of creating a meta-skin according to an exemplary embodiment of the invention.
Figure 14A:
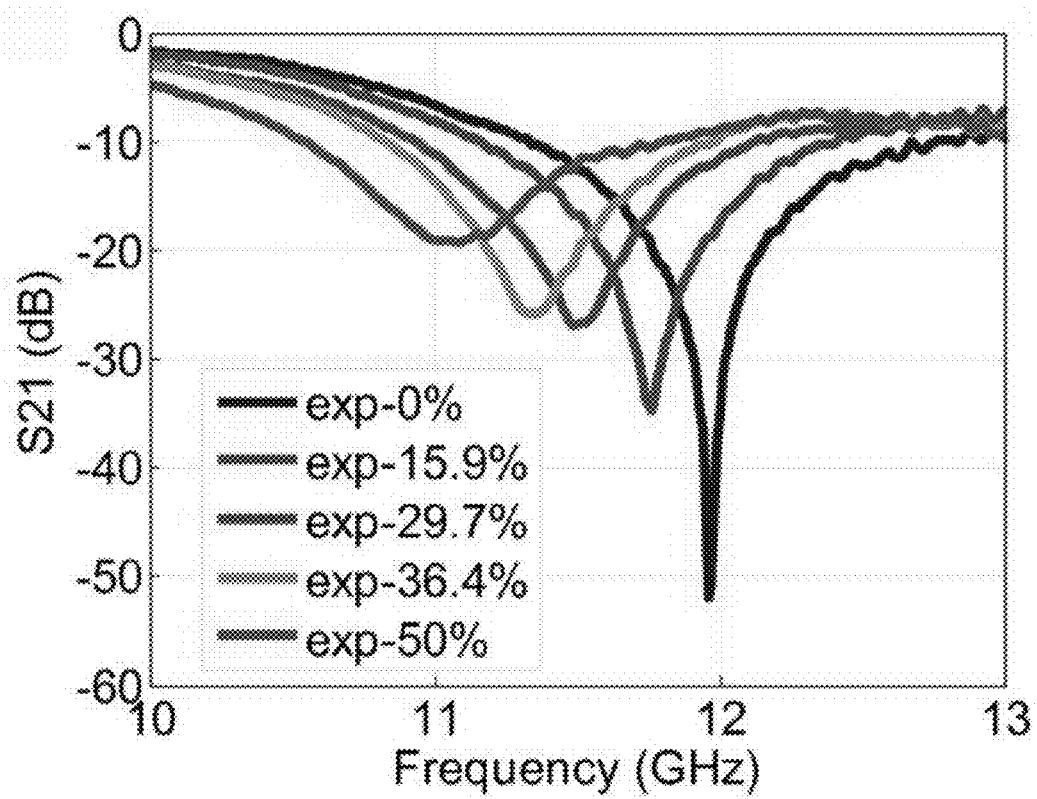

FIGS. 14(a) and (b) are graphs of experimental results of electromagnetic effects of the meta-skin of FIG. 12 at different stretch ratios and for different layers spacings.

Figure 13:
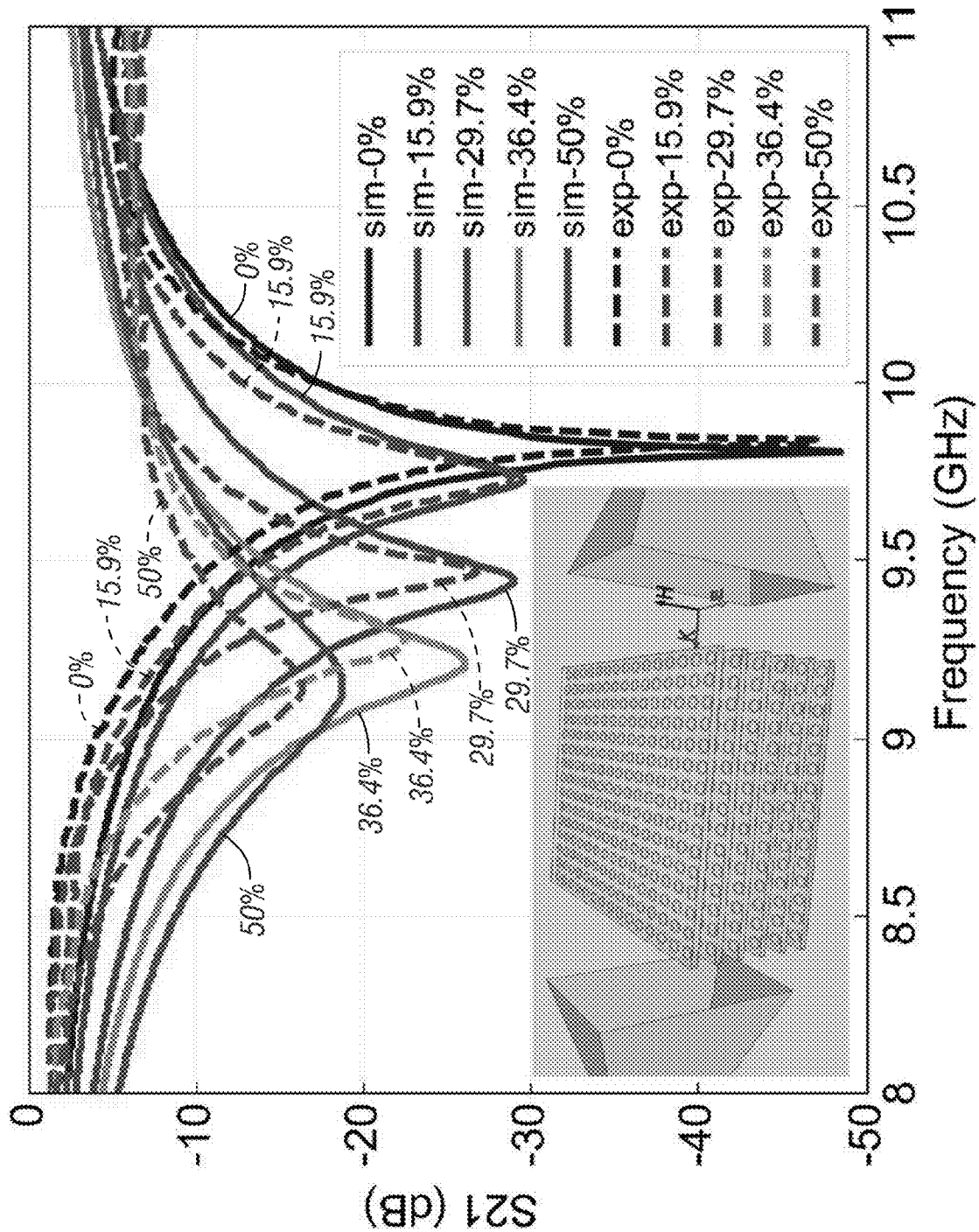
FIG. 13 is a graphic illustration of simulated and experimental results of tuning of the meta-skin of FIG. 12 by stretching.
Figure 14B:
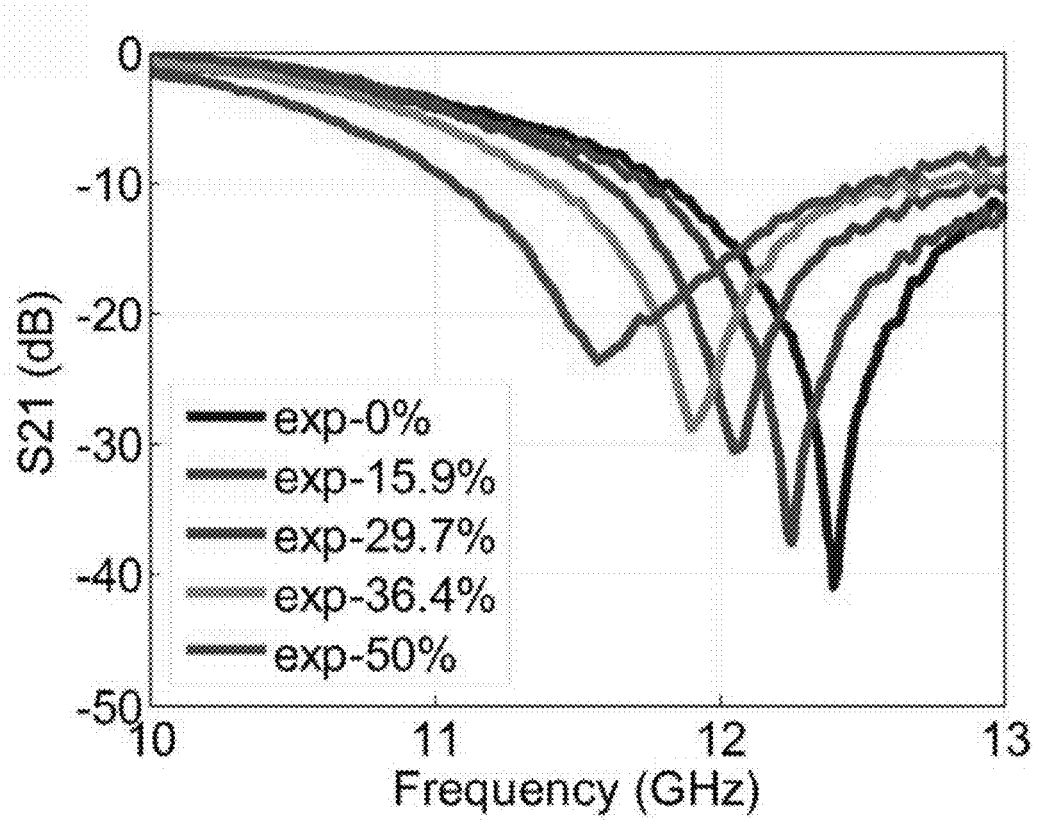
Figure 15:
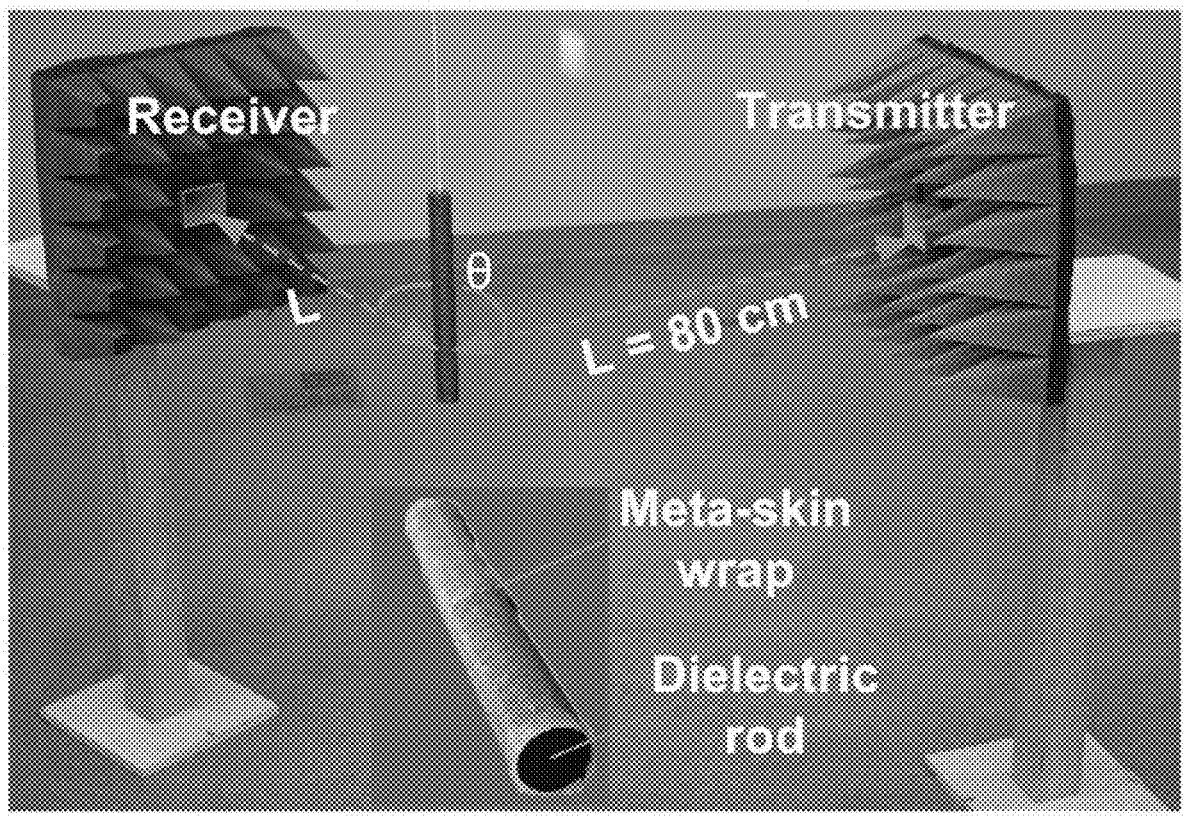

FIG. 15 is a photo and insert of an experimental set up for measuring electromagnetic effects of the meta-skin of the type of FIGS. 12-14 when wrapped around an object.

FIGS. 16(a)-(f) are graphs related to experiments with the set-up of FIG. 15.

Figure 17A:
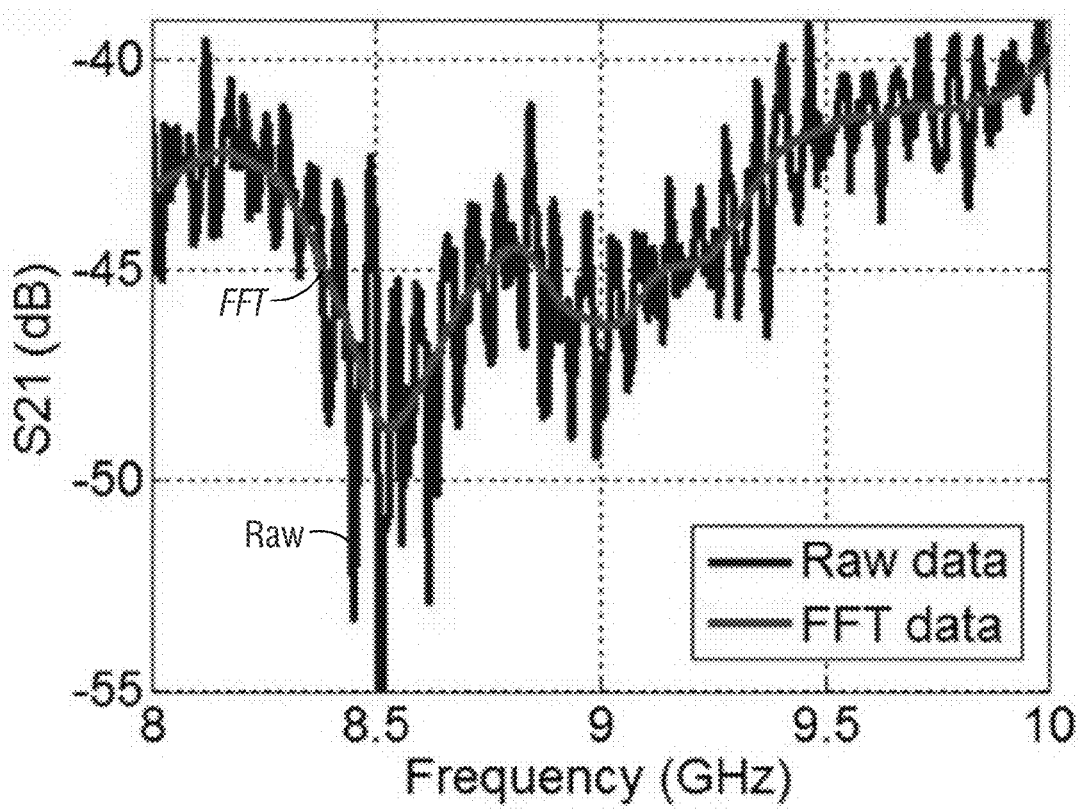
Figure 17B:
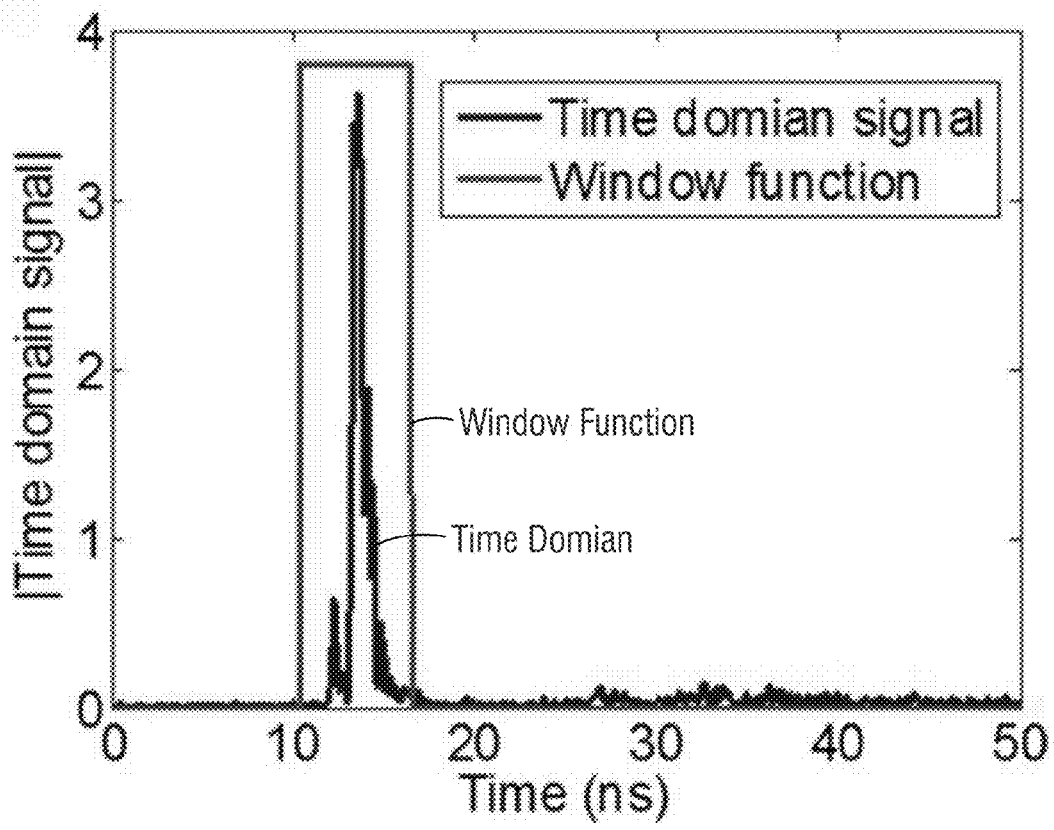

FIGS. 17(a)-(b) are additional graphs related to experiments with the set-up of FIG. 15.

Figure 18:
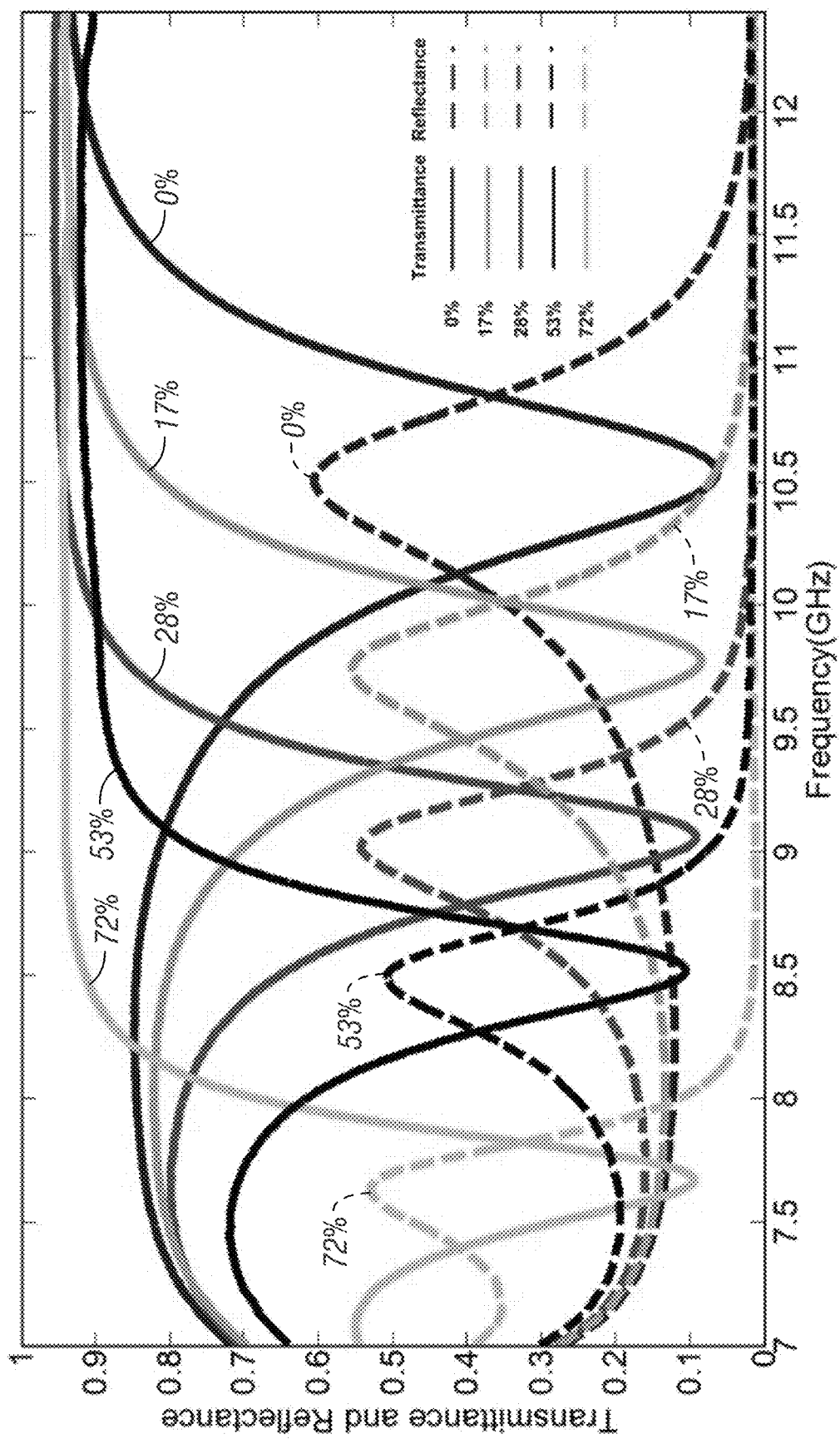

FIG. 18 is a supplemental graphical illustration of experiments relating to FIGS. 1-8.

Figure 19:
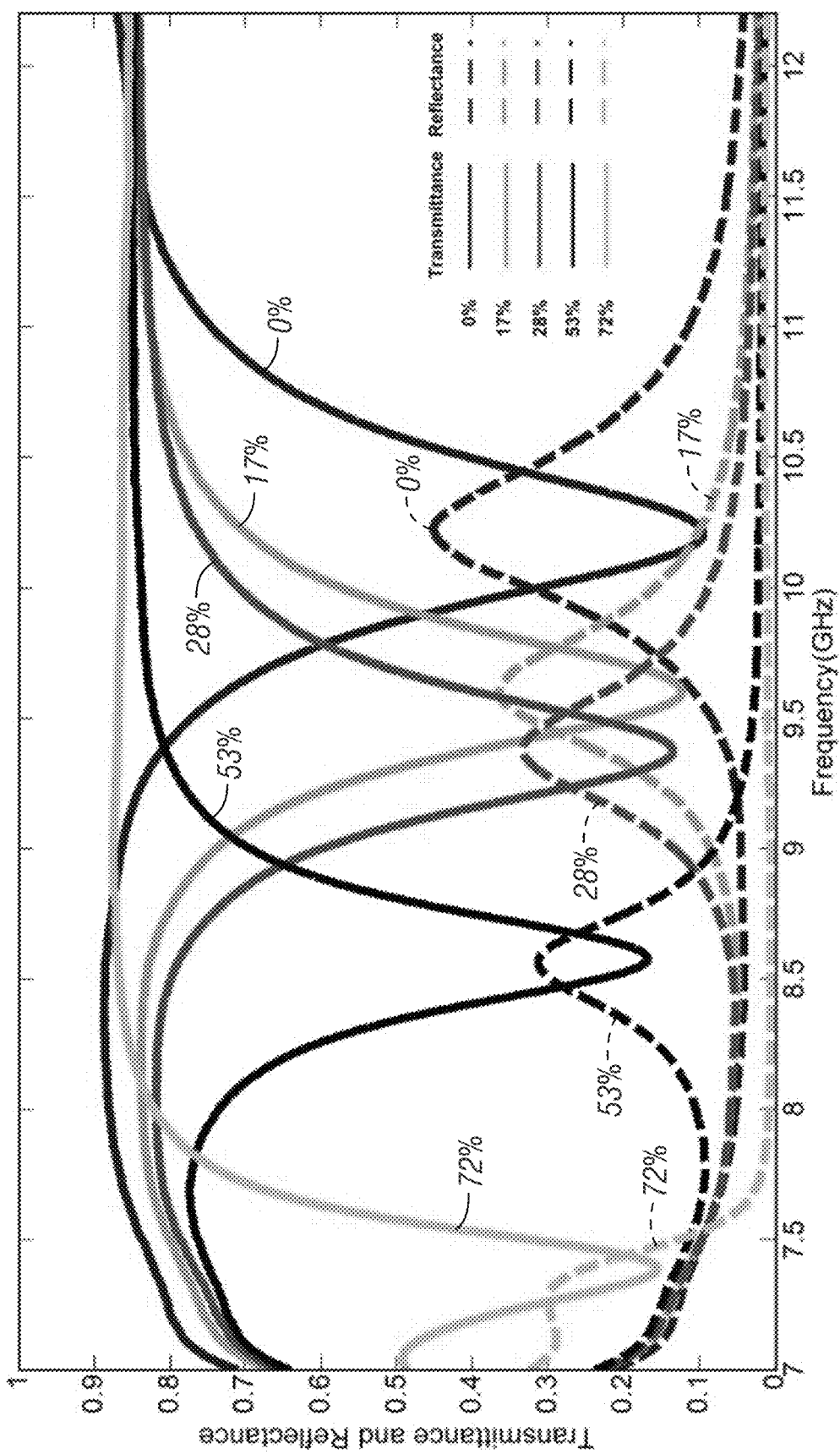

FIG. 19 is similar to FIG. 18.

Figure 20:
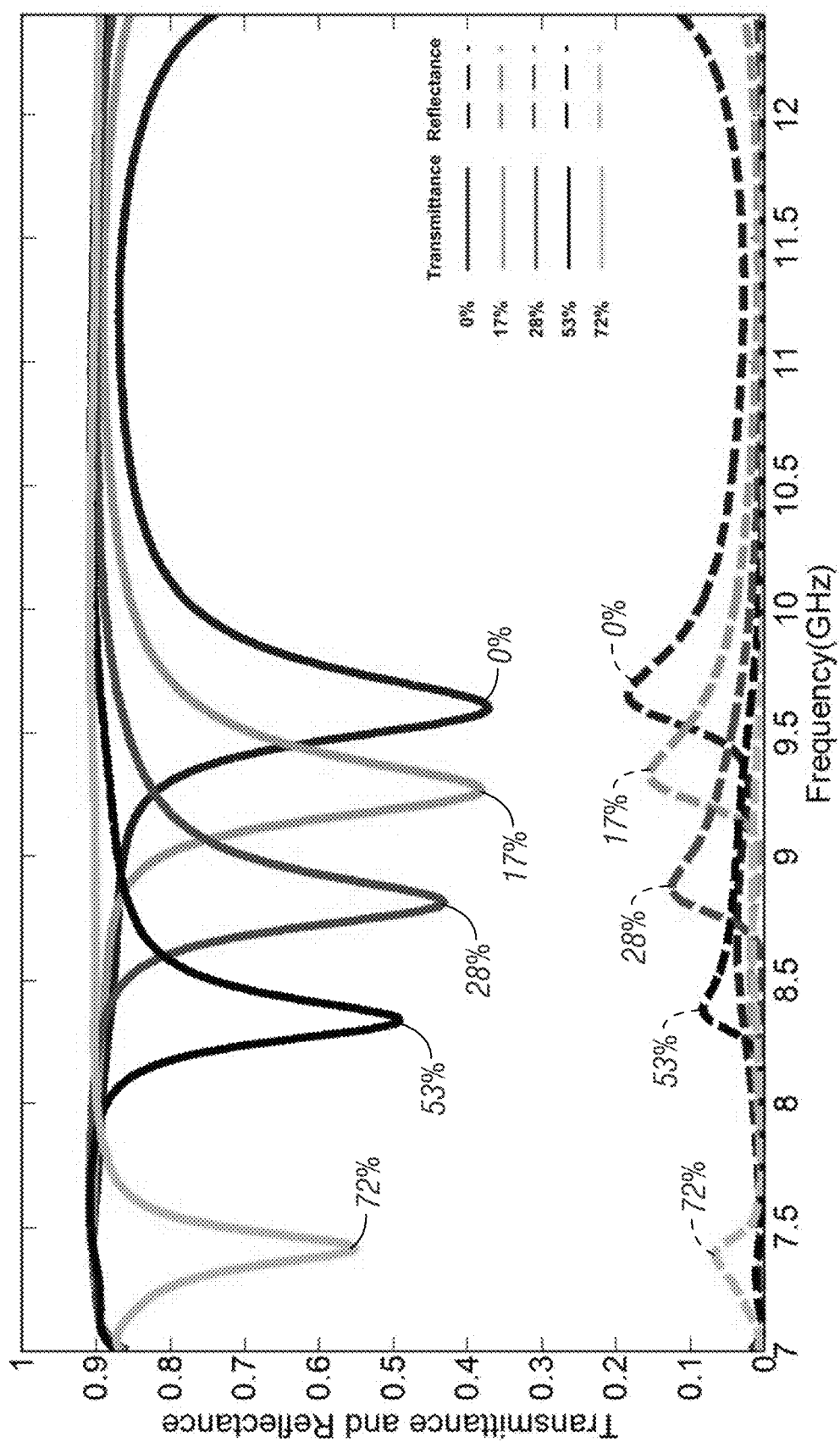

FIG. 20 is similar to FIGS. 18 and 19.

Figure 21:
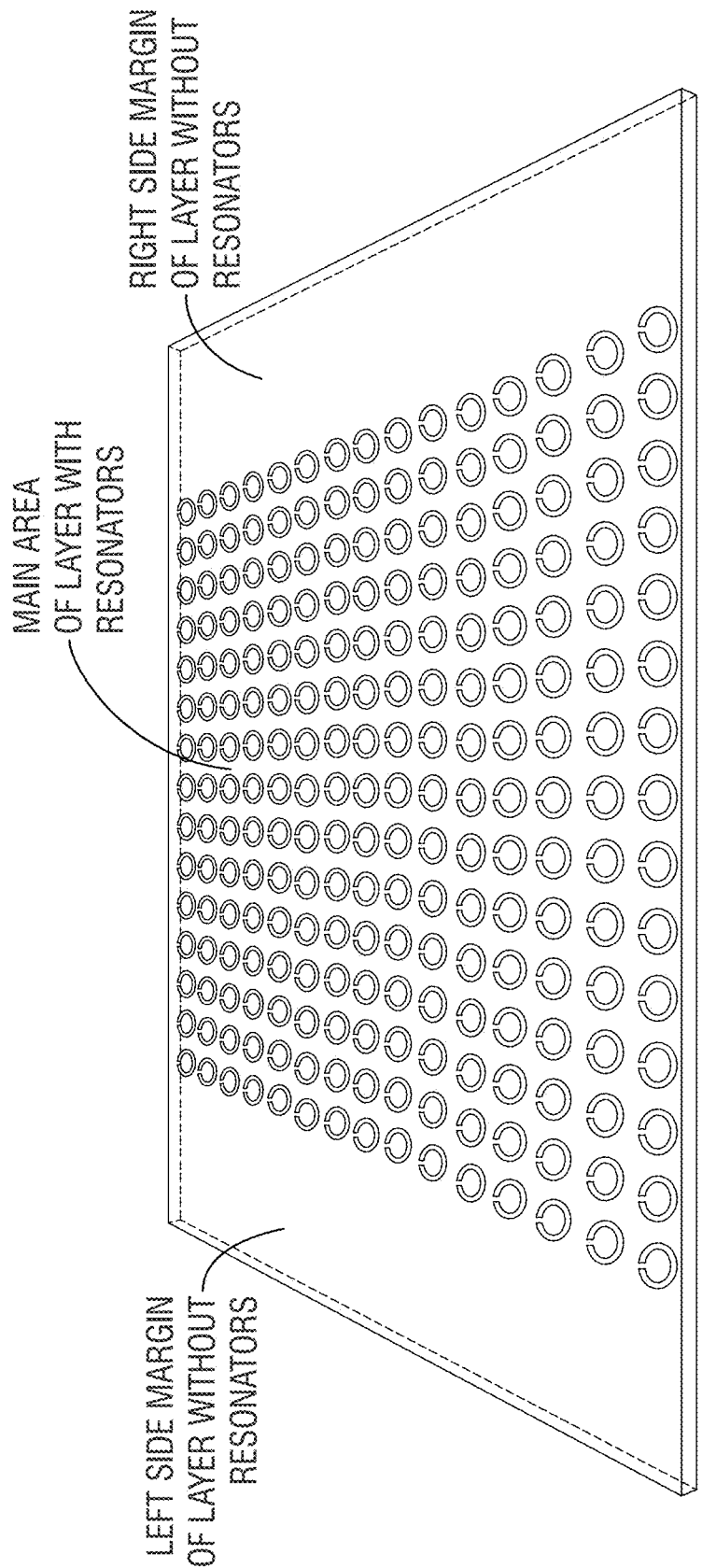

FIG. 21 is a diagrammatic illustration of an alternative embodiment for a meta-skin having opposite margins of the elastomer devoid of meta-atoms.

IV. DETAILED DESCRIPTION OF EXEMPLARY EMBODIMENTS OF THE INVENTION

A. Overview

The invention has been summarized above. For a better understanding of the invention and its aspects, several examples of forms or embodiments the invention might take will be discussed in detail below.

It is to be understood that these are examples only, and neither inclusive nor exclusive of all the forms the invention can take.

The examples will be discussed primarily in the context of meta-atoms having an SRR. However, it is to be understood the invention could be applied to other types of resonators.

From time to time reference will be made to the drawings and appendices, which are incorporated by reference herein.

In one form, an embodiment of the invention is a called a meta-skin. This is a continuous section or sheet of material of single or multiple laminations with periodic distribution of meta-atoms. The term includes the implication that the combination of meta-atoms and the carrier sheet is stretchable and flexible allowing it to be wrapped or form-fitted to objects. It is to be understood that generically the embodiment could alternatively be called a meta-material that is elastic.

B. Tunable Meta-Atoms

Below is a description of demonstration of tunable meta-atoms and a method for fabricating the same. See also P. Liu, et al., Tunable Meta-Atom Using Liquid Metal Embedded In Stretchable Polymer, Journal of Applied Physics 118, 014504 (2015), pages 014504-1 to 014504-8, which is incorporated by reference herein in its entirety (hereinafter "Liu 2015").

Liu 2015 describes and shows through experiments and simulations how resonant frequency of a stretchable meta-atom can be changed with stretching. Liu 2015 also describes one technique of building a stretchable meta-atom.

The meta-atoms of this type are one form that can be used in meta-skin, as will be further discussed later in this description.

Tunable meta-atom using liquid metal embedded in stretchable polymer

Reconfigurable metamaterials have great potential to alleviate complications involved in using passive metamaterials to realize emerging electromagnetic functions, such as dynamical filtering, sensing, and cloaking. This paper presents a new type of tunable meta-atoms in the X-band frequency range (8-12 GHz) toward reconfigurable meta-materials. The meta-atom is made of all flexible materials compliant to the surface of an interaction object. It uses a liquid metal-based split-ring resonator as its core constituent embedded in a highly flexible elastomer. We demonstrate that simple mechanical stretching of the meta-atom can lead to the great flexibility in reconfiguring its resonance frequency continuously over more than 70% of the X-band frequency range. The presented meta-atom technique provides a simple approach to dynamically tune response characteristics of metamaterials over a broad frequency range.

I. INTRODUCTION

Flexible electronics have gained considerable attention because of their potential applications in artificial skins, flexible displays, wearable sensors, sustainable energy, etc. Many flexible electronic devices have recently been developed, such as stretchable integrated circuits,[1-5] microfluidic antennas,[6-8] three-dimensional energy devices,[9] printed thin film transistors,[10-13] and biomimetic pressure sensors.[14] On the other hand, electromagnetic (EM) metamaterials have been intensively studied because they possess intriguing properties unattainable with naturally existing materials, such as negative permittivity and permeability.[15-27] Splitring resonator (SRR) is a popular building block of many metamaterial-based resonant devices in the microwave regime. But, these resonant devices often have a limited bandwidth. If the response characteristics are dynamically tunable, these resonant devices will become more useful when adapting to different applications. To this end, many tunable metamaterial technologies have been demonstrated, based on changing unit cell's effective circuit parameters, constituent material properties,[37-42] or geometries.[34-49] Specifically, the circuit tuning method uses variable capacitors and switches to change individual impedances of unit Tuning of the constituent materials relies on using phase change materials or liquid crystal to change properties of materials that make up unit cells.[37-42] The micro-electro-mechanical systems and microfluidics based approaches change structures and locations of unit cells relative to a fixed part of metamaterials.[43-49]

While the existing tunable metamaterial technologies have led to significant improvement toward broadening dynamic tuning ranges of the EM properties of microwave metamaterials, there is still much room for improvement such as simplifying resonance tuning mechanism, extending tuning range, and making metamaterials flexible enough to comply with surface irregularities on the underlying substrate. For example, a switchable metamaterial has recently been developed, capable of tuning its resonance frequency by pumping mercury into and out of SRR-shaped microchannels via a relatively complex microfluidic control system. A tunable liquid metal-based antenna has also been realized by injecting a liquid metal alloy into a microchannel made of a stretchable elastomer.[6] This device could be stretched to more than double of its original length, thus obtaining a wide frequency tuning range.

In this paper, we present a novel stretchable SRR-based meta-atom capable of tuning its EM response characteristics over a broad frequency range via simple mechanical stretching.

The presented meta-atom uses a liquid metal as the resonator material. The liquid metal is patterned to be a SRR structure and embedded inside a highly stretchable silicone elastomer. Due to its liquid nature, the SRR can flow in response to applied strains, and thus, is not prone to fatigue or cracking. When the encasing elastomer is stretched and twisted, the SRR will be sufficiently compliant to yield all necessary deformation. Therefore, by changing the shape of the SRR via mechanical stretching, the split gap capacitance and the inductance of the SRR can be adjusted, thus tuning the resonance response of the meta-atom.

II. DESIGN AND FABRICATION

To test the concept of mechanically tunable meta-atom, we designed a liquid metal SRR to operate in the X-band frequency range (FIG. 1).

FIG. 1 shows simulated magnitude of the electric field (E) distributions in the tunable liquid metal SRR at the resonance frequency of 9.214 GHz when not stretched (a), at 9.214 GHz when stretched by 30% along they direction (b), and at a new resonance frequency of 8.782 GHz at the stretched state (c).

While many types of liquid metal may be used, the SRR in this study employed eutectic gallium-indium or EGaIn (75.5% gallium and 24.5% indium; a liquid at room temperature and a solid at 14° C.) because of its favorable attributes, such as high electrical conductivity, low toxicity, and light weight. The liquid metal SRR had the inner radius of a=1.5 mm, the outer radius of b=2.0 mm, the thickness of h=0.5 mm, and the gap distance of g=1.0 mm. The SRR was encased by Ecoflex, a highly stretchable silicone elastomer with the maximal elongation at break of 900%. It is noteworthy that Ecoflex is thermally curable and suitable for replica molding from a master mold, just like polydimethylsiloxane, a commonly used elastomer in soft lithography. The length, width, and thickness of the Ecoflex encasing membrane were l=11.0 mm, d=7.5 mm, and t=1.45 mm, respectively.

Figure 1A:
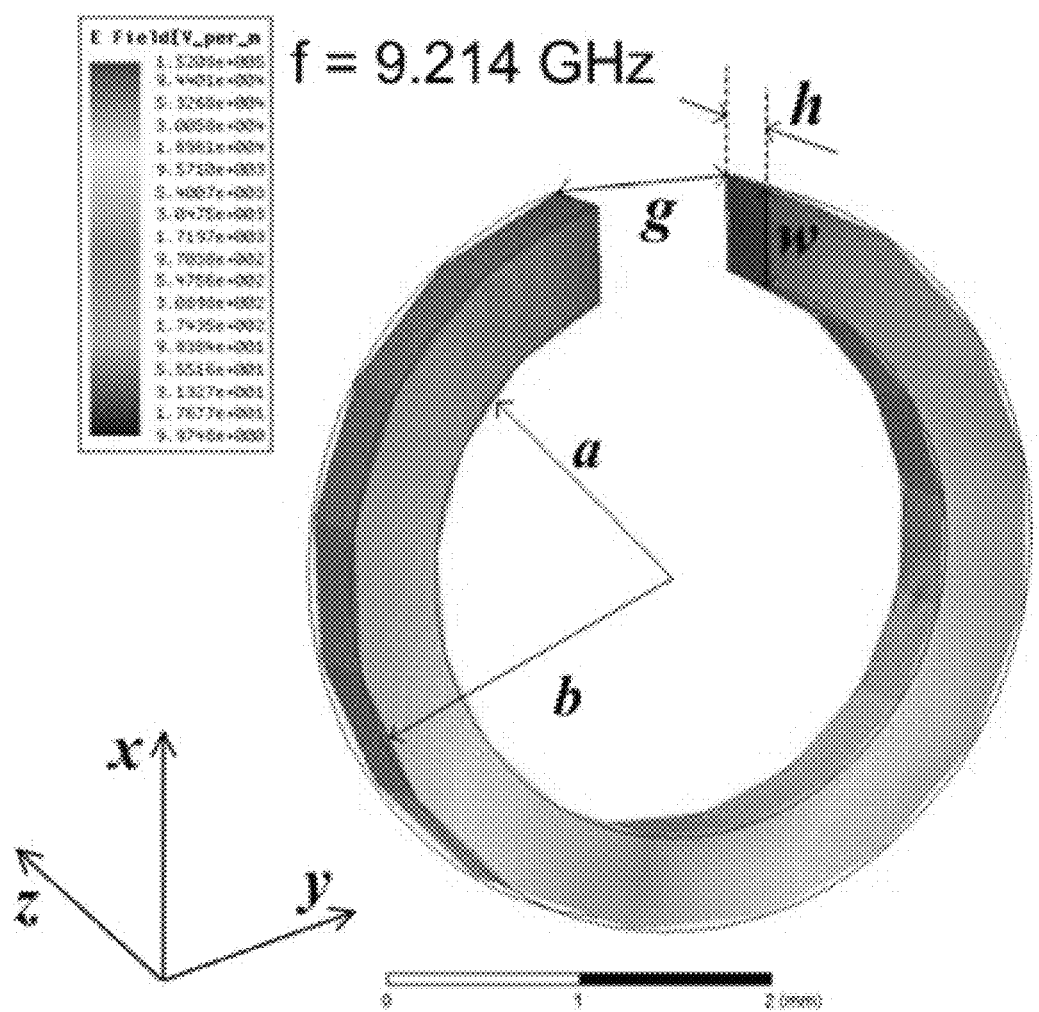
Figure 1B:
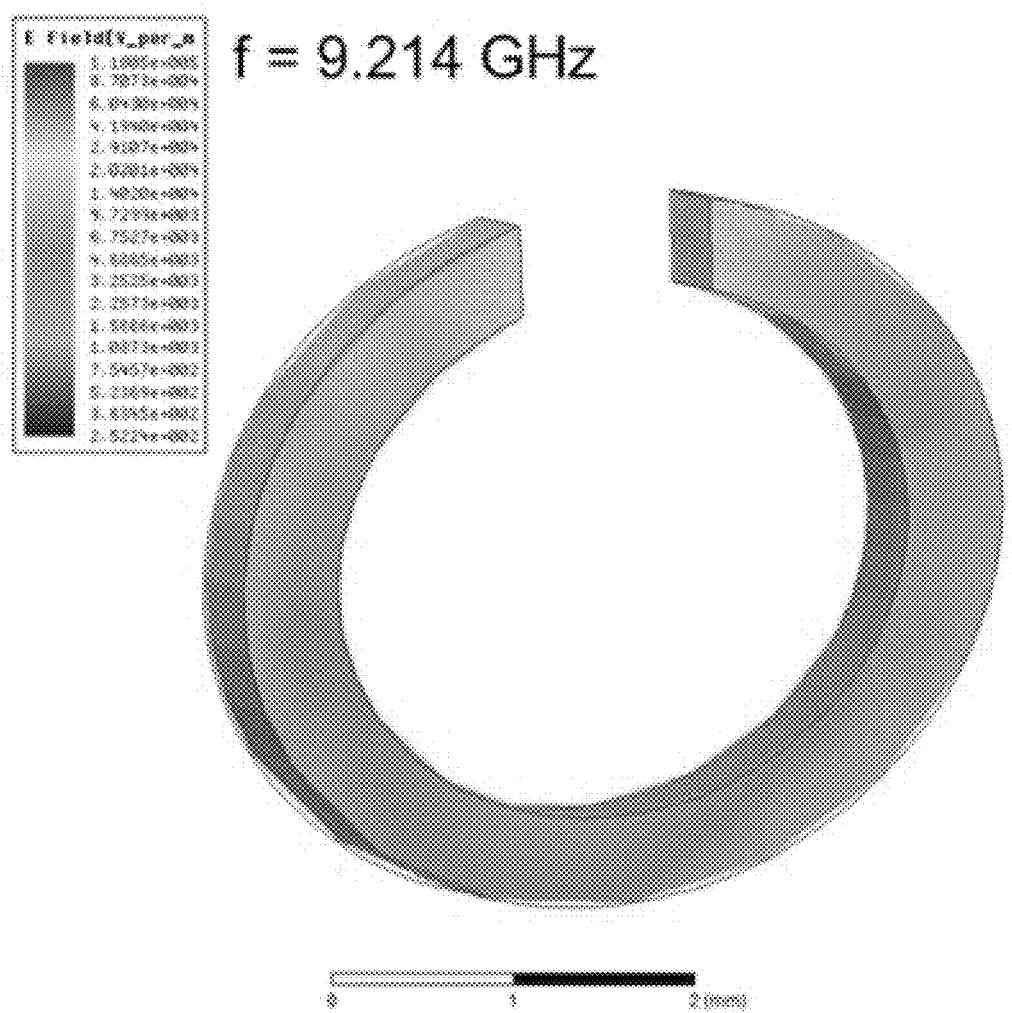
Figure 1C:
Figure 2A:
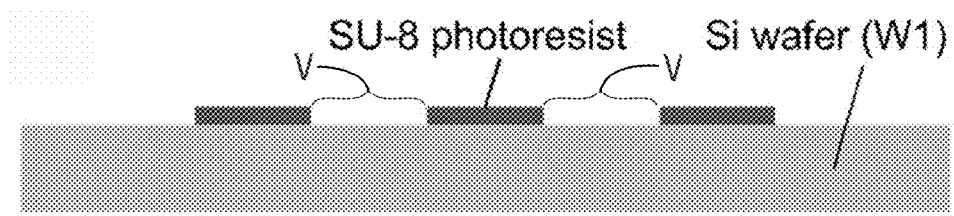
Figure 2B:
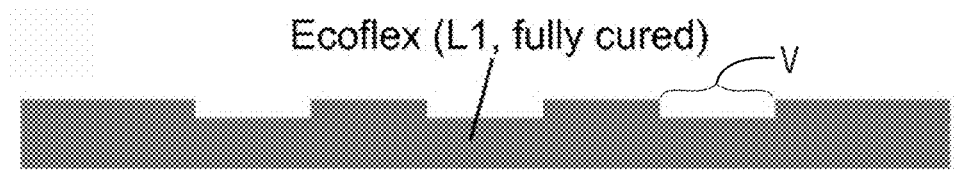
Figure 2C:
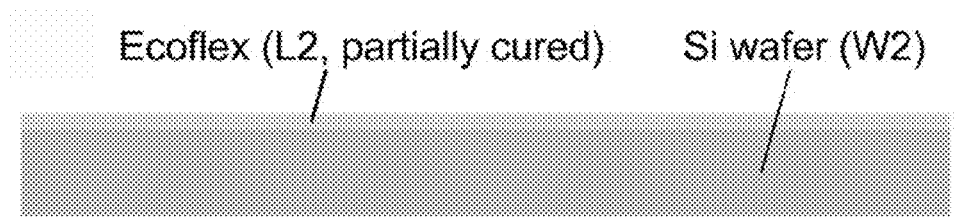
Figure 2D:
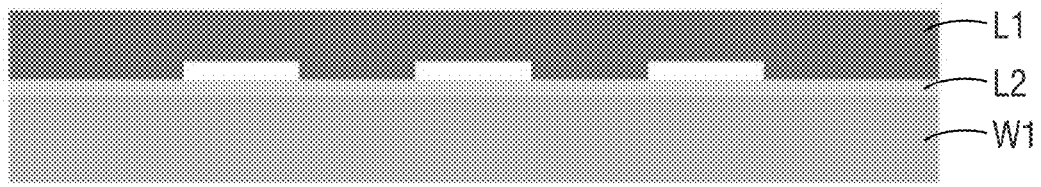
Figure 2E:
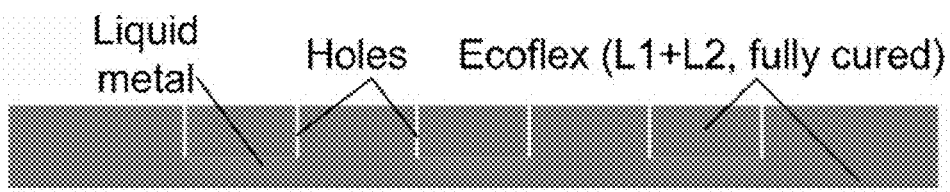
Figure 2F:
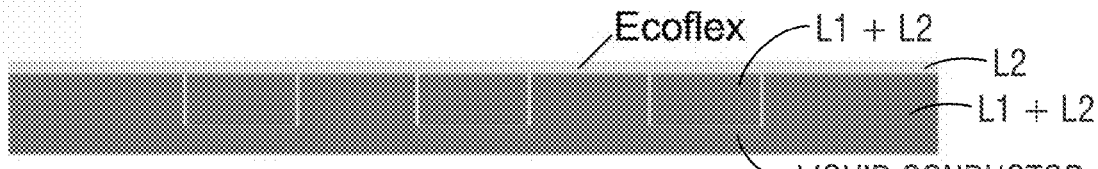
Figure 2G:
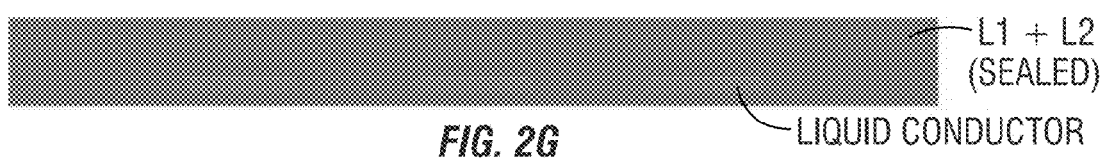

The resonant response of a SRR can be equivalently regarded as a LC resonator with a resonance frequency of $f_o=1/(2\pi\sqrt{LC})$ where the inductance L results from the current path of the SRR, and the capacitance C is determined by the split gap and the dielectric properties of the substrate along with the material that fills the gap. In this study, when the SRR was stretched, both of the capacitance and inductance would change, thus shifting the resonance frequency. To illustrate the influence of mechanical stretching on the resonance of the SRR, we conducted EM simulations using the Ansys High Frequency Structure Simulator (HFSS) software. As shown in FIG. 1, the SRR was fixed in the x-y plane inside a waveguide and the magnetic field (H) was parallel to the z direction and penetrated through the SRR, thus exciting the magnetic resonance. When the split gap of the SRR was aligned along the y direction, the resonance frequency before stretch was at 9.214 GHz (FIG. 1(a)). Applying the stretch of 30% along they direction led to an increase in the split gap along the same direction (FIG. 1(b)). As a result, the SRR was brought out of resonance at 9.214 GHz and resonated at a new frequency of 8.782 GHz (FIG. 1(c)). We note that the simulation here only conceptually illustrated the proposed tuning mechanism. The more quantitative simulation results are presented and discussed later, together with the experimental results.

FIG. 2 shows the fabrication process flow for the tunable meta-atom. First, to form the SRR-shaped microchannels, an 800-μm-thick Ecoflex layer L1 was cast upon a master mold made of SU-8 photoresist on a silicon (Si) wafer W1, and then, was fully cured at 60° C. on a hotplate for 30 min (FIGS. 2(a) and 2(b)). In a parallel process, a 100-μm thick Ecoflex thin layer L2 was spin-coated on another Si wafer W2, followed by partial curing at 50° C. on a hotplate for 40 s (FIG. 2(c)). Subsequently, the layer L1 was peeled off from the master mold and adhered to the partially cured layer L2. The two layers L1 and L2 were then permanently and thermally bonded together on a hotplate at 90° C. for 30 min (FIG. 2(d)). After the two bonded layers were peeled off from the wafer W2, the liquid metal EGaIn was injected into the embedded microchannels through two 100-μm-diameter holes mechanically punched at the two ends of each microchannel. There were some residues of the eutectic alloy remaining around the holes on the top surface of the Ecoflex structure. To clean the top surface, a cotton swab was dipped in a solution of hydrochloric acid (50%, v/v) and then carefully wiped off any residues from the top surface (FIG. 2(e)). To encapsulate the liquid metal inside the Ecoflex elastomer, a new Ecoflex prepolymer solution was poured onto the cleaned top surface, followed by a full curing process performed at 80° C. on a hotplate for 30 min (FIGS. 2(f) and 2(g)). Therefore, the liquid metal SRRs were formed inside the elastomer. The total thickness of the elastomer was 1.45 mm as mentioned. The SRRs were located nearly at half the thickness of the elastomer. Lastly, individual SRRs were diced out of the whole elastomer for testing.

III. EM MEASUREMENT CONFIGURATIONS

After the meta-atom was formed, we carried out the EM measurements over the X-band using a WR90 rectangular waveguide (22.86×10.16 mm) terminated by a UG39/U cover flange. When the waves propagated in the waveguide, the directions of E and H were along the short edge and the long edge of the waveguide, respectively. The walls of the waveguide acted as reflective mirrors and made the SRR cell behave as an element in a 2D quasi-periodic structure with normal incidence wave. The SRR sample was attached onto a wood slab (low-loss microwave substrate material) and centered in the middle of the waveguide. Multiple cotton wires were inserted through the holes prepunched at the opposite ends of the Exoflex elastomer. The elastomer was then stretched to a specified strain level (17%, 28%, 53%, or 72%). To hold the sample in place, the cotton wires passed through the holes predrilled in the wood slab and then rolled and tied on the wood posts at the backside of the slab. The spectra were measured using a programmable vector network analyzer (Agilent E8364). A full 2-port calibration was performed to set an accurate reference plane before the measurement.

There were six possible arrangements for the SRR inside the waveguide, as illustrated in FIG. 3. FIG. 3 shows six possible configurations of the SRR inside a testing waveguide. The inset in (a) shows the relative location of the ring to the waveguide. The electric dipole formed by opposite electric charges accumulating across the gap of the ring couples the SRR resonance to the E field of the incident waveguide mode in (a) and (c). The magnetic dipole moment due to the loop current couples to the incident H field normal to the ring plane in (c) and (d). No coupling to the resonance was found in (b), (e), and (f) in X-band.

Figure 3A:
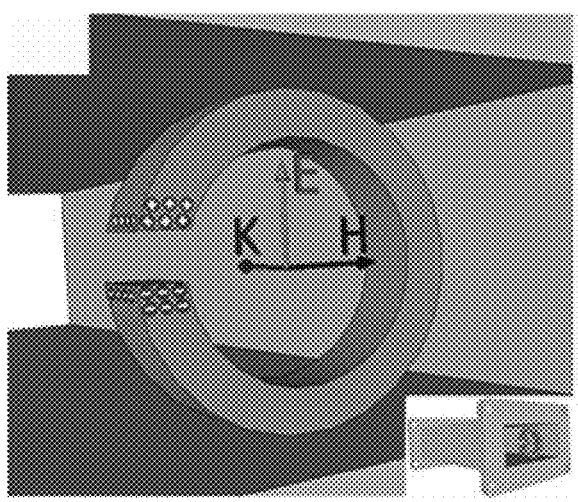
Figure 3B:
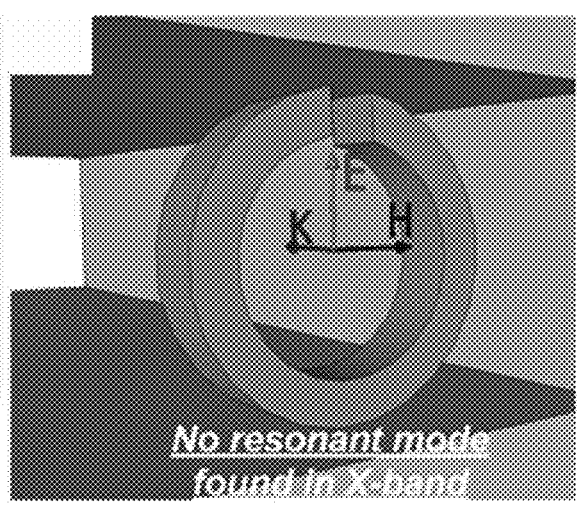
Figure 3C:
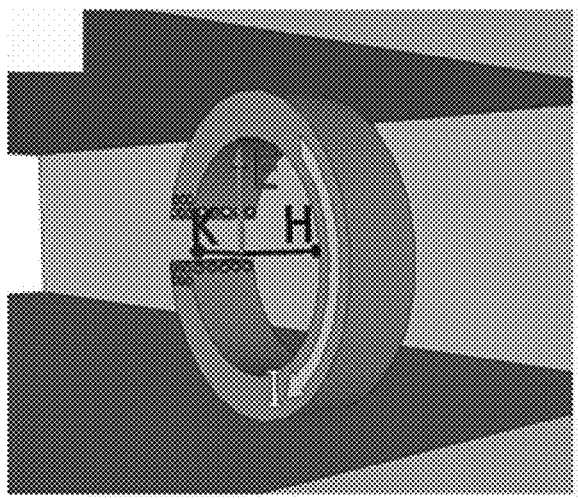
Figure 3D:
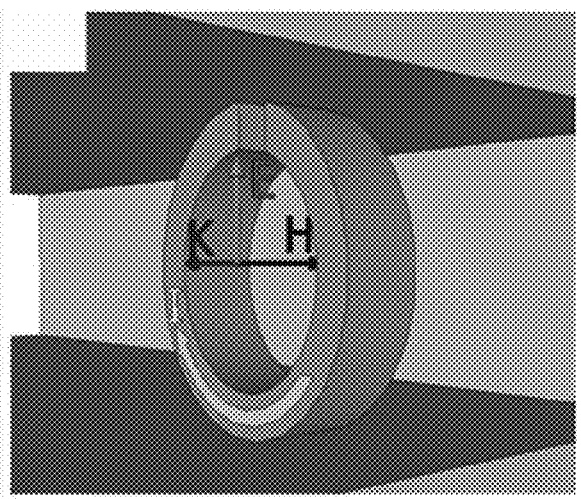
Figure 3E:
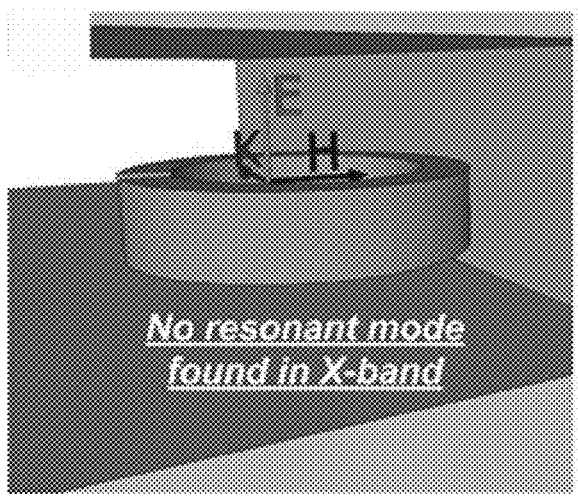
Figure 3F:
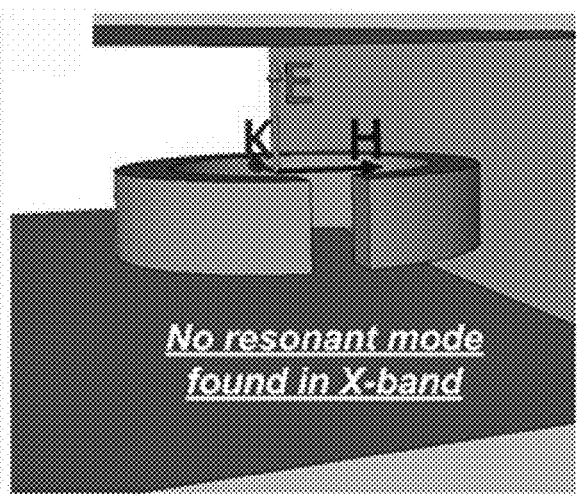

But only three of them (FIGS. 3(a), 3(c), and 3(d)) were able to excite the resonance of the circular ring current in the SRR (magnetic dipole resonance). FIG. 3(a) displays that the incident wave was normal to the plane of the ring and the E field was parallel to the gap direction. The electric dipole formed across the split gap allowed coupling of the E field of the waveguide mode to the magnetic dipole resonance of the SRR because of the broken symmetry of the ring with respect to the E-field direction. In the case shown in FIG. 3(c), both the electric moment across the gap driven by the incident E field and the magnetic moment of the circular ring induced by the incident H field current jointly excite the resonance of the ring. FIG. 3(d) shows that the H field is normal to the plane of the ring, which induces the circulating current in the ring and generate magnetic moment. Neither electric nor magnetic dipole moment could couple to the incident waveguide mode in the other three configurations shown in FIGS. 3(b), 3(e), and 3(f).

IV. RESULTS AND DISCUSSION

Figure 4A:
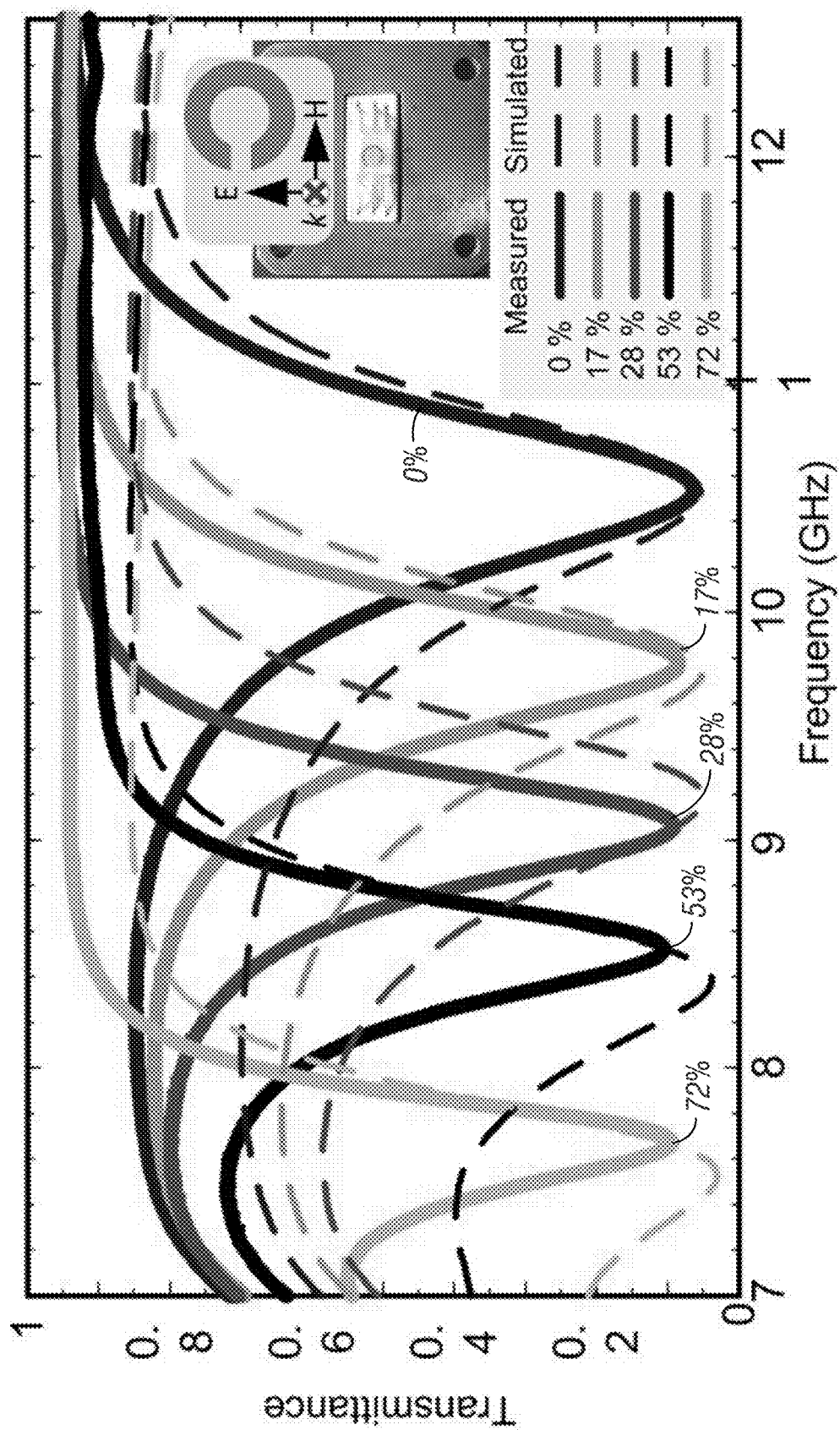

In the first measurement configuration (FIG. 3(a)), the SRR was stretched along the H-field direction with different stretch ratios. The E field was formed across the split gap to excite the electric resonance that corresponded to a transmission dip at the resonance frequency in the transmittance spectrum (see supplementary FIG. 18 for the reflectance spectrum[50]). The experimental result in FIG. 4(a) shows that by stretching the SRR, the resonance was progressively tuned to the lower frequencies. For the stretch ratio of 17%, 28%, 53%, and 72%, the resonance frequency red shifted from 10.54 GHz to 9.78 GHz, 9.05 GHz, 8.52 GHz, and 7.67 GHz, respectively.

FIG. 4 illustrates (a) Measured and simulated transmittance spectra of the tunable liquid metal SRR meta-atom at different stretching ratios of 0, 17%, 28%, 53%, and 72%, when the meta-atom was placed inside the waveguide as shown in the inset. Also, refer to FIG. 3(a) for the measurement arrangement. The conductivity of liquid metal was $3.46 \times 10^6$ S/m. The dielectric constant and loss tangent of Ecoflex silicone rubber was 2.5 and 0.01, respectively. The SRR was placed on a wood substrate with the dielectric constant of 1.22 and the loss tangent of 0.1. (b) Experimental (left) and corresponding simulated (right) results for the stretch-induced mechanical deformations of the tunable meta-atom.

Figure 4B:
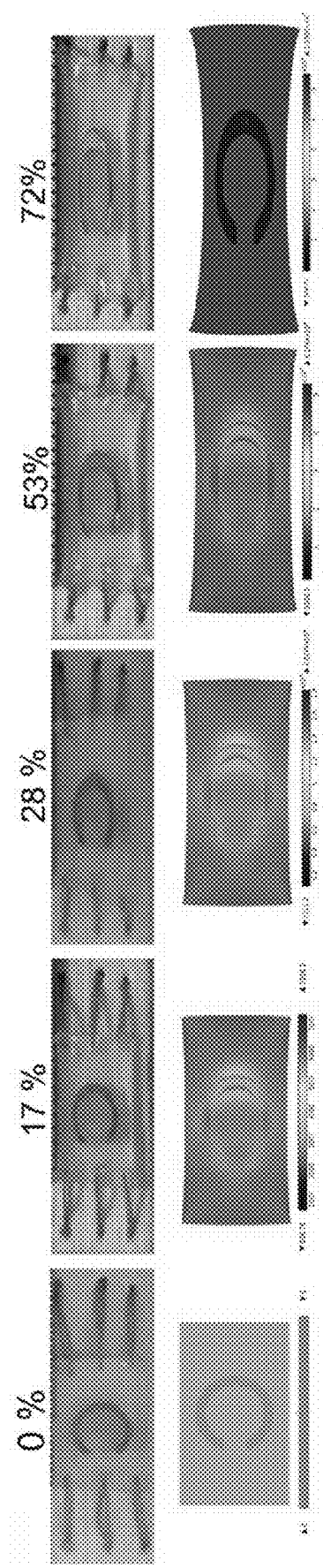

The deformation of the SRR under different stretch levels was observed to be consistent with the simulated deformation using the finite element method analysis (FEA) with the COMSOL Multiphysics (FIG. 4(b)). The embedded liquid metal was also found to remain continuous while being compliant to the changing shape of the surrounding elastomer.

We modeled the SRR and conducted simulations for its resonance response to different stretching magnitudes using the full-wave 3D EM simulation tool in the CST Studio. The surface geometric parameters of the deformed SRR and elastomer structures were extracted from their top-view images. The thicknesses of the liquid metal and the elastomer were estimated by dividing their respective volume by the corresponding surface area. In this simulation, the SRR was placed in a rectangular waveguide with four metal walls, the same as the experimental measurement setup. The simulated transmittance spectra of the SRR were presented with dotted lines along with the experimental result in FIG. 4(a).

In the second measurement configuration (FIG. 3(c)), the resonance was excited by both of the E and H fields. At the stretch level of 17%, 28%, 53%, and 72%, the resonance frequency was observed to red shift from 10.21 GHz to 9.58 GHz, 9.37 GHz, 8.58 GHz, and 7.37 GHz, respectively (FIG. 5(a)).

FIG. 5 illustrates (a) Measured and simulated transmittance spectra of the tunable liquid metal SRR meta-atom at different stretching ratios of 0, 17%, 28%, 53%, and 72%, when the meta-atom was placed inside the waveguide as shown in the inset. Also, refer to FIG. 3(c) for the measurement arrangement. (b) Experimental (upper) and corresponding simulated (lower panel) results for the stretch-induced mechanical deformations of the tunable meta-atom.

In the third measurement configuration (FIG. 3(d)), the resonance was induced by the circulating current in the ring caused by the H field. The measurement result shows that at the stretch level of 17%, 28%, 53%, and 72%, the resonance frequency also red shifted from 9.58 GHz to 9.24 GHz, 8.79 GHz, 8.32 GHz, and 7.32 GHz, respectively (FIG. 6(a)).

FIG. 6 shows (a) Measured and simulated transmittance spectra of the tunable liquid metal SRR meta-atom at different stretching ratios of 0, 17%, 28%, 53%, and 72%, when the meta-atom was placed inside the waveguide as shown in the inset. Also, refer to FIG. 3(d) for the measurement arrangement. (b) Experimental (upper) and corresponding simulated (lower panel) results for the stretch-induced mechanical deformations of the tunable meta-atom.

Figure 5A:
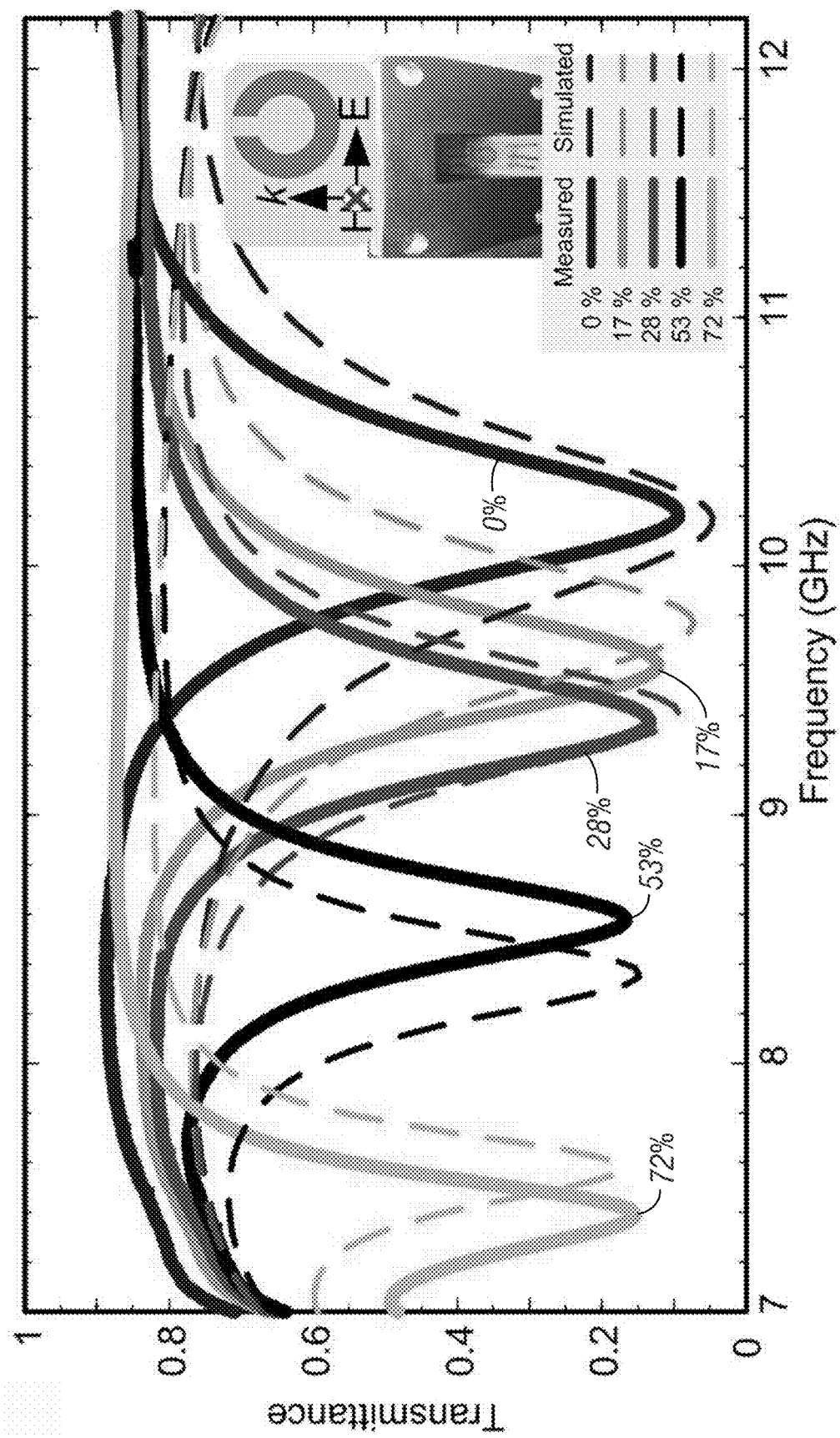
Figure 5B:
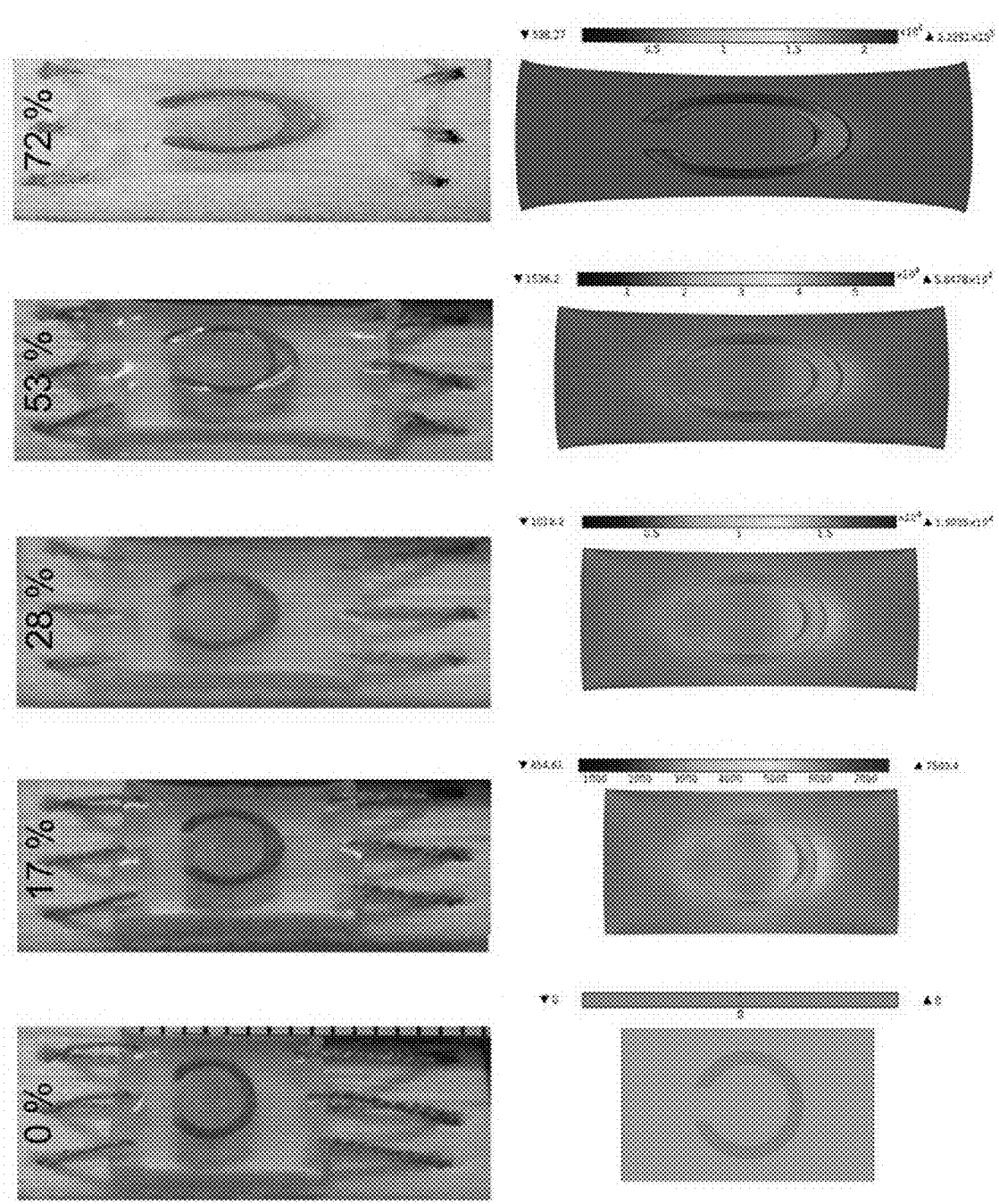
Figure 6A:
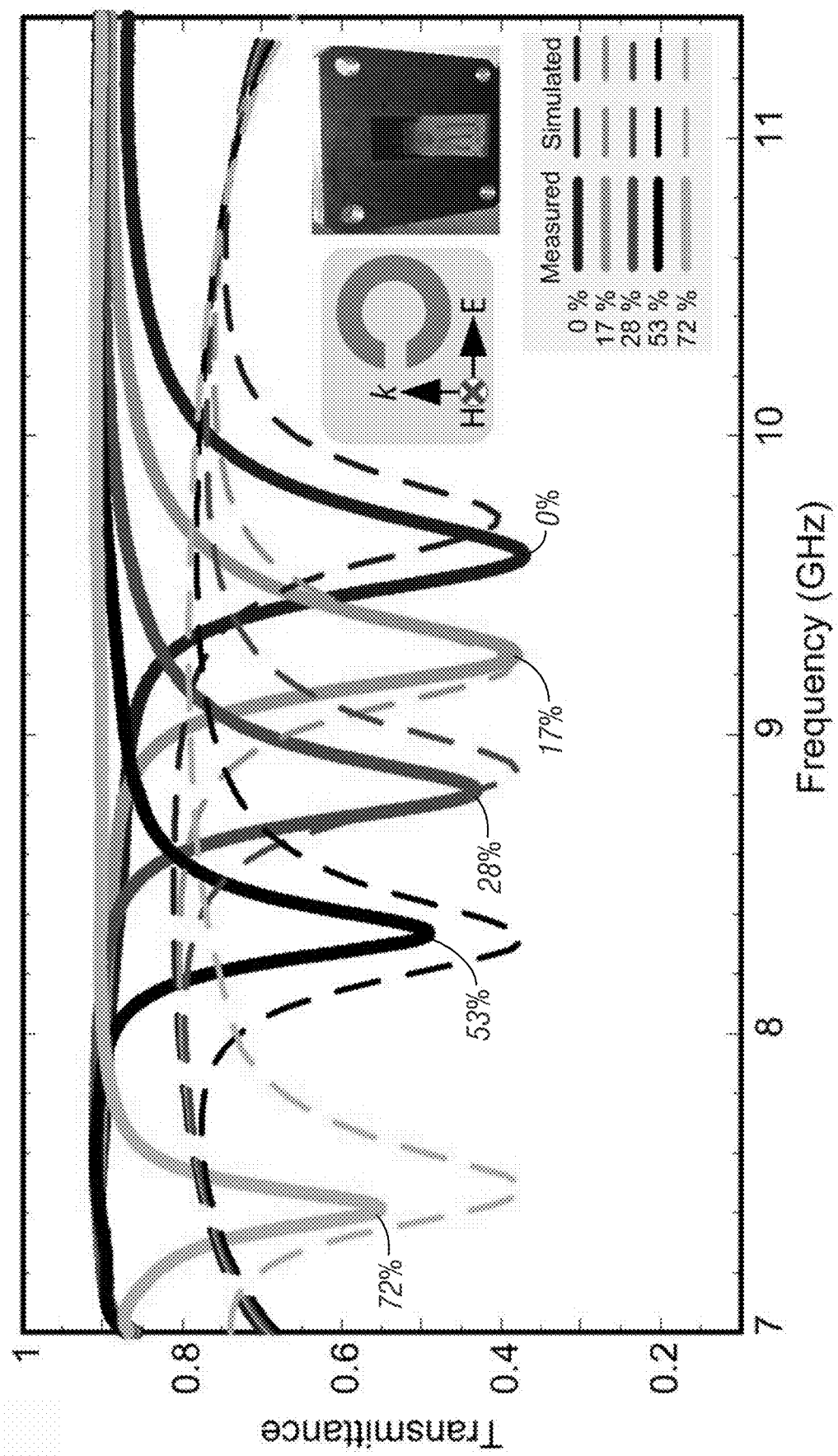
Figure 6B:
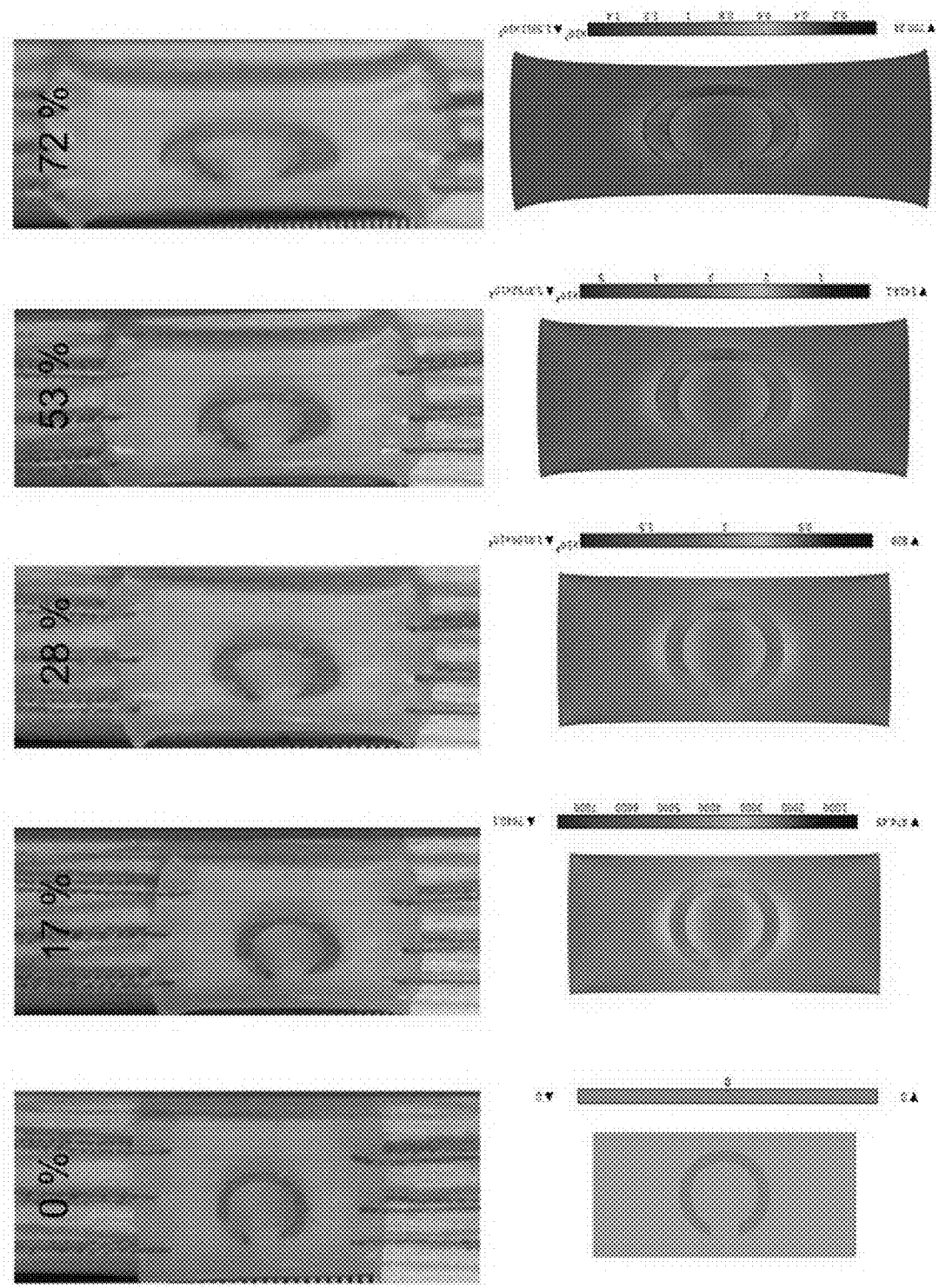

Similarly, FIGS. 5(b) and 6(b) show the experimental and simulated geometric changes of the SRR at different stretching levels in the second and third configuration, respectively (see supplementary FIGS. 19 and 20 for the reflectance spectrum of the second and the third measurement configuration, respectively[50]).

For all three of the aforementioned configurations, the experimental EM measurement results show good agreement with the simulated results. The slight discrepancy between the simulated and testing results indicates that the 3D model used in the CST-based EM simulation is acceptable. It is also noted that the modeling accuracy mainly depends on the accuracy of the extracted surface geometric parameters and the estimated thickness of the deformed SRR and Ecoflex structures (FIGS. 4(b), 5(b), and 6(b)). Nevertheless, as demonstrated, when the same stretch of 72% was applied to the SRR in all the three measurement configurations, the resonance frequency of the SRR was tuned by a net shift of 2.87 GHz (FIG. 4(a)), 2.83 GHz (FIG. 5(a)), and 2.26 GHz (FIG. 6(a)), or a relative shift of 27.2%, 27.8%, and 23.5%, with respect to the original resonance frequency of 10.54 GHz, 10.20 GHz, and 9.58 GHz, respectively.

Figure 7:
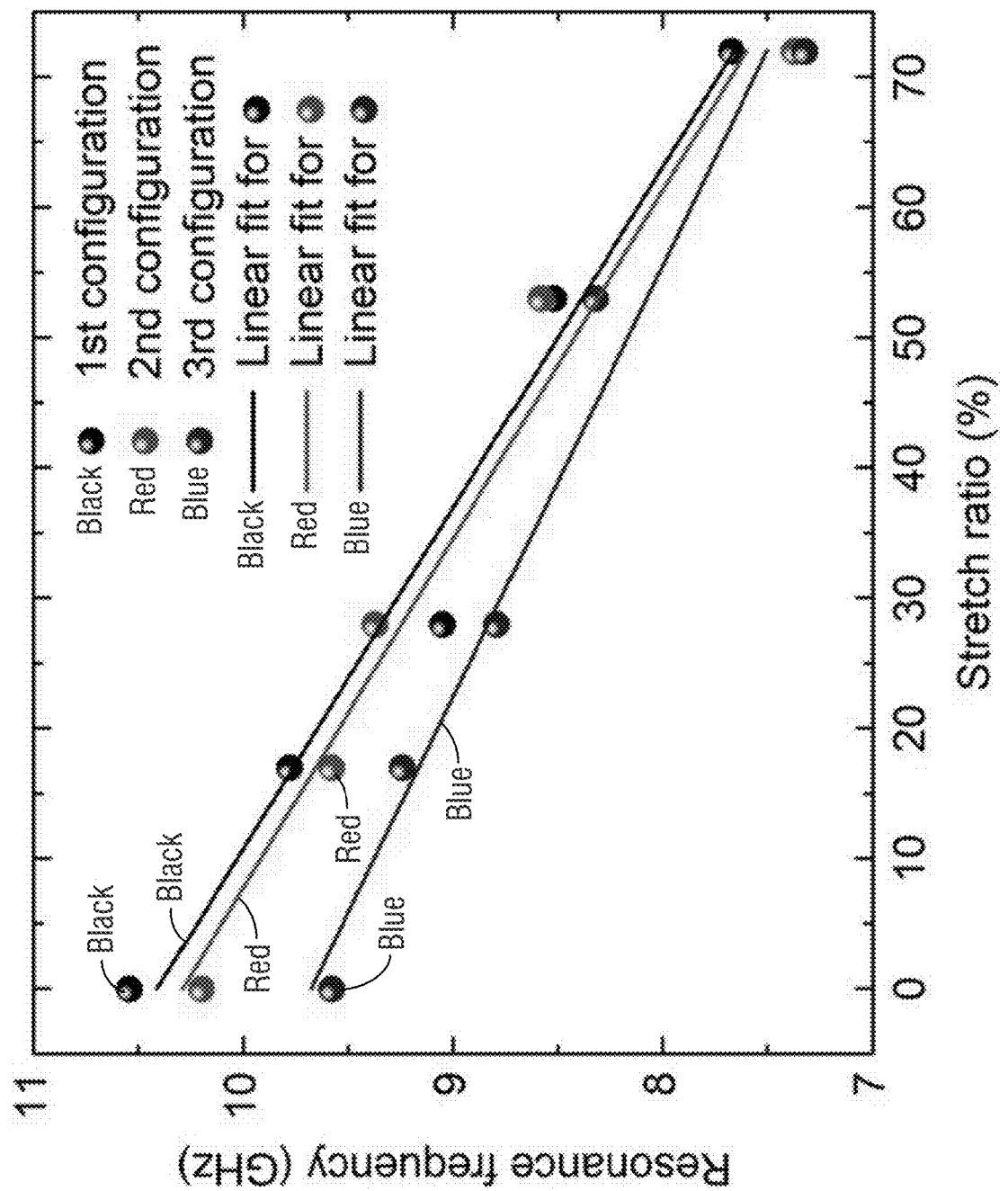

FIG. 7 summarizes the relationships between the stretch ratio and the resulting resonance frequency shift. FIG. 7 demonstrates resonance frequency as a function of the stretch ratio for the tunable meta-atom in the three measurement configurations shown in FIGS. 4-6.

Although the obtained experimental and CST-based simulation results have demonstrated the ability to tune the resonance frequency of the SRR via mechanical stretching, it is worthwhile to further understand how the equivalent capacitance and inductance of the SRR were influenced by their geometric deformation. The equivalent capacitance is dominated by the split gap capacitance $C_{gap}$, which is a function of the gap geometry (see Eq. (S1) in supplementary material for the closed-form equation[50]). The equivalent inductance consists of self-inductance of the conducting loop and the mutual inductance induced by the boundary condition of a given waveguide that are imposed on the SRR for certain orientations (quasi-periodic structure). The self-inductance of an unstretched circular loop $L_0$ and a stretched elliptical loop $L_e$ are geometrically dependent (see Eqs. (S2) and (S3) in supplementary material for the closed-form equation[50]). The mutual inductance depends not only on the self-inductance but also on the SRR orientations with different mirror effects imposed by the waveguide. We note that in the previous experiments, the resonance modes of the SRR were excited inside a waveguide where mutual interactions with the inner walls of the waveguide existed. But, to simplify the simulation while still illustrating a changing trend of resonance frequency shift, the effect of the mutual interaction into the free-space simulation was excluded, because compared with the effect from the mutual interaction with the walls, the geometric deformation of the SRR could be considered to contribute most to the resonance frequency change. Therefore, we performed EM simulations for a single SRR using HFSS in the free space. Specifically, a delta-gap source was set along the gap direction to excite the unit cell (FIG. 8(a)), and the impedance was monitored while sweeping the frequency.

FIG. 8 includes (a) Schematic of the tunable SRR in the free space. A delta-gap source was set along the split gap. (b) Equivalent circuit of the SRR shown in (a). (c) Simulated capacitance and inductance as a function of the stretch ratio when the SRR was stretched perpendicular to the split gap direction. (d) Simulated capacitance and inductance as a function of the stretch ratio when the SRR was stretched along the gap direction.

Figure 8A:
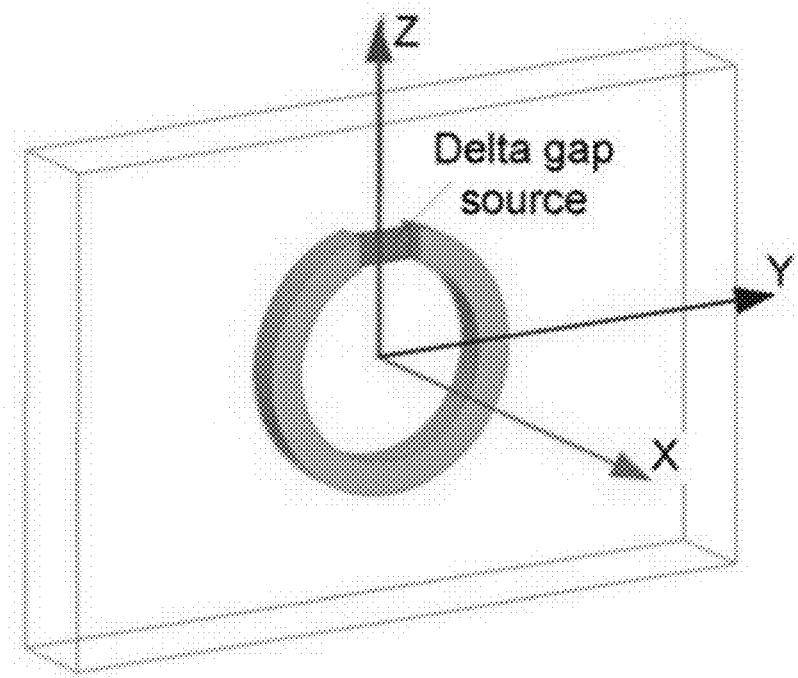
Figure 8B:
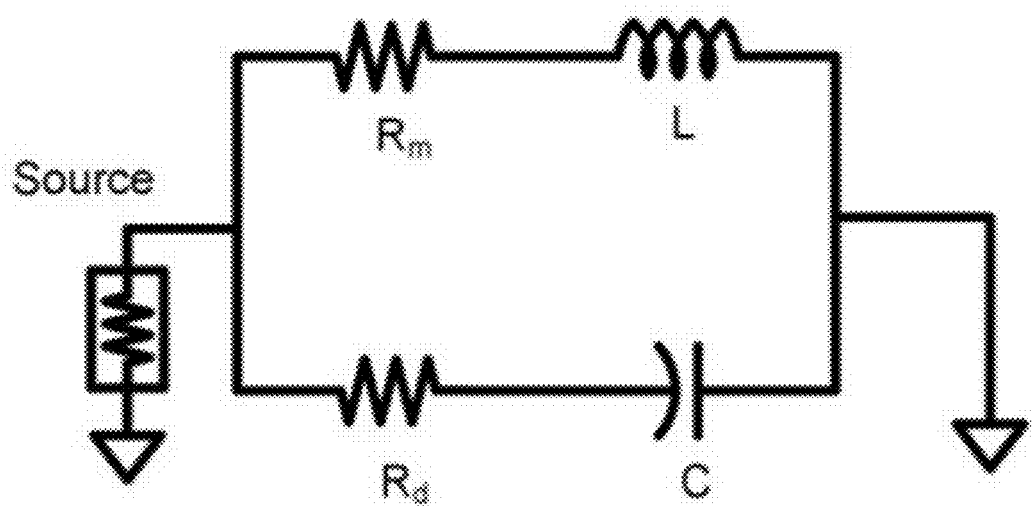

To describe the resonance behavior of the stretching SRR, we designed a one-port equivalent circuit taking into account the equivalent inductance L and capacitance C, the dielectric loss Rd from the substrate, and the metallic loss $R_m$ from the liquid metal (FIG. 8(b)). The lumped L and C were obtained by optimizing the impedance of the equivalent circuit based on the simulated impedance around the resonant frequency with less than 3% of relative error for each stretching case.

Figure 8C:
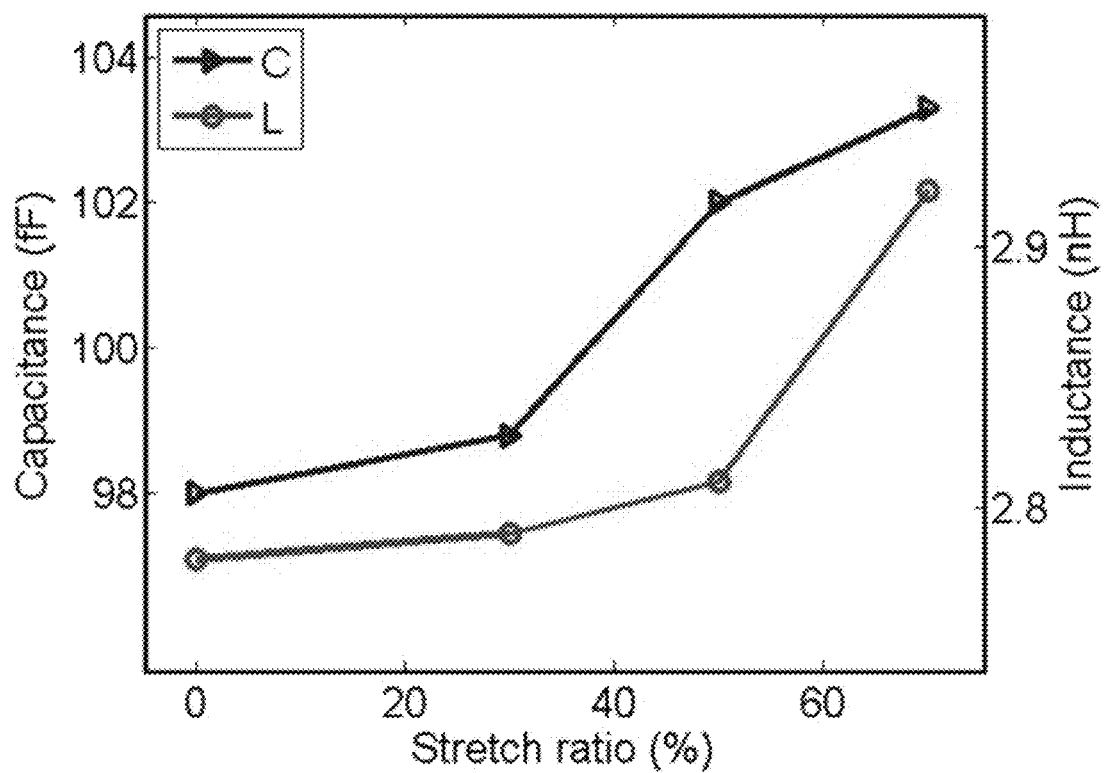
Figure 8D:
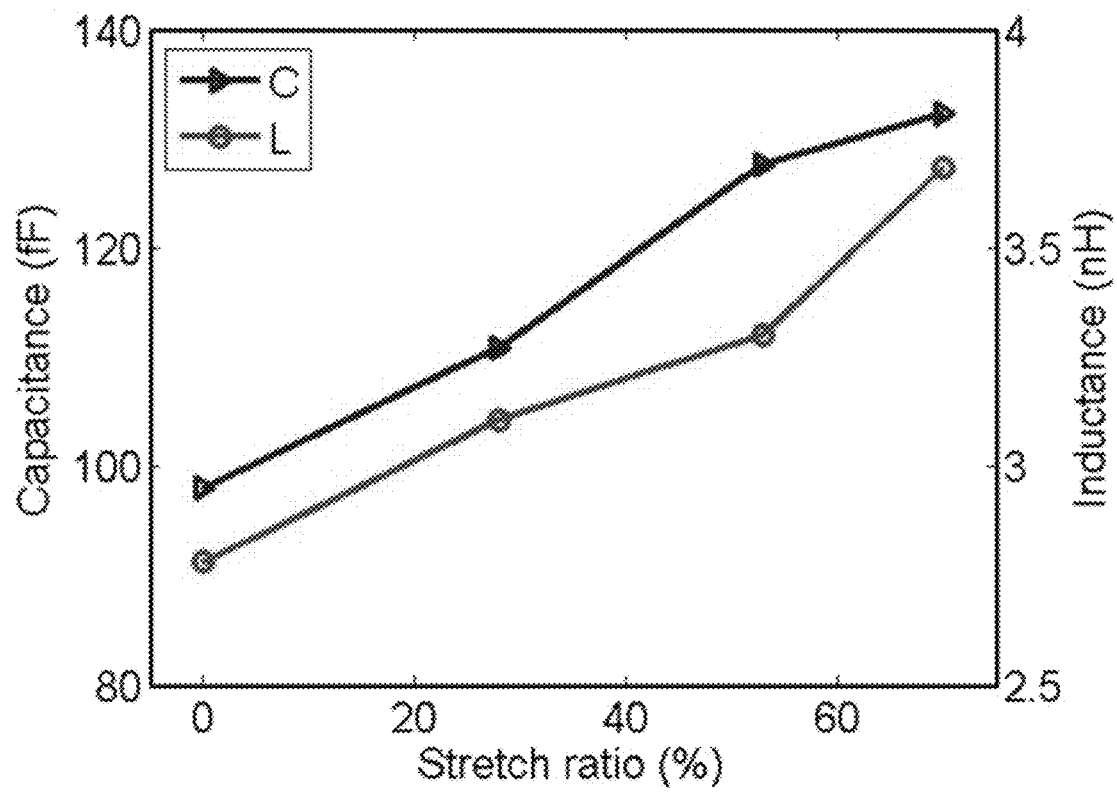

The simulation results (FIGS. 8(c) and 8(d)) show that as the unit cell was stretched perpendicular to (the first and the second configurations in FIGS. 4 and 5) or along (the third configuration in FIG. 6) the gap direction, the equivalent capacitance and inductance increased with increasing the stretch ratio. Since the mechanical stretching in any one of the configurations increased the perimeter of the SRR loop, it is obvious that the inductance would increase with stretching. As for the capacitance, in the first and the second configurations the stretching caused to decrease the distance between the two arms of the SRR, and also caused to increase the effective metal area that allowed holding more charges. Therefore, the equivalent capacitance of the SRR in these two configurations was increased as increasing the stretch ratio. In the third configuration, despite that the distance between the arms was increased, the stretching also increased the area of liquid metal in the arms region near the split. By further considering the fringing effect, the ability of the SRR to store charges was actually enhanced, thus increasing the equivalent capacitance as well. The simulation result also indicates that the perpendicular stretching (FIG. 8(d)) was more effective than the parallel stretching (FIG. 8(e)). This is because when the SRR was stretched in the perpendicular direction, the gap distance rapidly decreased to make the delta-gap source more effective.

The present meta-atom exhibited good repeatability in the resonance modulation, as demonstrated with 500 stretching response tests. For each test, the meta-atom was stretched to a same strain level outside the waveguide and then placed back into the waveguide for EM measurement. We note that further elongation of the SRR beyond 72% would move the resonance frequency to below the cutoff frequency of the waveguide used in this study. Nevertheless, even with the applied moderate stretch amplitude, this tunable meta-atom method provided a considerable frequency tuning range covering 71.75% (2.87 GHz divided by 4.0 GHz) of the whole X-band frequency range (8.0-12.0 GHz). Furthermore, by changing its overall size and geometric parameters of the SRR, the original resonance frequency of the SRR can be set to be at the upper limit of the X-band frequency range. By doing that, tuning in the whole X-band frequency range may be achieved with sufficient stretching. Our experiments showed that the present SRR could be stretched by more than twice (>200%) the original size in any directions, while keeping the embedded liquid metal structure continuous, flexible, and recoverable, without breaking of the encasing polymer layer or occurring of structural hysteresis.

V. CONCLUSION

A liquid metal SRR-based tunable meta-atom was demonstrated in the X-band frequency range. The meta-atom consisted of a liquid metal resonator encased by a flexible elastomer skin. By stretching the meta-atom, the resonance frequency of the meta-atom was tuned continuously over more than 70% of the whole X-band frequency range. The meta-atom in this study presents a simple but effective building block for realizing mechanically tunable metamaterials. Also, since the constituent materials of the present meta-atom are relatively ecofriendly, reusable, and durable, the metamaterials made of such meta-atoms potential will find many applications in wearable EM coatings and devices.

REFERENCES

1. D.-H. Kim, J.-H. Ahn, W. M. Choi, H.-S. Kim, T.-H. Kim, J. Song, Y. Y. Huang, Z. Liu, C. Lu, and J. A. Rogers, Science 320, 507 (2008).
2. D.-H. Kim, Z. Liu, Y.-S. Kim, J. Wu, J. Song, H.-S. Kim, Y. Huang, K.-c. Hwang, Y. Zhang, and J. A. Rogers, Small 5, 2841 (2009).
3. J.-H. Ahn, H.-S. Kim, K. J. Lee, S. Jeon, S. J. Kang, Y. Sun, R. G. Nuzzo, and J. A. Rogers, Science 314, 1754 (2006).
4. Y. Sun and J. A. Rogers, Adv. Mater. 19, 1897 (2007).
5. J. Yoon, S. Y. Hong, Y. Lim, S.-J. Lee, G. Zi, and J. S. Ha, Adv. Mater. 26, 6580 (2014).
6. M. Kubo, X. Li, C. Kim, M. Hashimoto, B. J. Wiley, D. Ham, and G. M. Whitesides, Adv. Mater. 22, 2749 (2010).
7. J.-H. So, J. Thelen, A. Qusba, G. J. Hayes, G. Lazzi, and M. D. Dickey, Adv. Funct. Mater. 19, 3632 (2009).
8. M. R. Khan, G. J. Hayes, J.-H. So, G. Lazzi, and M. D. Dickey, Appl. Phys. Lett. 99, 013501 (2011).
9. Y. Yang, G. Ruan, C. Xiang, G. Wang, and J. M. Tour, J. Am. Chem. Soc. 136, 6187 (2014).
10. A. C. Arias, S. E. Ready, R. Lujan, W. S. Wong, K. E. Paul, A. Salleo, M. L. Chabinyc, R. Apte, R. A. Street, Y. Wu, P. Liu, and B. Ong, Appl. Phys. Lett. 85, 3304 (2004).
11. K. Hong, S. H. Kim, K. H. Lee, and C. D. Frisbie, Adv. Mater. 25, 3413 (2013).
12. A. Pierre, M. Sadeghi, M. M. Payne, A. Facchetti, J. E. Anthony, and A. C. Arias, Adv. Mater. 26, 5722 (2014).
13. A. d. 1., F. Vornbrock, D. Sung, H. Kang, R. Kitsomboonloha, and V. Subramanian, Org. Electron. 11, 2037 (2010).
14. W. Wu, X. Wen, and Z. L. Wang, Science 340, 952 (2013).
15. H.-T. Chen, J. F. O'Hara, A. K. Azad, A. J. Taylor, R. D. Averitt, D. B. Shrekenhamer, and W. J. Padilla, Nat. Photonics 2, 295 (2008).
16. H.-T. Chen, W. J. Padilla, J. M. O. Zide, A. C. Gossard, A. J. Taylor, and R. D. Averitt, Nature 444, 597 (2006).
17. A. Jain, P. Tassin, T. Koschny, and C. M. Soukoulis, Phys. Rev. Lea. 112, 117403 (2014).
18. D. R. Smith, D. C. Vier, T. Koschny, and C. M. Soukoulis, Phys. Rev. E 71, 036617 (2005).
19. D. Schurig, J. J. Mock, B. J. Justice, S. A. Cummer, J. B. Pendry, A. F. Starr, and D. R. Smith, Science 314, 977 (2006).
20. D. Shin, Y. Urzhumov, Y. Jung, G. Kang, S. Baek, M. Choi, H. Park, K. Kim, and D. R. Smith, Nat. Commun. 3, 1213 (2012).
21. W. Cai, U. K. Chettiar, A. V. Kildishev, and V. M. Shalaev, Nat. Photonics 1, 224 (2007).
22. J. Hao, J. Wang, X. Liu, W. J. Padilla, L. Zhou, and M. Qiu, Appl. Phys. Lett. 96, 251104 (2010).
23. N. I. Landy, S. Sajuyigbe, J. J. Mock, D. R. Smith, and W. J. Padilla, Phys. Rev. Lett 100, 207402 (2008).
24. J. B. Pendry, D. Schurig, and D. R. Smith, Science 312, 1780 (2006).
25. I. M. Pryce, Y. A. Kelaita, K. Aydin, and H. A. Atwater, ACS Nano 5, 8167 (2011).
26. X. Zhang and Z. Liu, Nat. Mater. 7, 435 (2008).
27. Q. Zhou, Y. Shi, A. Wang, L. Li, D. Zhao, J. Liu, H. Sun, and C. Zhang, J. Opt. 13, 125102 (2011).
28. R. A. Shelby, D. R. Smith, and S. Schultz, Science 292, 77 (2001).
29. D. R. Smith, W. J. Padilla, D. C. Vier, S. C. Nemat-Nasser, and S. Schultz, Phys. Rev. Lett. 84, 4184 (2000).
30. A. A. Zharov, I. V. Shadrivov, and Y. S. Kivshar, Phys. Rev. Lett. 91, 37401 (2003).
31. N. Katsarakis, T. Koschny, M. Kafesaki, E. N. Economou, and C. M. Soukoulis, Appl. Phys. Left. 84, 2943 (2004).
32. K. Aydin and E. Ozbay, Appl. Phys. 101, 024911 (2007).
33. I. Gil, J. Bonache, J. Garcia-Garcia, and F. Martin, IEEE Trans. Microwave Theory Tech. 54, 2665 (2006).
34. D. Wang, L. Ran, H. Chen, M. Mu, J. A. Kong, and B.-I. Wu, Appl. Phys. Lett. 91, 164101 (2007).
35. J. Han, A. Lakhtakia, and C.-W. Qiu, Opt. Express. 16, 14390 (2008).
36. G. He, R.-x. Wu, Y. Poo, and P. Chen, J. Appl. Phys. 107, 093522 (2010).
37. Y. Poo, R.-x. Wu, G.-h. He, P. Chen, J. Xu, and R.-f Chen, Appl. Phys. Lett. 96, 161902 (2010).
38. R. Pratibha, K. Park, I. I. Smalyukh, and W. Park, Opt. Express 17, 19459 (2009).
39. D. H. Werner, D.-H. Kwon, and I.-C. Khoo, Opt. Express 15, 3342 (2007).
40. Q. Zhao, L. Kang, B. Du, B. Li, J. Zhou, H. Tang, X. Liang, and B. Zhang, Phys. Lett 90, 011112 (2007).
41. T. S. Kasirga, Y. N. Ertas, and M. Bayindir, Appl. Phys. Lett. 95, 214102 (2009).
42. F. Zhang, Q. Zhao, L. Kang, D. P. Gaillot, X. Zhao, J. Zhou, and D. Lippens, Appl. Phys. Lett 92, 193104 (2008).
43. Y. H. Fu, A. Q. Liu, W. M. Zhu, X. M. Zhang, D. P. Tsai, J. B. Zhang, T. Mei, J. F. Tao, H. C. Guo, X. H. Zhang, J. H. Teng, N. I. Zheludev, G. Q. Lo, and D. L. Kwong, Adv. Funct. Mater. 21, 3589 (2011).
44. M. Lapine, D. Powell, M. Gorkunov, I. Shadrivov, R. Marques, and Y. Kivshar, Appl. Phys. Lett. 95, 084105 (2009). 014504-7 Liu et al. J. Appl. Phys. 118, 014504 (2015)
45. M. Lapine, I. V. Shadrivov, D. A. Powell, and Y. S. Kivshar, Nat. Mater. 11, 30 (2012).
46. W. M. Zhu, A. Q. Liu, X. M. Zhang, D. P. Tsai, T. Bourouina, J. H. Teng, X. H. Zhang, H. C. Guo, H. Tanoto, T. Mei, G. Q. Lo, and D. L. Kwong, Adv. Mater. 23, 1792 (2011).
47. D. Bouyge, A. Crunteanu, M. Duran-Sindreu, A. Pothier, P. Blondy, J. Bonache, J. C. Orlianges, and F. Martin, J. Opt. 14, 114001 (2012).
48. H. Tao, A. C. Strikwerda, K. Fan, W. J. Padilla, X. Zhang, and R. D. Averitt, J. infrared, Millimeter, Terahertz Waves 32, 580 (2011).
49. W. M. Zhu, W. Zhang, R. F. Huang, S. K. Ting, G. Q. Lo, D. L. Kwong, and A. Q. Liu, in Proceedings of IEEE MEMS, Taipei, Taiwan (2013), p. 725.
50. See supplementary material at http://dx.doi.org/10.1063/1.4926417 for the measured reflectance and transmittance spectra of the meta-atom and the equations used to build an equivalent circuit of the meta-atom.

Figure 9A:

As will be appreciated by those of skill in this technological area, the foregoing demonstrates that a fabricated single or multilayer metamaterial, each layer (including an array of meta atoms of pre-determined shape/type and liquid conductor), as well as type and thickness of encasing elastomer), can be applied essentially as a meta skin or meta covering in a number of ways. FIG. 9A illustrates a meta fabric wearable by a person. It could be created by known clothing assembly techniques (e.g. pattern cutting or pieces and then combining the pieces into a completed wearable item such as by adhering, sonic or thermal welding, or stitching). In the example of FIG. 9A, the clothing item is a full body suit such that it might be used for cloaking purposes.

Figure 9B:
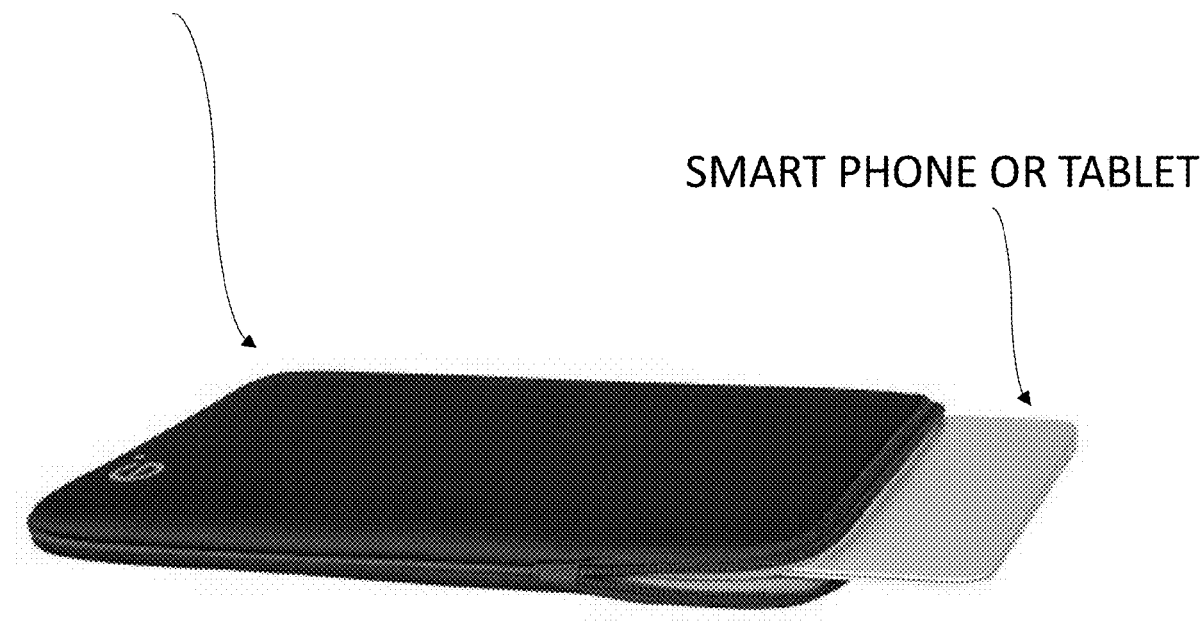

FIG. 9B illustrates another non-limiting example. Meta-material per aspects of the invention is configured as a covering material over a mobile phone such as a smart phone. It can protect the device from energy electromagnetic energy. Here it is shown as a sleeve that can be pulled over the phone and cover at least the front and back sides. It might be a full cover, including the opposite thin ends. It can be made to be transparent or substantially transparent to allow the user to see the phone screen and to manipulate the user interface whether touch screen or manual buttons.

Figure 10:
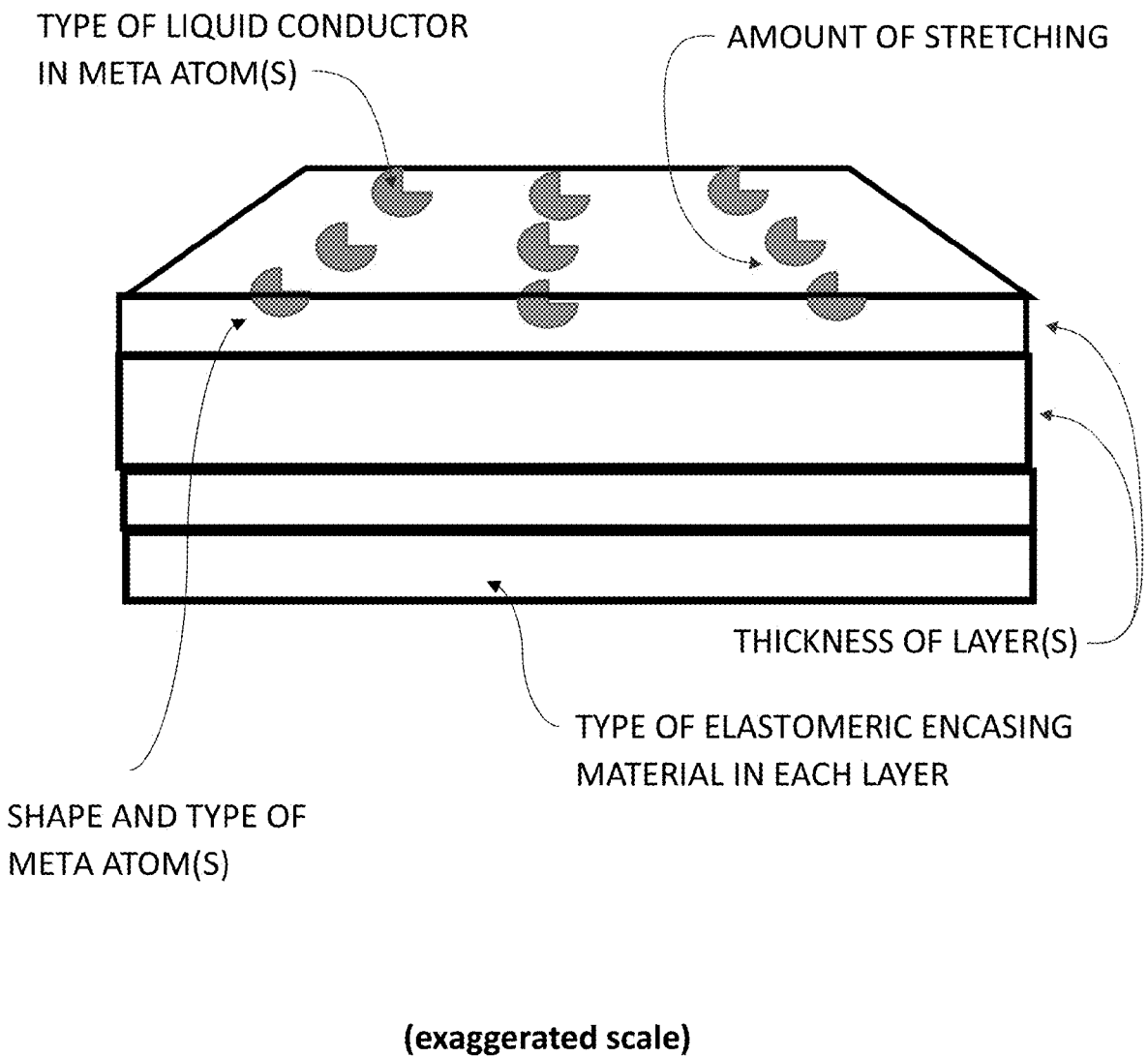

FIG. 10 illustrates how aspects of the invention allow considerable flexibility for the designer. Both physical and electromagnetic characteristics of the metamaterial can be varied by any one or combination of two or more of:

(1) Selection of type and shape of meta atom. They may be all the same in all layers, the same in one or more layers but other layers having all of a different type or shape, or even different in any layer.

(2) Selection of type of encasing material. It can be any of a variety of elastomers with selectable characteristics of elasticity. If plural layers, all can be the same material. But different layers can be different materials or with different characteristics.

(3) Type of liquid conductor. Similarly, all meta atoms of all layers might have the same liquid conductor with the same or similar characteristics. But different layers might have different liquid conductors. And even different meta atoms in the same layer might have different liquid conductors.

(4) Thickness of layer. Varying the thickness of the elastomeric layer can affect at least some characteristics of the final metamaterial. This can be selected for a single layer metamaterial. Multilayer metamaterial may have all layers the same thickness. Or there may be variations between at least two layers.

(5) Amount and direction of stretching. As indicated above, characteristics of the metamaterial can be varied in such ways.

It will be appreciated that by selection and engineering of one or more of these, the characteristics of the metamaterial for a given application can be designed according to need or desire.

B. Meta-Material Skin

The following exemplary embodiment of the invention describes a wearable, flexible skin made of meta-material that can include the type of meta-atoms described earlier. The below description is also found at Yang, et al. From Flexible and Stretchable Meta-Atom to Metamaterial: A Wearable Microwave Meta-Skin with Tunable Frequency Selective and Cloaking Effects, Scientific Reports 6:21921 (2016) (8 pages), which is incorporated in its entirety by reference herein (hereafter "Yang 2016").

The meta-skin uses one or more layers or laminations of arrays of meta-atoms encased on elastomeric material. The meta-skin can thus be stretched, wrapped, conformed or adhered, or otherwise mounted to, surfaces, shapes, objects, etc. of different form factors.

As further explained, using liquid conductor (e.g. liquid metal or alloy) injected into the elastomer to form the resonator of each meta-atom, allows stretching, bending, shaping, etc. of the meta-skin while retaining the basic resonator fundamental shape intact. However, the stretching does change the size and shape of the voids in the elastomer holding the liquid metal. This alters the size and relationship of portions of the liquid metal relative to each other. Because a change in such parameters changes how the liquid metal relates to incident electromagnetic (EM) radiation, this allows tuning by stretching. The elasticity and liquid conductor also reversibility and repeated reconfiguration of the meta-skin (e.g. to different strain ratios, to different shapes, etc.) without failure of the resonators.

From Flexible and Stretchable Meta-Atom to Metamaterial: A Wearable Microwave Meta-Skin with Tunable Frequency Selective and Cloaking Effects This paper reports a flexible and stretchable metamaterial-based "skin" or meta-skin with tunable frequency selective and cloaking effects in microwave frequency regime. The meta-skin is composed of an array of liquid metallic split ring resonators (SRRs) embedded in a stretchable elastomer. When stretched, the meta-skin performs as a tunable frequency selective surface with a wide resonance frequency tuning range. When wrapped around a curved dielectric material, the meta-skin functions as a flexible "cloaking" surface to significantly suppress scattering from the surface of the dielectric material along different directions. We studied frequency responses of multilayer meta-skins to stretching in a planar direction and to changing the spacing between neighboring layers in vertical direction. We also investigated scattering suppression effect of the meta-skin coated on a finite-length dielectric rod in free space. This meta-skin technology will benefit many electromagnetic applications, such as frequency tuning, shielding, and scattering suppression.

Metamaterials have attracted considerable attention due to their inaccessible electromagnetic (EM) properties that can be hardly found in natural materials. The unique properties of negative permittivity, negative refractive index, and index close to zero[1-12], allow metamaterials to be employed in many emerging applications such as sub-wavelength resolution imaging[13,14], filtering[15], and cloaking[16-19]. Compared to conventional microwave filters, metamaterial-based counterparts have demonstrated the potential to obtain compact sub-wavelength size and left-handed behaviors. By manipulating EM waves with metamaterials, invisibility cloaks capable of suppressing the wave scattering and/or guiding the waves around the hidden object in the microwave, terahertz and optical regimes have been theoretically and experimentally realized[16-28]. Different kinds of sub-wavelength resonators have been researched to achieve selective frequency responses. Among them, split ring resonator (SRR) is a widely proposed magnetic resonant structure[29,30]. While numerous research efforts have been made to push the operating wavelength of the SRR-based filters from the microwave to the visible region, the significance of the microwave filters would be tremendously increased if their response characteristics can be dynamically tuned. Therefore, a variety of frequency tuning mechanisms have been reported. Methods include changing unit cell's effective parameter by varying conductance or inductance[31-33], configuring constituent material by using phase changeable material as the constituent material[34-36], and altering geometry through distorting the structure or tilting the conducting elements[37-39].

Recently, inclusion of liquid metal as active components has opened up new ways to realize stretchable and flexible electronics. By injecting liquid metal into a template, the metal can take on a specific shape to form stretchable electronic devices, such as electrical interconnectors[40], electrical probes[41], antennas[42-44], microelectrodes in microfluidic devices[45], switchable metamaterial microfluidic platforms[34], and artificial skin sensors[46]. We previously developed a stretchable single meta-atom in microwave regime, where eutectic gallium-indium (EGaIn: 75.5% gallium and 24.5% indium), a liquid metal at room temperature, was patterned as the SRR structure and embedded inside a stretchable silicone elastomer[39]. As the shape of the liquid SRR was changed via mechanical stretching, the split gap capacitance and the inductance of the resonator were adjusted[39]. While the basic principle of the single stretchable meta-atom was studied in our previous work[39], it is worthy to note that fabrication, characterization, and application development of flexible and stretchable metamaterials, i.e., arrays of such meta-atoms, have not been achieved. Particularly, it may be difficult in practice to use a single meta-atom to demonstrate applications, such as frequency tunable surface and invisibility cloaking. Therefore, research on the extension from a single meta-atom to metamaterials is critically important. Also, development of metamaterials is relatively application-specific, requiring not only a thorough understanding of the operation of single meta-atoms, but also custom requirements in design, characterization, and quantification. For example, our previously reported single meta-atom was studied in a waveguide setting and behaved as an element in a 2D quasi-periodic system due to the reflective mirror effect of the waveguide walls[39]. However, free space environment is often required to study metamaterials with some practical constraints, such as number of meta-atoms, and layers of metamaterials. Furthermore, the resonance tuning of the reported single meta-atom was realized by shaping the embedded SRR unit in the plane of the host elastomer[39]. However, the effects of integrating multiple layers of metamaterials and changing the spacing between neighboring layers in the direction perpendicular to the surface of the host elastomer are also worthy to be investigated. Furthermore, besides the frequency selection, the extension from a single compliant meta-atom to metamaterials will allow us to study the possible cloaking effect of the flexible metamaterial wrapping on a curved dielectric surface.

In this paper we report a flexible and stretchable microwave meta-skin and its frequency selective and cloaking effects. The meta-skin consists of an array of liquid metal SRR meta-atoms encased inside an elastomer. We demonstrate that by stretching multiple layers of the meta-skins along their surfaces in a planar direction and by changing the spacing between the meta-skin layers in a vertical direction, the meta-skins can perform as a high performance tunable frequency selective surface with a broad tuning range. Furthermore, the meta-skin is able to wrap an interaction object with any arbitrary shapes. We demonstrate that by wrapping it on a dielectric cylindrical rod, a significant scattering suppression or "cloaking" effect is observed. The scattered field from the dielectric rod at different angles is suppressed in a designed frequency region. Therefore, this meta-skin technology is different from traditional stealth technologies that often only reduce the backscattering, i.e., the power reflected back to a probing radar[47]. The present research work tends to fill the gap from the single stretchable meta-atom to the large scale metamaterials by investigating the possibility of realizing resonance tuning of the planar metamaterials and cloaking effect of the curved metamaterials.

Design and Fabrication

Figure 11A:
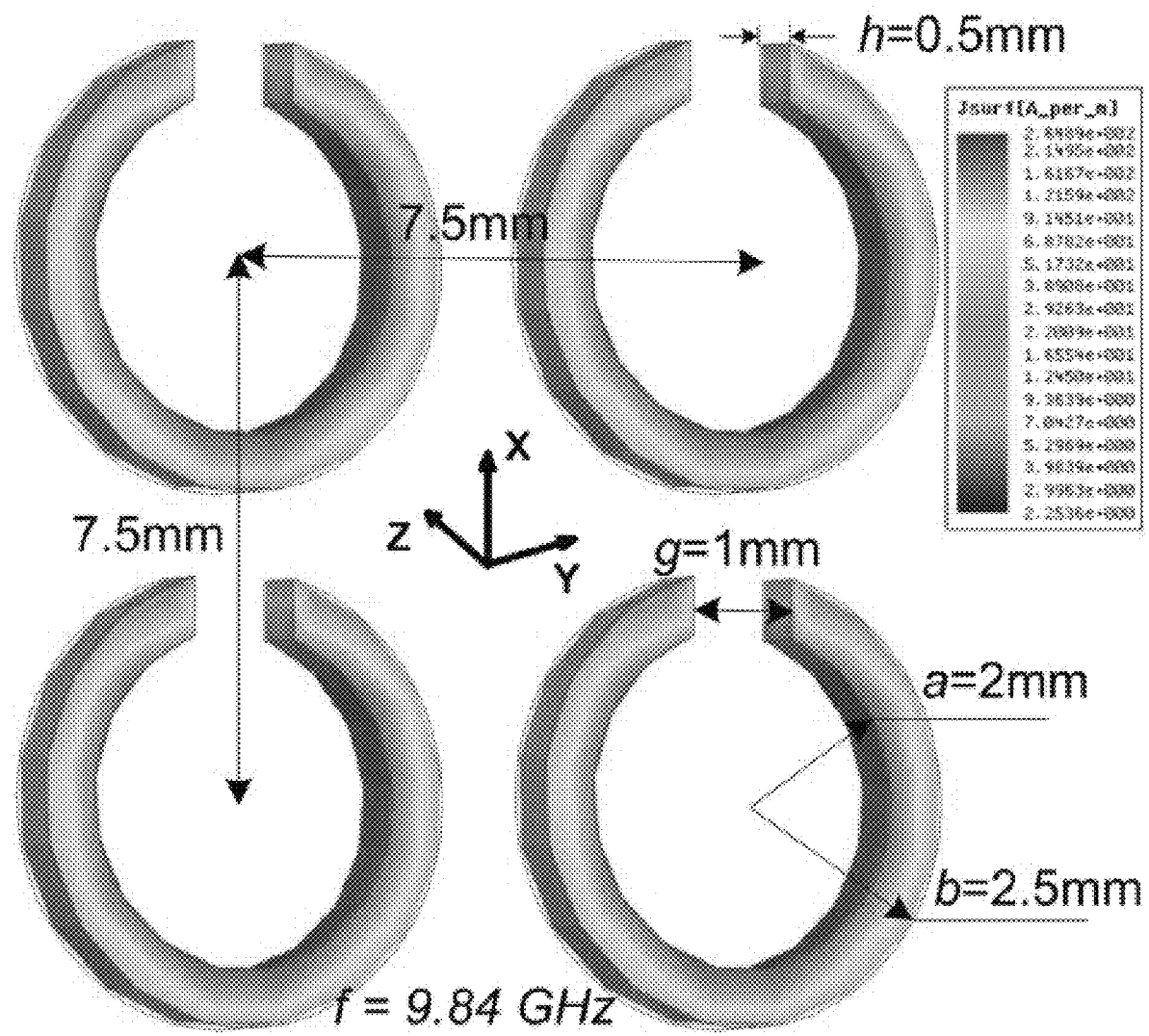
Figure 11B:
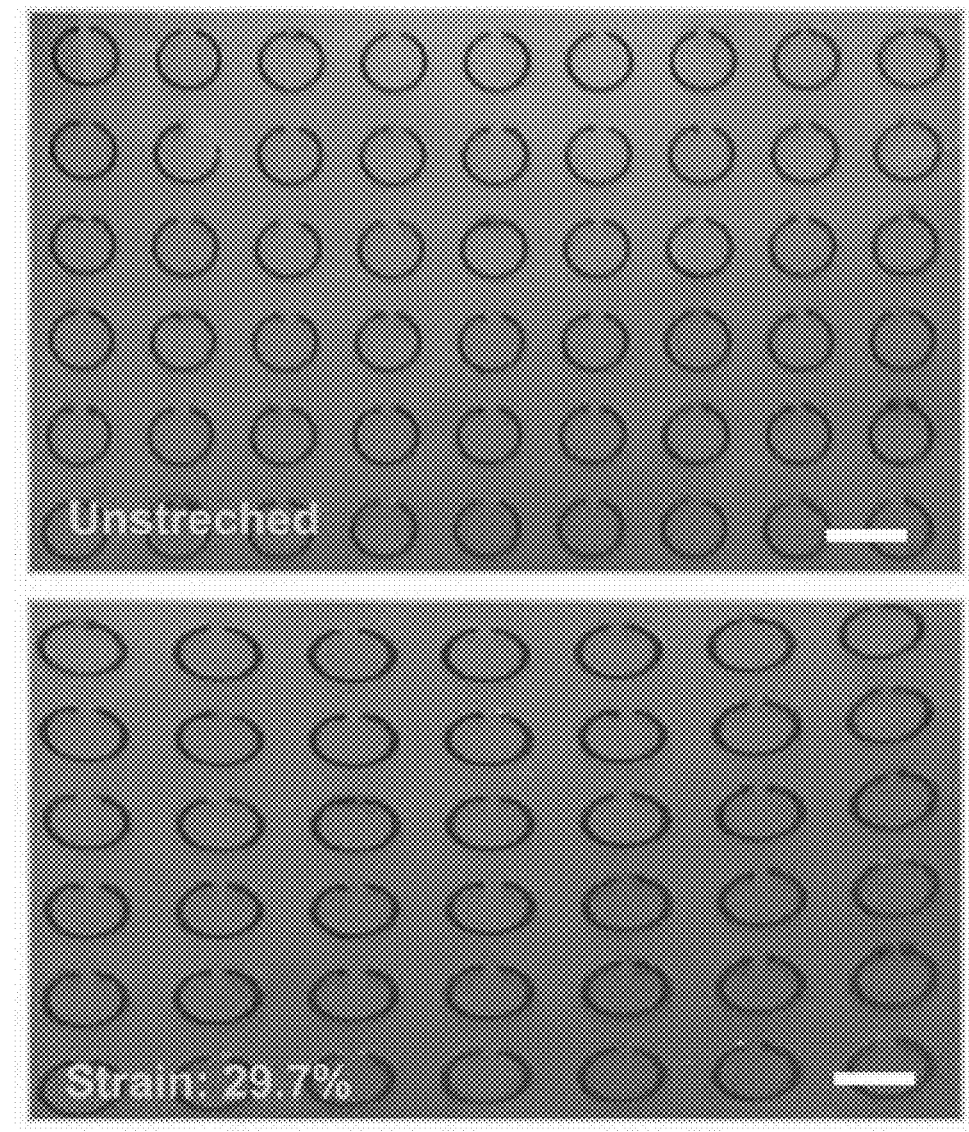

FIG. 11a shows the structure of the proposed SRR array operated in X-Band regime. The device has the inner radius of a=2.0 mm, the outer radius of b=2.5 mm, the thickness of h=0.5 mm, the gap of g=1.0 mm, and the lattice constant of p=7.5 mm. The SRR array is made of EGaIn and encased by a silicone elastomer (Ecoflex).

FIG. 11 shows (a) Geometry and simulated surface current distribution of the meta-skin. (b) Photos of the unstretched and stretched meta-skin. Scale bars represent 5 mm. (c) A photo of a 30.48 cm long, 3.175 cm diameter dielectric nylon rod wrapped by the meta-skin. (d) Flexibility demonstration with a glass flask wearing the meta-skin.

The thickness of the Ecoflex is d=1.45 mm. We conducted EM simulations to estimate a resonance frequency of the array using Ansys High Frequency Structure Simulator (HFSS) software. As shown in FIG. 11a, the SRR array is fixed in the x-y plane, and the magnetic field (H) is parallel to the z direction and penetrates through the SRRs, thus exciting a magnetic resonance. With the aforementioned geometrical parameters, the simulated resonance frequency for the SRR array is 9.84 GHz. The surface current distribution at the resonance frequency is shown in FIG. 11a. By stretching the meta-skins (FIG. 11b), the lattice constant, the shape of the SRRs, and the mutual interaction between the resonators will be modulated. Accordingly, the resonance frequency of the meta-skins will be shifted.

We manufactured the proposed meta-skin with 225 identical SRR meta-atoms arranged in 15 columns and 15 rows. FIG. 12 shows the fabrication process flow. First, an aluminum master mold with the area of 14 cm×14 cm was manufactured by using a high precision CNC milling machine. Subsequently, an Ecoflex layer L1 with the thickness of 800 μm was cast upon the master mold and then was fully cured on a hotplate at 60° C. for 30 mins. Simultaneously, another Ecoflex layer L2 was spin-coated on a 3 mm-thick poly(methyl methacrylate) or PMMA plate pretreated with a silane coupling agent. The spin-coated L2 was only partially cured at 50° C. for 1 min. After that, L1 was peeled off from the master mold and then was adhered to L2, followed by baking on the hotplate at 150° C. for 1 min. Thus, the SRR-shaped channels were formed in the elastomer. To inject liquid metal into the channels, an inlet and an outlet were mechanically punched at the two ends of each channel. After the liquid metal was manually injected into the channels by using a syringe (10 mL, Becton-Dickinson) with a needle (20 Gauge), the liquid metal residues were cleaned by a cotton swab dipped with a solution of hydrochloric acid (50%, v/v). Lastly, the whole device was immersed in a prepolymer solution of Ecoflex and then was fully cured at 80° C. for 30 mins. The total thickness of the Ecoflex elastomer was 1.45 mm. The SRRs were located in nearly half the thickness of the elastomer.

Results and Discussion

EM measurements were conducted in free space. Six of the meta-skins were stacked with the initial spacing d=3 mm between neighboring meta-skins. A programmable vector network analyzer (VNA, Agilent E8364) was used to measure spectral responses of the sample. To generate a quasi-plane wave illumination, the meta-skins were placed between two horn antennas (one as a transmitter and the other as a receiver) within the far field regions. As the meta-skins were located in the electric field E-plane of the antenna, the magnetic field H could be coupled to the magnetic resonance from the current loop in the SRR (see inset of FIG. 13).

Due to the stretchable feature of the meta-skin, the dimensions of the SRRs can be altered through stretching along different directions. Our previous research showed that the stretch-induced dimensional changes of the SRR can influence the equivalent inductance and capacitance of the SRR, thus shifting its resonance frequency[39]. In the present work, as the multilayers of the meta-skins were stretched along the wave propagation (k) direction with the stretch ratio of 0%, 15.9%, 29.7%, 36.4%, and 50%, the resonances of the meta-skins were observed at 9.84 GHz, 9.76 GHz, 9.47 GHz, 9.27 GHz, and 9.15 GHz, respectively. The measurement results are shown in FIG. 13 with dashed lines. To verify the measured results, an HFSS-based full wave EM simulation was carried out by applying the periodic boundary condition on the SRR units. The simulation results with different stretch ratios are shown in FIG. 13 with solid lines. The simulated and experimental results achieved a good agreement in the trend of shifting resonance frequency. The minor difference in the resonance frequency and bandwidth may be attributed to the accuracy of the model.

FIG. 13 illustrates simulated and experimental transmittance spectra of the tunable 6-layer meta-skins with different stretch ratios of 0%, 15.9%, 29.7%, 36.4%, and 50%. In this experiment, the spacing between the neighboring layers is d=3 mm. Inset shows a schematic for the setup.

By changing the spacing d between two neighboring layers, the resonance of the 6-layer meta-skins could also be tuned. Here, the spacing was defined by inserting foams (relative permittivity close to one). FIG. 14a, b show the spectral responses of the meta-skins to different stretching levels for the spacing of $d_1$=13 mm and $d_2$=17 mm, respectively.

FIG. 14 shows experimental transmittance spectra of the tunable 6-layer meta-skins with different stretch ratios of 0%, 15.9%, 29.7%, 36.4%, and 50% for two different spacing between neighboring layers: $d_1$=13 mm (a) and $d_2$=17 mm (b).

As the meta-skins moved farther away from each other, the mutual inductance between the resonators in the neighboring layers reduced[48]. Consequently, an increase in resonance frequency of the meta-skins is expected. Indeed, for the unstretched sample, the resonance frequency was shifted from 9.84 GHz to 11.9 GHz as the vertical spacing increased from 3 mm to 13 mm. As we further increased d to 17 mm, the resonance frequency was shifted to 12.4 GHz. Similarly, by stretching the multilayer metal-skins along their surfaces in the horizontal direction, the resonance frequency was also observed to move towards lower frequencies. Therefore, by varying the spacing between the meta-skins in the vertical direction and stretching the metal-skins in a planar direction, the resonance frequency tuning range of the meta-skins can be largely broadened.

Figure 11C:
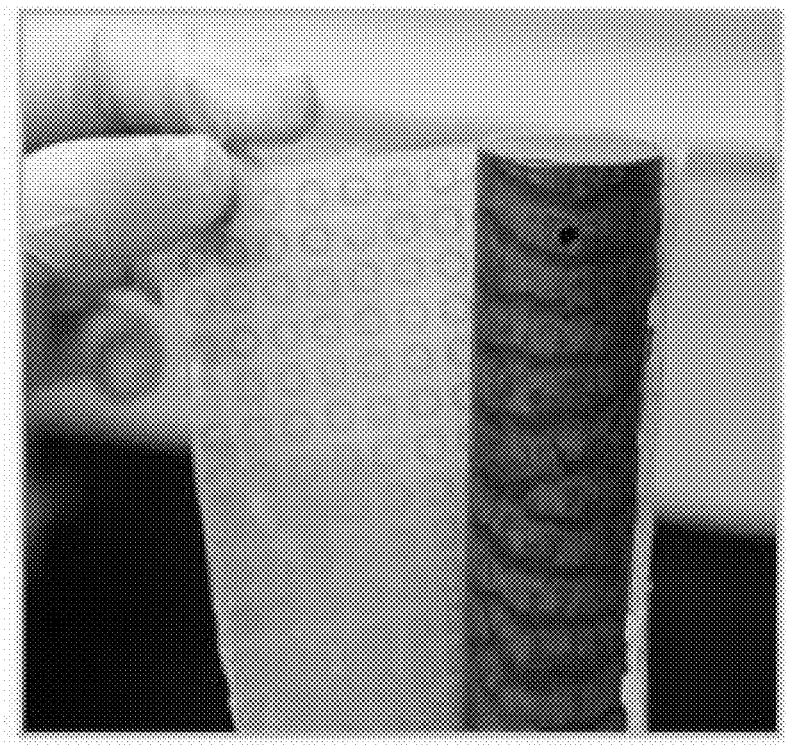
Figure 11D:
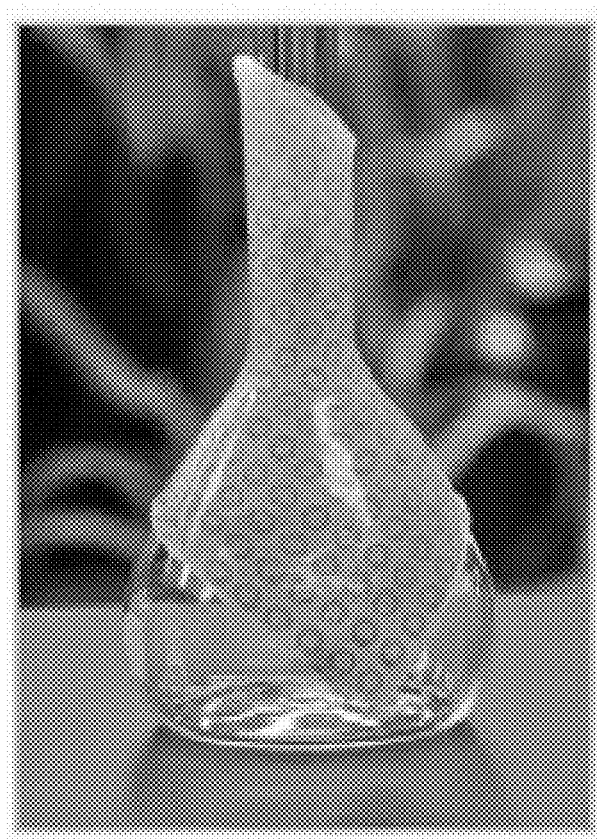

The fully flexible nature of the meta-skin makes it possible to wrap on an interaction object with any arbitrary shapes (FIG. 11d). Here, we used a single layer of meta-skin to wrap on a 30.48 cm long, 3.175 cm diameter dielectric nylon rod (dielectric constant: $\varepsilon_r$=3.8; FIG. 11c). We investigated how this wrapping material could influence the scattered field from the rod. The far-field measurement was thus conducted to measure scattering strength from a bare nylon rod, a nylon rod wrapped by a pure Ecoflex sheet, and a nylon rod wrapped by the meta-skin. In the measurement setup (FIG. 15), the sample hangs from a cotton thread at a designated origin to minimize unwanted scattering signals from the support constructs.

FIG. 15 is an experimental setup for measuring scattering from the meta-skin wrapped nylon rod (inset).

The two horn antennas were placed at an equal distance of L=80 cm from the sample. This ensured that the object was in the far-field region (according to the far-field condition $2D^2/\lambda$, where D=9.8 cm is the diagonal of the horn antenna and $\lambda$=3 cm is estimated from the center operating frequency). The transmitter antenna was fixed during the measurement, while the receiver antenna was moved around the sample to receive scattering signals from different angles θ with respect to the transmitter. The two horn antennas were inset into the EM absorbing material to minimize the scattering background. The aforementioned VNA was used to measure scattering parameters between the two antennas. The objective azimuthal bistatic measurements were conducted to obtain the s-parameter for further data processing. The method of deriving the scattered field from the dielectric sample is described in the Method section.

The post-processed scattering gains for the meta-skin covered, the polymer covered, and the uncovered rods are presented in FIG. 16a-e.

FIG. 16 shows measured scattering gain for the bare dielectric rod (green—uncovered), the rod wrapped with the Ecoflex polymer (red—polymer), and the rod wrapped with the metal-skin (blue—meta-skin) at the angles of θ=37.5° (a), 45° (b), 60° (c), 90° (d), and 105° (e). The average scattering gain over the different angles is given in (f).

Figure 16A:
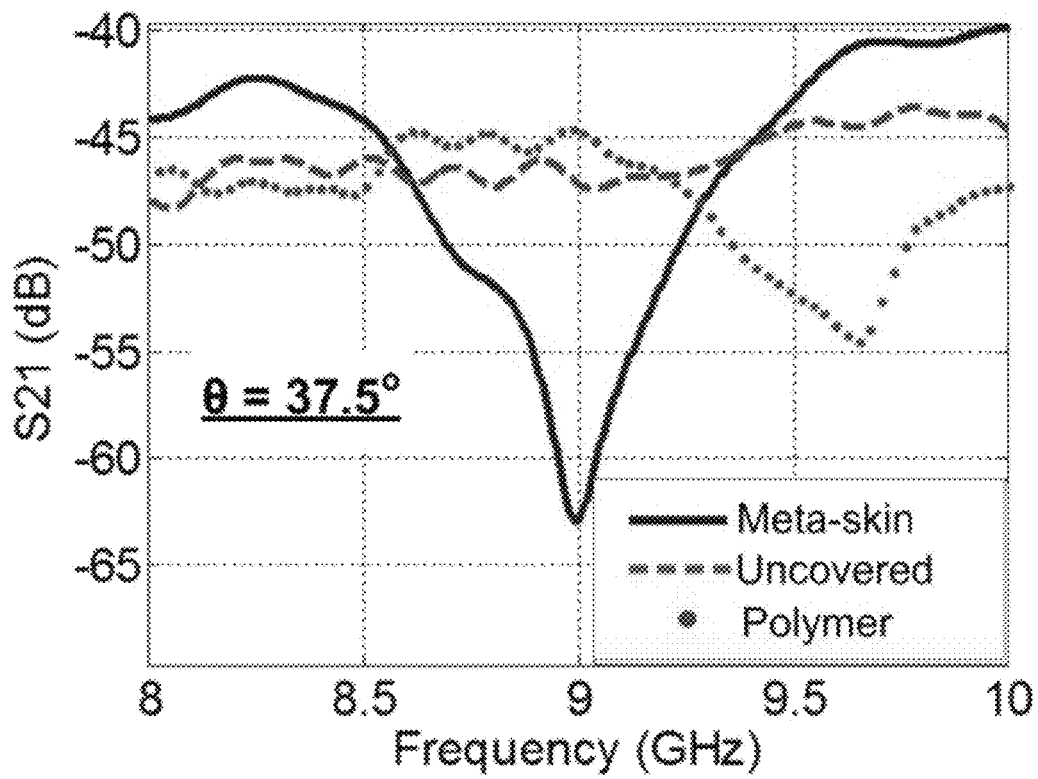
Figure 16B:
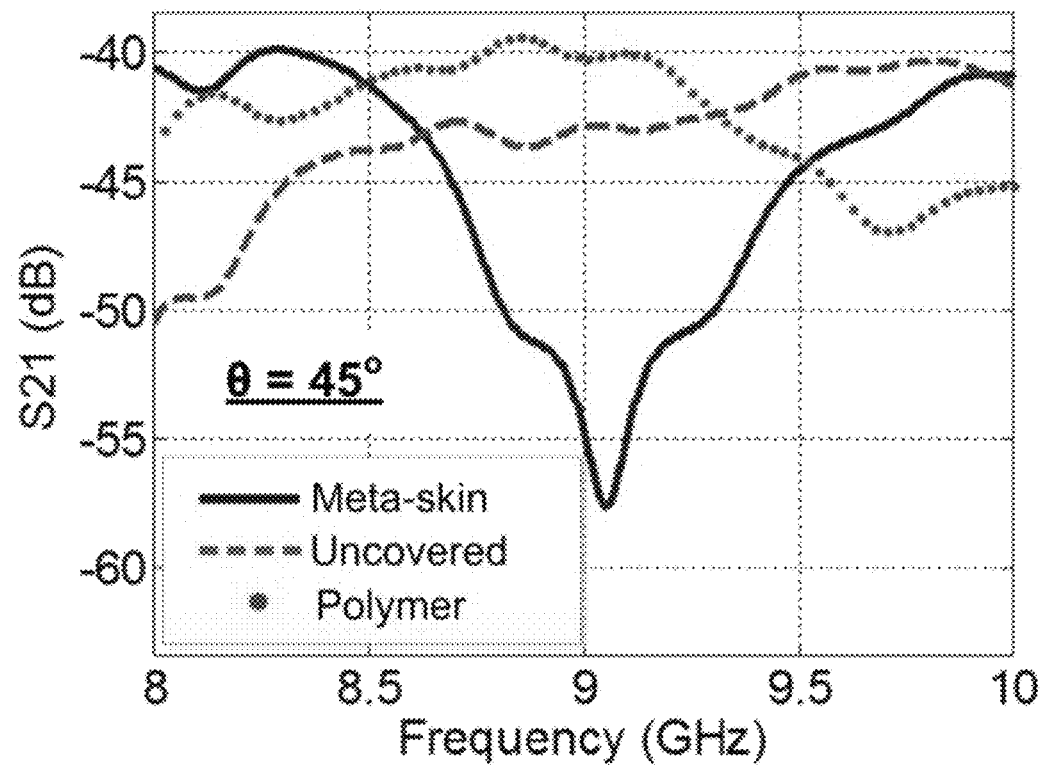
Figure 16C:
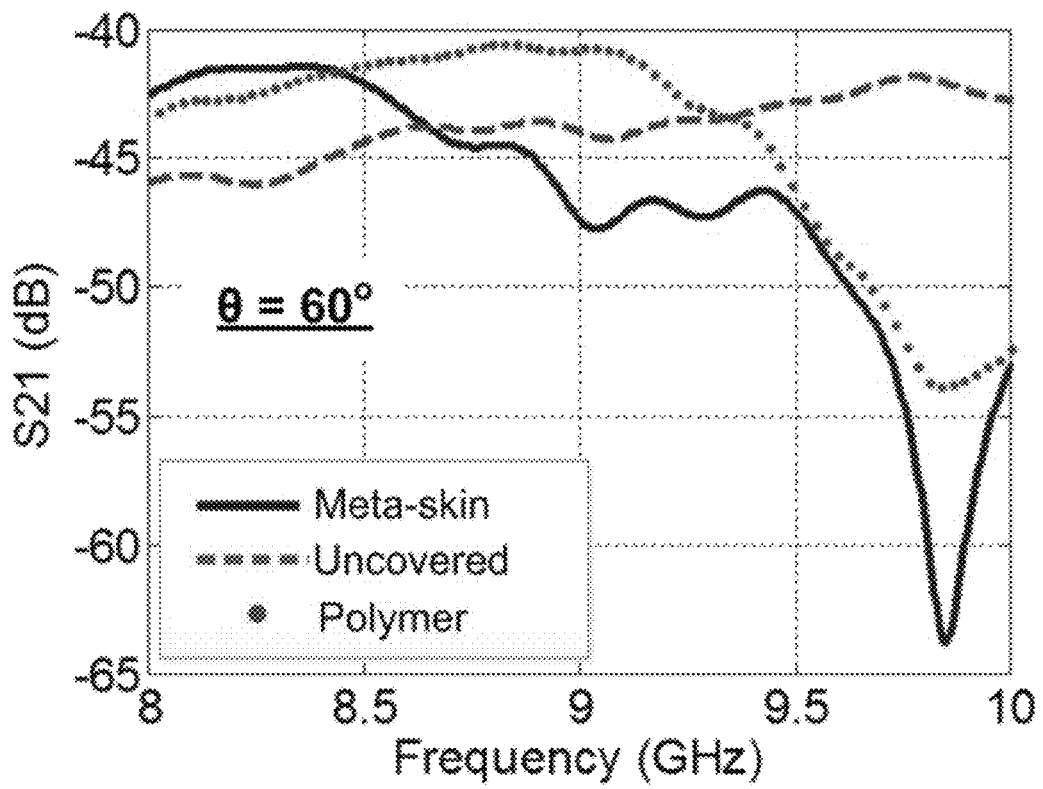
Figure 16D:
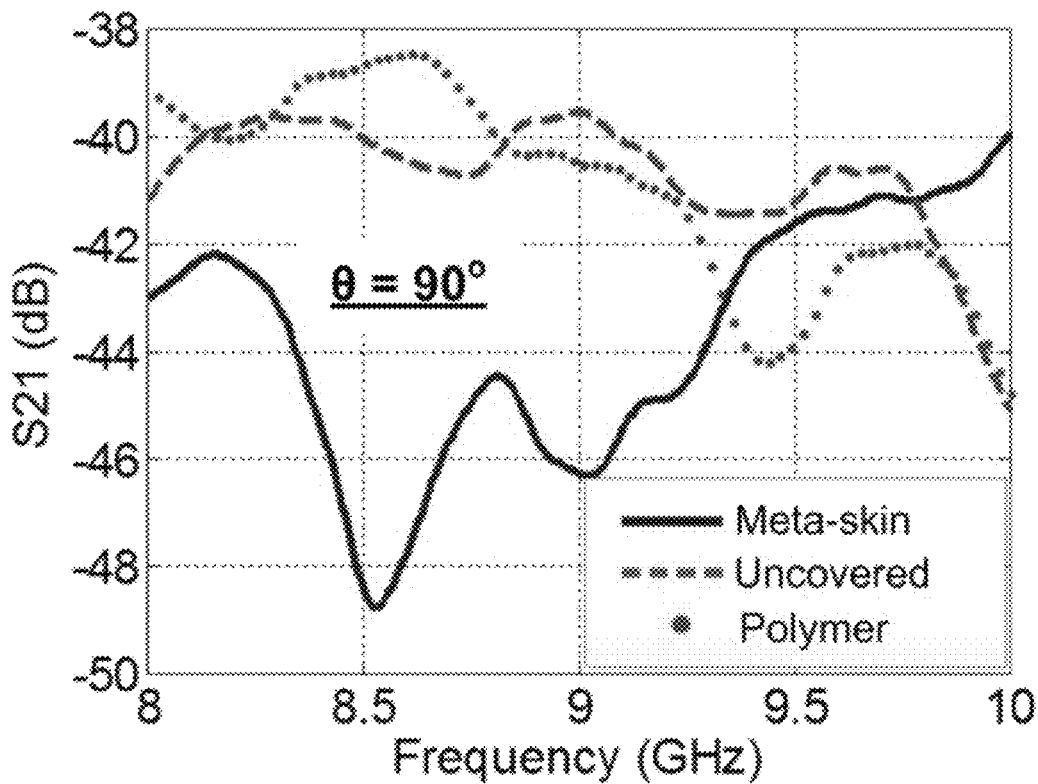
Figure 16E:
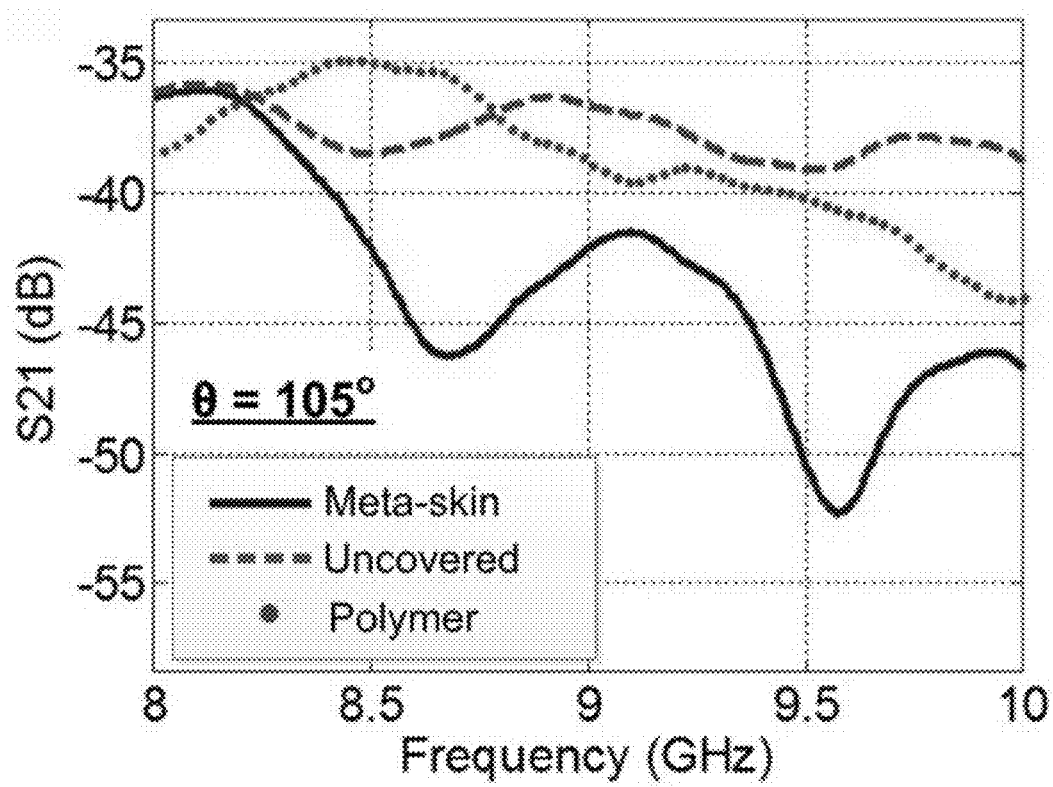
Figure 16F:
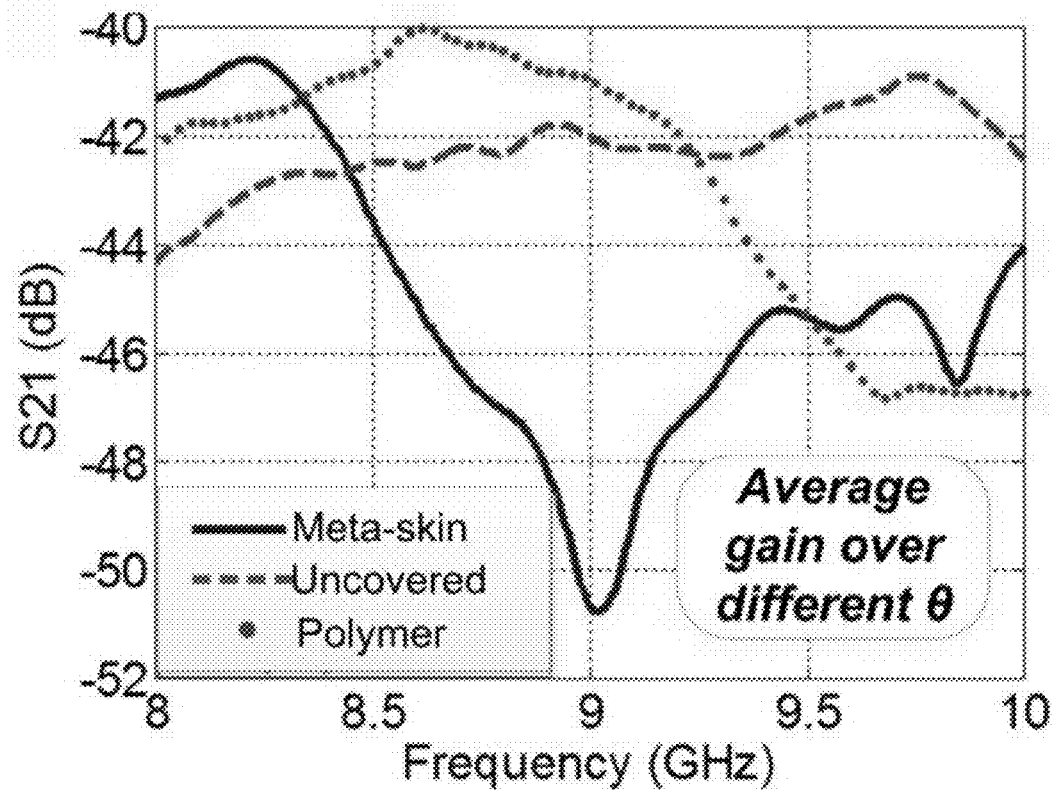

The results show that the scattering gain from the meta-skin covered rod was significantly reduced in the frequency band from 8 GHz-10 GHz at five different measurement angles θ=37.5°, 45°, 60°, 90°, and 105°. Specifically, compared with the uncovered case, at θ=37.5° the meta-skin was able to suppress the scattering gain in over 33% of frequency band between 8-10 GHz. At other angles, the suppression effect of the meta-skin is more significant and the scattering grain was suppressed in over 70% of the same frequency range. The largest suppression of 20 dB was found at around 9 GHz at 37.5°. The overall scattering suppression effect of the meta-skin is illustrated by averaging the scattering gain with different angles (FIG. 16f). It is observed that the meta-skin was able to suppress the scattering gain by about 75% in the band of 8-10 GHz. The scattering suppression is mainly attributed to the cloaking effect of the embedded SRRs around the designed frequency, where the destructive interference between the resonance of the SRRs and the scattering from the dielectric rod occurred. We also noted that the scattering gain spectra of the meta-skin wrap in FIG. 16 do not have exactly the same resonance frequency as the transmittance spectra of the multilayer meta-skins in the unstretched state in FIG. 13. The factors below may be attributed to this observation: first, the scattering suppression gain was measured at different angles, which actually is angle-dependent due to different phases of multiple reflections and interactions over the interfaces; second, only one layer of the meta-skin was coated on the surface of the nylon rod with the dielectric constant of 3.8, while multiple layers of the meta-skins were used in the frequency selective surface application and spaced by foam with the dielectric constant of close to one.

The whole meta-skin remained fully functional without fatigue or cracking after repeated measurements. This is because the liquid metal SRRs can flow and reshape responding to applied strains. Besides the single circular SRR, many other magnetic resonance structures may be used in the meta-skin setting to realize frequency selection and scattering suppression[49]. Furthermore, in addition to the magnetic resonators, liquid metal-based electric resonant structures, such as wires, can be integrated into the same elastomer. This will make it possible to achieve negative index for cloaking applications. Moreover, other different stretchable and flexible dielectric host media could be used to embed these liquid metal-based resonant structures. This will provide us with more flexibility to control loss tangent of the meta-skin. In the microwave frequency regime, the dielectric losses are dominant and different substrate dielectric materials can affect the loss tangent. For higher frequencies, such as terahertz, as the ohmic losses become significant, other types of liquid metal or conducting materials are required to form the resonating units.

CONCLUSIONS

A stretchable and wearable microwave meta-skin was developed by embedding an array of liquid metal SRRs into a highly stretchable elastomer. We demonstrated the strong ability of the meta-skin to tune the resonance of the frequency selective surface and to suppress the scattering from the curved surface of a dielectric material along different directions. By combining the planar stretching and the vertical spacing, the resonance frequency of the multilayer meta-skins was tuned from 9.15-12.38 GHz. By wrapping a finite-length dielectric rod with the meta-skin, the scattering from the surface of the rod was suppressed by about 75% in 8-10 GHz. It is believed that the present meta-skin technology will find many applications in EM frequency tuning, shielding, and scattering suppression.

Methods of deriving scattered field from dielectric sample. The scattered field was obtained by subtracting the incidence field (S21_i) from the total field (S21_t). This operation can not only derive the field scattered from the sample, but minimize clutters from background in the experiment. Two consecutive measurements were conducted. First, the sample was placed in the designated position and S21_t was measured. Then, the sample was removed and S21_i was recorded. The original scattering parameter for the scattered field can be expressed as S21_o (S($\omega$))=S21_t-S21_i. It should be noted that because the real testing environment was complicated, the S($\omega$) derived from subtracting the incidence field from the total field may not entirely remove the clutter component from the objective signal. As shown in FIG. 17a, the spectral response of S($\omega$) (solid blue line) contains complex stray signal.

FIG. 17 illustrates (a) Raw and processed scattering gain for the meta-skin coated nylon rod at the angle of $\theta$=90°. (b) Gated time domain signal.

To efficiently remove the clutters, we applied fast Fourier transform for the post processing, where a Gaussian window function (G($\omega$)) was adopted due to its high resolution in time domain. By multiplying G($\omega$) by S($\omega$), a new signal in frequency domain was generated, denoted as H($\omega$). To reveal the signal response in the time domain, an inverse fast Fourier transform (ifft(•)) was implemented over H($\omega$) to generate h(t). Further, h(t) was multiplied by a designated rectangular window function w(t). In time domain, the signals from clutters were late arrived. Applying the rectangular window function in time domain allows filtering out the scattering from the clutters. The gated time domain signal is shown in FIG. 17b. Finally, the fast Fourier transform (fft(•)) was implemented over this processed time domain signal (w(t)·h(t)), yielding G($\omega$)·S'($\omega$), where S'($\omega$) solely represents the interaction with the sample in the frequency domain. This entire process can be expressed $$H(\omega)=G(\omega)\cdot S(\omega) \quad (1.a)$$

$$h(t)=\text{ifft}(H(\omega)) \quad (1.b)$$

$$S'(\omega)=\text{fft}(w(t)\cdot h(t))/G(\omega) \quad (1.c)$$

Using Equation 1, we obtained the scattered field from the aforementioned three different samples. The processed scattered field for the sample covered by the meta-skin is shown in FIG. 17a with red solid line. Compared to S($\omega$), S'($\omega$) becomes smooth after the removal of the clutter from S($\omega$), while the scattering information still is contained.

REFERENCES

1. Cai, W., Chettiar, U. K., Kildishev, A. V. & Shalaev, V. M. Optical cloaking with metamaterials. *Nat. Photonics* 1, 224-227 (2007).
2. Chen, H.-T. et al. Experimental demonstration of frequency-agile terahertz metamaterials. *Nat. Photonics* 2, 295-298 (2008).
3. Chen, H.-T. et al. Active terahertz metamaterial devices. *Nature* 444, 597-600 (2006).
4. Hao, J. et al. High performance optical absorber based on a plasmonic metamaterial. *Appl. Phys. Lett.* 96, 251104 (2010).
5. Jain, A., Tassin, P., Koschny, T. & Soukoulis, C. M. Large Quality factor in sheet metamaterials made from dark dielectric metaatoms. *Phys. Rev. Lett.* 112, 117403 (2014).
6. Landy, N. I., Sajuyigbe, S., Mock, J. J., Smith, D. R. & Padilla, W. J. Perfect metamaterial absorber. *Phys. Rev. Lett.* 100, 207402 (2008).
7. Pendry, J. B., Schurig, D. & Smith, D. R. Controlling electromagnetic fields. *Science* 312, 1780-1782 (2006).
8. Pryce, I. M., Kelaita, Y. A., Aydin, K. & Atwater, H. A. Compliant metamaterials for resonantly enhanced infrared absorption spectroscopy and refractive index sensing. *ACS Nano* 5, 8167-8174 (2011).
9. Shin, D. et al. Broadband electromagnetic cloaking with smart metamaterials. *Nat. Commun.* 3, 1213 (2012).
10. Smith, D. R., Vier, D. C., Koschny, T. & Soukoulis, C. M. Electromagnetic parameter retrieval from inhomogeneous metamaterials. *Phys. Rev. E* 71, 036617 (2005).
11. Zhang, X. & Liu, Z. Superlenses to overcome the diffraction limit. *Nat. Mater.* 7, 435-441 (2008).
12. Zhou, Q. et al. Ultrafast optical modulation of terahertz metamaterials. *J. Opt.* 13, 125102 (2011).
13. Szabo, Z., Kiasat, Y. & Li, E. P. Subwavelength imaging with composite metamaterials. *J. Opt. Soc. Am. B* 31, 1298-1307 (2014).
14. Zhu, J. et al. A holey-structured metamaterial for acoustic deep-subwavelength imaging. *Nat. Phys.* 7, 52-55 (2011).
15. Gil, M., Bonache, J. & Martin, F. Metamaterial filters: A review. *Metamaterials* 2, 186-197 (2008).
16. Burgos, S. P., de Waele, R., Polman, A. & Atwater, H. A. A single-layer wide-angle negative-index metamaterial at visible frequencies. *Nat. Mater.* 9, 407-412 (2010).
17. Edwards, B., Alu, A., Silveirinha, M. G. & Engheta, N. Experimental verification of plasmonic cloaking at microwave frequencies with metamaterials. *Phys. Rev. Lett.* 103, 153901 (2009).
18. Landy, N. & Smith, D. R. A full-parameter unidirectional metamaterial cloak for microwaves. *Nat. Mater.* 12, 25-28 (2013).
19. Schurig, D. et al. Metamaterial electromagnetic cloak at microwave frequencies. *Science* 314, 977-980 (2006).
20. Alu, A. & Engheta, N. Achieving transparency with plasmonic and metamaterial coatings. *Phys. Rev. E* 72, 016623 (2005).
21. Chen, H. et al. Ray-optics cloaking devices for large objects in incoherent natural light. *Nat. Commun.* 4, 2652 (2013).

22. Lai, Y., Chen, H., Zhang, Z.-Q. & Chan, C. T. Complementary media invisibility cloak that cloaks objects at a distance outside the cloaking shell. *Phys. Rev. Lett.* 102, 093901 (2009).
23. Lai, Y. et al. Illusion optics: the optical transformation of an object into another object. *Phys. Rev. Lett.* 102, 253902 (2009).
24. Li, J. & Pendry, J. B. Hiding under the carpet: a new strategy for cloaking. *Phys. Rev. Lett.* 101, 203901 (2008).
25. Xu, S. et al. Broadband surface-wave transformation cloak, *Proc. Natl. Acad. Sci. USA* 112, 7635-7638 (2015).
26. Valentine, J., Li, J., Zentgraf, T., Bartal, G. & Zhang, X. An optical cloak made of dielectrics, *Nat. Mater.* 8, 568-571 (2009).
27. Shi, X., Gao, F., Lin, X. & Zhang, B. Electromagnetic detection of a perfect carpet cloak, *Sci. Rep.* 5, 10401 (2015).
28. Liu, R. et al. Broadband ground-plane cloak, *Science* 323, 366-369 (2009).
29. Falcone, F. et al. Babinet principle applied to the design of metasurfaces and metamaterials. *Phys. Rev. Lett.* 93, 197401 (2004).
30. Pendry, J. B., Holden, A. J., Robbins, D. J. & Stewart, W. J. Magnetism from conductors and enhanced nonlinear phenomena. *IEEE Trans. Microw. Theory Techn.* 47, 2075-2084 (1999).
31. Aydin, K. & Ozbay, E. Capacitor-loaded split ring resonators as tunable metamaterial components. *J. Appl. Phys.* 101, 024911 (2007).
32. Gil, I., Bonache, J., Garcia-Garcia, J. & Martin, F. Tunable metamaterial transmission lines based on varactor-loaded split-ring resonators. *IEEE Trans. Microw. Theory Techn.* 54, 2665-2674 (2006).
33. Wang, D. et al. Active left-handed material collaborated with microwave varactors. *Appl. Phys. Lett.* 91, 164601 (2007).
34. Kasirga, T. S., Ertas, Y. N. & Bayindir, M. Microfluidics for reconfigurable electromagnetic metamaterials. *Appl. Phys. Lett.* 95, 214102 (2009).
35. Poo, Y. et al. Experimental verification of a tunable left-handed material by bias magnetic fields. *Appl. Phys. Lett.* 96, 161902 (2010).
36. Zhang, F. et al. Magnetic control of negative permeability metamaterials based on liquid crystals. *Appl. Phys. Lett.* 92, 193104 (2008).
37. Lapine, M. et al. Structural tunability in metamaterials. *Appl. Phys. Lett.* 95, 084105 (2009).
38. Lapine, M., Shadrivov, I. V., Powell, D. A. & Kivshar, Y. S. Magnetoelastic metamaterials. *Nat. Mater.* 11, 30-33 (2012).
39. Liu, P. et al. Tunable meta-atom using liquid metal embedded in stretchable polymer. *J. Appl. Phys.* 118, 014504 (2015).
40. Kim, H.-J., Son, C. & Ziaie, B. A multiaxial stretchable interconnect using liquid-alloy-filled elastomeric microchannels. *Appl. Phys. Lett.* 92, 011904 (2008).
41. Chiechi, R. C., Weiss, E. A., Dickey, M. D. & Whitesides, G. M. Eutectic gallium-indium (EGaIn): a moldable liquid metal for electrical characterization of self-assembled monolayers. *Angew. Chem. Int. Ed.* 47, 142-144 (2008).
42. Jobs, M., Hjort, K., Rydberg, A. & Wu, Z. A Tunable spherical cap microfluidic electrically small antenna. *Small* 9, 3230-3234 (2013).
43. Kubo, M. et al. Stretchable microfluidic radiofrequency antennas. *Adv. Mater.* 22, 2749-2752 (2010).
44. Wang, M., Trlica, C., Khan, M. R., Dickey, M. D. & Adams, J. J. A reconfigurable liquid metal antenna driven by electrochemically controlled capillarity. *J. Appl. Phys.* 117, 194901 (2015).
45. So, J.-H. & Dickey, M. D. Inherently aligned microfluidic electrodes composed of liquid metal. *Lab Chip* 11, 905-911 (2011).
46. Park, Y.-L., Chen, B.-R. & Wood, R. J. Design and fabrication of soft artificial skin using embedded microchannels and liquid conductors. *IEEE Sensors J.* 12, 2711-2718 (2012).
47. Ufimtsev, P. Y. New insight into the classical Macdonald physical optics approximation. *IEEE Antennas Propag. Mag.* 50, 11-20 (2008).
48. Shadrivov, I. V., Powell, D. A., Morrison, S. K., Kivshar, Y. S. & Milford, G. N. Scattering of electromagnetic waves in metamaterial superlattices. *Appl. Phys. Lett.* 90, 201919 (2007).
49. Aydin, K. et al. Investigation of magnetic resonances for different split-ring resonator parameters and designs. *New J. Phys.* 7, 168 (2005).

C. Supplemental Information

Supplemental information regarding the meta-atom testing of Li 2015 and the meta-skin of Wang 2016 is set forth below. Illustrations are included at FIGS. 18-20 of the drawings.

The capacitance across the SRR gap region is given by $$C_{gap} = \varepsilon_o \varepsilon_r wh/g \quad (A.1)$$

where g is the gap distance, and w and h are the width and thickness, respectively, of the split. The main geometric parameters of the SRR are denoted in FIG. 1A. The self-inductance of a circular ring is given by $$L_0 = 4\pi a[\ln(8a/h) - 2] \quad (A.2)$$

where a and h are the inner radius and cross-section thickness, respectively, of the SRR.

After stretched, the circular SRR becomes an elliptical SRR. The self-inductance of the elliptical SRR is given by $$L_e = 8E(\Omega)r_a[\ln(16E(\Omega)r_a/\pi h) - 2 - 0.4375\Omega^2 - 0.14454\Omega^4 - \ldots] \quad (A.3)$$

where h is the thickness of the cross section of the split, and $E(\Omega)r_a$ is the product of complete elliptical integral of the second kind and the semi-major axis. $E(\Omega)r_a = \int_0^{\pi/2}\sqrt{1-(\Omega \sin\theta)^2}\, d\theta$, where the integral is from 0 to $\pi/2$, $\theta$ is the eccentric angle of point on ellipse and $\Omega = (r_a^2 - r_b^2)/(r_a^2 + r_b^2)$ where $r_a$ and $r_b$ are the semi-major and semi-minor axis of the elliptical SRR, respectively.

FIG. 18, FIG. 19 and FIG. 20 show the measured transmittance and reflectance spectrum of proposed stretchable meta-atom for all three configurations (FIGS. 4A-B, 5A-B and 6A-B) correspondingly.

FIG. 18 shows measured transmittance and reflectance spectrum for a SRR meta-atom of third configuration at different stretching ratios of 0, 17%, 28%, 53%, and 72%.

FIG. 19 shows measured transmittance and reflectance spectrum for a SRR meta-atom of second configuration at different stretching ratios of 0, 17%, 28%, 53%, and 72%

FIG. 20 shows measured transmittance and reflectance spectrum for a SRR meta-atom of third configuration at different stretching ratios of 0, 17%, 28%, 53%, and 72%

D. Options and Alternatives

It will be appreciated by those skilled in this technological art that the invention can take many forms and embodiments. The examples given above are but a few. Variations obvious to those skilled in the art will be included within the invention, which is not limited to the examples given.

The following non-limiting examples will give further indication of some of the options and alternatives envisioned for the invention.

1. Scale of Each Piece of Meta-Material

As mentioned, the overall meta-material can be scaled up or down. For example, the length and width of the material can be changed according to desire or need. Theoretically there are not limits on upper scale. There may be practical considerations regarding how large a sheet or layer can be manufactured. The lower limit likely has both theoretical and practical factors.

2. Form Factor of Each Piece of Meta-Material

Each piece can be made in symmetrical or asymmetrical perimeter shapes, both single sheets or layers and combined or laminations. Still further, it does not have to have the resonators uniformly distributed in each sheet or layer. As one example, see FIG. 21, two opposite side margins of a sheet or layer could be devoid of resonators. This would allow grabbing of those margins either manually or by mechanical means as anchor points to stretch the sheet or layer along one axis. One possibility is to add both left and right margins (in the context of FIG. 21). This would allow stretching in horizontal and/or vertical directions.

As will be appreciated by those skilled in the art, at least some elastomers will have different strain ratio at or near the margins being stretched than in the intermediate portion between those margins. Those elastomers tend to set up a substantially uniform strain ratio for at least a substantial majority of the sheet, but a different ratio at the margins being pulled in opposite directions. By leaving out resonators in those margins, substantially uniform resonator shapes will be maintained regardless of degree of stretching of the sheet to allow uniform tuning of the resonant frequency of each of the resonators and the combined sheet.

Plural sheets of meta-material can be combined to work together. For example, multiple meta-material sections (whether single layer or multiple layer) could be used to cover an entire object. There could be slight overlap between adjacent ends of each MM section. Each section could be tuned (stretched) in a similar fashion to the others.

3. Thickness of Layers

Also, as mentioned, the thickness of each layer can be used to tune the material. Both the material properties of the layer and the distance each array of resonators in each layer are away from one another can be varied by the designer. This can affect electromagnetic properties of a multilayer meta-skin, and thus allow some tuning by the designer based on those factors.

The thinner the layer thickness, the lower the dielectric and ohmic loss of the layer (e.g. meta-skin), and thus, the more efficient the frequency selection and cloaking effects at certain frequencies.

4. Number of Layers

As indicated, single layer meta-skin is possible, as is multi-layer. Advantages of single layer include lower profile and easier installation and better wearableness. Advantages of multi-layer are greater ability to suppress electromagnetic field scattered from an object and wider frequency tuning range. As a general rule, the more layers, the greater the suppression capability and the wider the frequency tuning range.

5. Fabrication and Assembly of Meta-Skins

The specific ways of fabricating and assembling the meta-skins can likewise vary. Various ways of creating each layer are possible. Examples are:

a) Micro-lithographic techniques.
b) Other molding techniques.
c) 3D printing.

Injection of liquid conductor material (e.g. liquid metal or liquid metal alloy) into an elastomer can vary. Examples are:

a) Manual injection (e.g. with syringe).
b) Automated or semi-automated (e.g. with 3D printer or microfluidic techniques).

It may be possible to 3D print both the elastomer and the liquid conductors. Examples of 3D printing of elastomers and liquid are eutectic gallium-indium. See discussion incorporated by reference herein and available online at https://3dprint.com/105465/xjet-inkjet-liquid-metal-3dp/.

6. Elastomer

Ecoflex has been mentioned, particularly because it is highly stretchable. PDMS or other polymers may be possible. Others might be:

a) Polyimide
b) Ethylene acrylic
c) Polyurethane

It is currently envisioned that the elastomer have the following characteristics:

a) Modulus—range from 10 kPa or $lbf/in^2$ to 1 GPa or $lbf/in^2$ (amount of force per unit area (stress) needed to achieve given amount of deformation)
b) Elastic limit—range from 1% to 1000% (strain beyond which the material no longer behaves elastically and deformation will take place)
c) Stiffness—from 10 kPa to 1 GPa.

Different elastomers can have different electromagnetic effects (e.g. absorption), which can also be considered in the design.

7. Liquid Conductors

Examples of liquid conductor materials have been mentioned above, particularly liquid metals and liquid metal alloys. Other possible examples include:

a) Artificial conductive ionic liquids
b) Natural ocean water

As a general rule, the higher the conductivity the better regarding tunability and functioning.

A discussion of liquid metals of the type that can be used in meta-atoms, including split ring resonators (SRRs) is attached at Kasirga et al., Microfluidics for reconfigurable electromagnetic metamaterials, Applied Physics Letters 95, 2142012 (2009), (3 pages) (incorporated by reference herein), as background information.

A possible way to build the liquid conductor is utilizing small drops or spheres of liquid metal. Surface tension of each sphere essentially retains its shape. But by adjoining spheres, conductivity of the combination is promoted and relatively simple to complex resonator shapes can be build. See, e.g., Ladd et al., 3D Printing of Free Standing Liquid Metal Microstructures, Adv. Mater., 25, 5081-5085 (2013), incorporated by reference herein.

8. Meta-Atom Shapes and Types

The exemplary embodiments focus on SRRs. As will be appreciated by those skilled in the art, theoretically there are few limitations regarding the type of resonator used. For example, shapes ranging from a simple linear wire segment to much more complex and combined shapes (e.g. combined wire and SRR) may be possible. One example of a complex and more 3D shape is a spiral shape.

As a general rule, the thinner the better, especially if the meta-skin is not intended to substantially increase the cross-sectional perimeter of the object to which it is applied.

A discussion of several types of meta-atoms, including split ring resonators (SRRs) is attached at Pryce et al., published patent application US 2012/054793 (incorporated by reference herein), as background information. Other possible resonator shapes are discussed at Smith et al., Composite Medium with Simultaneously Negative Permeability and Permittivity, Physical Review Letters, 2000, Vol. 84, Number 18, pp. 4184-4187; Shelby et al., Microwave Transmission Through a Two-Dimensional, Isotropic, Left-Handed Metamaterial, Applied Physics Letters 78, 489 (2001) (pgs. 489-491); Bilotti, et al., Design of Spiral and Multiple Split-Ring Resonators for the Realization of Miniaturized Metamaterial Samples, IEEE Transactions on Antennas, Vol. 55, Issue 8, pp. 2258-2267 (each of which is incorporated by reference herein in its entirety).

9. Frequency bands

Those skilled in the art appreciate that resonant frequency is dependent on the physical features of the resonator. In the example of an SRR, gap size between free ends of the arms, and inner and outer diameters of the arms, are two influencers. The exemplary embodiment examples are tailored to X-band energies. But a designer can change the dimensions to address other frequencies.

For example, downsizing these dimensions can make shorter wavelengths relevant. Conversely, scaling up makes longer wavelengths relevant. Some of the other frequency bands envisioned for the invention include:

a) Infrared waves
b) Terra hertz waves
c) Millimeter waves

However, this does not necessarily preclude implementations that address even visible light wavelengths, although other considerations could implicate the practicality of the same (e.g. losses).

As indicated herein, shape and size of the meta-atoms are factors in determining frequency range of a given configuration.

10. Stretching

The exemplary embodiments show and describe both mechanical stretching and stretching by wrapping. Both can be achieved in a variety of ways.

The example of tying threads or wires to opposite edges and hooking the other ends of the threads or wires to an actuator that can exert variable stretching along that axis is a crude way of stretching. As mentioned in Pryce et al US 2012/054793, incorporated by reference herein, actuators like microscope stages with XYZ range of motion to high degree of accuracy are possible, but they may not be practical for some applications.

An alternative is to manually stretch and then adhere or fix the stretched MM to a surface or object. An adhesive layer might be added to one side of the meta-skin or the surface or object. Examples are: silicone adhesive, etc.

A further alternative is wrapping. In the example of a cylinder of Wang 2016, the meta-skin can be laid out on a surface. The cylinder can be placed parallel to one edge of the meta-skin and then rolled to take up the meta-skin. In one example, the meta-skin can be pre-stretched to desired strain ratio and then pinned or fixed to the surface. Then, by wrapping, the strain ratio is retained.

In one example, a rail or ruler, or other reference measuring indicia, is along one edge of the surface. The meta-skin piece is anchored at one edge along a starting reference on the measuring rail or ruler. The distance along the rail or ruler to the opposite side of the meta-skin in a relaxed (non-stretched) state is measured. Then, any stretching can be measured on the rail or ruler. This can be correlated to a desired strain ratio for the meta-skin.

Alternatives include but are not limited to:

a) Use a motor to mechanically stretch the meta-skin
b) Use air pressure to pneumatically stretch the meta-skin See, e.g., Pryce et al US 2012/054793 and Cheah et al., published patent application US 2013/0160936, incorporated by reference herein, regarding ways to stretch an elastomer and different polymer materials that might be possible.

Again, as will be appreciated by those skilled in the art, the direction and amount of stretching will impact the meta-skin. This affects the shape of the voids in the elastomer, which change the shape of the liquid metal or conductor in each of the voids. By appropriate techniques, stretching can set up substantially uniform strain ratio across at least a substantial portion of the elastomer, which therefore tunes the meta-skin substantially uniformly. FIG. 21 illustrates an alternative (leaving meta-atoms off of opposite margins) to deter or eliminate different strain ratio at those margins when they are grabbed to produce stretching.

As further indicated, tuning by stretching can be made to the meta-skin prior to application to its end position (e.g. on a surface or object). Techniques can be used to calibrate the amount of stretching to a certain tuning, such as for repeatability. The meta-skin can be stretched to a desired strain ratio, fixed in that state, and then transferred to the surface of object in that state.

Alternatively, stretching might occur while the meta-skin is applied to an outer surface or object.

Alternatively, stretching might occur while the meta-skin is applied to an inner surface or object.

In one example, for metaskin, it covers at least part of an object and is mounted with fluid adhesive. One non-limiting example of such adhesive is found at http://www.airgas.com/p/3MA051115-25204. This type of adhesive has been found to be strong enough to adhere the meta-skin to almost any surface (metal, concrete, wood, etc.). In one aspect, instead of continuous meta-skin or large pieces thereof such is a wearable fabric for cloaking purposes, multiple pieces could be used to realize a fabric to avoid large stretching of any individual piece.

On the other hand, large stretching of a meta fabric during movement of the wearer may be used advantageously. For example, stretching at different levels will allow the fabric to dynamically tune its resonant frequencies, which may provide a larger bandwidth of the meta-skin.

Further, as indicated, stretching can be in a single direction or along a single axis and/or plural directions or axes.

Also, pre-stretching of the material and then adhering to a target surface is possible.

11. Enhanced Cloaking

As mentioned, one application of the meta-skin is cloaking. For more discussion of the physics of cloaking with meta-materials see Schurig, et al, Metamaterial Electromagnetic Cloak at Microwave Frequencies, Science, 314, 977-980 (2006) (incorporated by reference herein). A possible option is to add materials to the meta-skin. One example is to add nano-particles to either the liquid conductor or the elastomer, or both, which may increase or decrease scattering of incident EM energy. This could enhance or improve cloaking or other performance of the meta-skin depending on the characteristics of particles.

12. Applications

Several potential applications have been mentioned above (e.g. cloaking, shielding electronic devices such as personal electronic devices or body implants, or stealth applications.

What is claimed is:

1. A meta-material comprising:
   a. two or more stacked, spaced-apart or not spaced, stretchable sheets, each sheet comprising at least one elastomeric layer, wherein each said elastomeric layer comprises:
      i. a stretchable reversible elastomer; or
      ii. an elastomer with superelasticity; and
   b. a plurality of meta-atoms arranged in an array in each said stretchable sheet, each meta-atom comprising a liquid conductor sealingly encased in the stretchable sheet and having a length, width, and thickness;
   c. wherein the length, width, and thickness of the meta-atoms and the stretchability or superelasticity of the stretchable sheet are effective to provide for meta-material operation including in the X-band frequency range and;
   d. wherein the number, spacing, and stretching of any of the stretchable sheets of the two or more stacked spaced apart or in abutment sheets are selected to vary the frequency response of the meta-material based on electromagnetic interactions between the meta-atoms and between the stretchable sheets.

2. The meta-material of claim 1 wherein the liquid conductor comprises:
   a. a liquid metal;
   b. a liquid metal alloy;
   c. a conductive ionic liquid; or
   d. natural ocean water.

3. The meta-material of claim 1 wherein the liquid conductor comprises eutectic gallium-indium (EGaIn) comprising:
   a. 75.5% gallium and
   b. 24.5% indium.

4. The meta-material of claim 1 wherein the liquid conductor is in the form of a split ring resonator (SRR).

5. The meta-material of claim 4 wherein the SRR comprises:
   a. an inner radius of 1.5 mm;
   b. an outer radius of 2.0 mm;
   c. a thickness of 0.5 mm; and
   d. a gap distance of 1.0 mm.

6. The meta-material of claim 5 wherein each said stretchable sheet comprises one or more individual elastomer layers collectively having:
   a. a length of 11.0 mm;
   b. a width of 7.5 mm;
   c. a thickness of 1.45 mm; and
   d. the SRRs are within the thickness of the stretchable sheet.

7. The meta-material of claim 1 wherein each said stretchable sheet comprises a continuous elastomer and its array of said meta-atoms is in the continuous elastomer.

8. The meta-material of claim 7 comprising a wearable, tunable resonant frequency skin.

9. A meta-material comprising a stack of at least two stretchable sheets, each stretchable sheet having a periodic distribution of meta-atoms, made by the process comprising:
   a. creating a mold in a first substrate, the mold comprising an array of a plurality of positives of a resonator shape;
   b. depositing a first elastomer layer on the mold;
   c. curing the casted first elastomer layer to create a plurality of negatives of the resonator shape;
   d. depositing a second elastomer layer on a second substrate;
   e. partially curing the second elastomer layer;
   f. removing the first elastomer layer from the mold, inverting it, and adhering it to the second elastomer layer to create a stretchable sheet having a length, width, and thickness with a plurality of internal resonator-shaped voids from the plurality of negatives of the resonator shape, wherein the each of the first and second elastomer layers comprises a stretchable elastomer;
   g. injecting through at least one of the first and second elastomer layers of the stretchable sheet a liquid conductor into each of the plurality of the internal resonator-shaped voids; and
   h. sealing the injected liquid conductor in each of the plurality of the internal resonator-shaped voids of the stretchable sheet;
   i. wherein an original resonance frequency of the resonator shapes is set at the upper limit of the X-band frequency range;
   j. repeating steps a. to i. for one or more additional stretchable sheets; and
   k. stacking the sheet and the one or more additional stretchable sheets spaced apart or in abutment with one another to produce a multiple sheet meta-material.

10. The meta-material by the process of claim 9 wherein the resonator shapes are split ring resonator (SRR)C-shaped voids, and the injected liquid conductor provides a C-shape complementary to the C-shaped voids with an SRR split gap capacitance and inductance.

11. The meta-material by the process of claim 7 wherein in a state with no strain:
   a. each SRR liquid conductor comprises:
      i. an inner radius of 1.5 mm;
      ii. an outer radius of 2.0 mm;
      iii. a thickness of 0.5 mm; and
      iv. a gap distance of 1.0 mm; and
   b. the stretchable sheet surrounding the array of SRRs comprises:
      i. a length of 11.0 mm;
      ii. a width of 7.5 mm; and
      iii. a thickness of 1.45 mm; and
   c. the array of SSRs is within the thickness of the stretchable sheet.

12. The meta-material by the process of claim 9 further comprising:
   a. including attachment points on the stretchable sheet;
   b. connecting the attachment points to a means of mechanically stretching the stretchable sheet.

13. The meta-material by the process of claim 12 wherein the means of mechanically stretching is configured to stretch:
   a. the stretchable sheet in the plane of its thickness; and
   b. the C-shaped SRR along an axis through the middle of the gap distance;
   c. such that with increasing stretch ratio:
      i. the gap distance decreases and capacitance increases; and
      ii. elongation of the C-shape increases and inductance increases;
      iii. thus allowing resonant frequency tuning over a range of stretching.

14. The meta-material by the process of claim 13 wherein the stretch ratio varies from 0% to 200%.

15. The meta-material by the process of claim 13 wherein the means of mechanically stretching is operated to produce stretch ratios of:
   a. 0;
   b. 17%;

c. 28%;
d. 53%; and
e. 72%.

16. The meta-material by the process of claim 9 wherein changing the stretch ratio tunes the meta-atom to different resonant frequencies.

17. An electromagnetic (EM) meta-material comprising:
   a. a plurality of liquid conductor meta-atoms each sealingly encased in each of a stacked set of stretchable reversible elastomer sheets; and
   b. the meta-atoms of each sheet having a resonant frequency influenced by:
      i. control of stretch ratio of each said sheet in the stack and relative to stretch ratio of other said sheets in the stack; and
      ii. thickness or spacing of each said sheet in the stack around its periodic distribution of the meta-atoms and relative to thickness or spacing of other said sheets in the stack;
   c. wherein the thickness or spacing and the stretchability of each said sheet in the stack and interactions between said sheets in the stack are effective to provide for meta-material operation including in the X-band frequency range.

18. The EM meta-material of claim 17 wherein the meta atoms comprise SRRs.

19. The EM meta-material of claim 18 wherein the SRRs are arranged in the same orientation throughout a said elastomer sheet.

20. The EM meta-material of claim 17 wherein the stack of stretchable sheets comprising a continuous overall length, width, and thickness wherein:
   a. each of the stack of stretchable sheets comprises a single periodic distribution of the liquid conductor meta-atoms across at least a portion of its length and width; and
   b. the stack of stretchable sheets comprises multiple periodic distributions of the liquid conductor meta-atoms across at least a portion of the overall length and width of the EM meta-material, each of the multiple periodic distributions spaced from one another in the direction of thickness of the EM meta-material.

21. The EM meta-material of claim 20 wherein the set of stretchable sheets comprises two to six sheets so that the multiple periodic distributions comprise two to six stacked, spaced apart distributions.

22. The EM meta-material of claim 17 wherein the EM meta-material comprises a wearable, elastic skin.

23. The EM meta-material of claim 17 wherein the elastic skin can be wrapped around three dimensional shapes.

24. The EM meta-material of claim 23 wherein the meta atoms comprise SRRs and the wrapping further comprising stretching the skin to tune the resonant frequency of the SRRs.

25. The EM meta-material of claim 24 wherein the meta atoms comprise SRRs and the thickness of the stretchable sheet around each periodic distribution of liquid conductor meta-atoms defines the distance between SRRs in adjacent said periodic distributions of liquid conductor meta-atoms to tune the EM meta-material.

26. A method of making an electromagnetic (EM) meta-material comprising:
   a. creating a master mold of an array of positives of meta-atom shapes;
   b. casting an elastomer on the master mold to create a first elastomer layer with an array of exposed negatives of the meta-atom shapes;
   c. covering the exposed negatives of the meta-atom shapes of the first elastomer layer with a second elastomer layer to encase the negatives of the meta-atom shapes and create an elastomer assembly;
   d. injecting liquid metal into the negatives of the encased meta-atom shapes;
   e. sealing the liquid metal in the negatives of the encased meta-atom shapes;
   f. repeating steps (b) to (e) to create one or more additional elastomer assemblies;
   g. laminating the first and the one or more additional elastomer assemblies together to form a multi-layer meta-material.

27. The method of making an EM meta-material of claim 26 wherein:
   a. the meta-atom shapes are SRR shapes;
   b. the liquid metal comprises EGaIn;
   c. the elastomer comprises a silicone elastomer.

28. The method of making an EM meta-material of claim 26 wherein each elastomer assembly has a thickness, and the thickness of each of the elastomer assemblies is pre-determined to tune resonant frequency of the meta-atoms.

29. The method of making an EM meta-material of claim 26 further comprising controlling the stretch ratio of the meta-material to tune resonant frequency of the meta-atoms.

30. The method of making an EM meta-material of claim 26 further comprising:
   a. applying the meta-material to an object by wrapping at least a portion of the object.

31. The method of making an EM meta-material of claim 26 wherein each elastomer assembly comprises a sheet.

32. The method of claim 26 wherein the mold comprises:
   i. providing a first silicon wafer;
   ii. applying a photoresist pattern on the first wafer surface; the photoresist pattern comprising the positives of the meta-atom shapes.

33. The method of claim 26 wherein the mold comprises:
   a. a plate with the positive of the meta-atom shapes machined in the plate.

34. The metamaterial of claim 1 adapted for one of:
   a. cloaking objects or persons;
   b. stealth applications; or
   c. shielding electronic devices from electromagnetic effects.

* * * * *